(12) United States Patent
Choi

(10) Patent No.: US 11,508,590 B2
(45) Date of Patent: Nov. 22, 2022

(54) SUBSTRATE INSPECTION SYSTEM AND METHOD OF USE THEREOF

(71) Applicant: JNK TECH, San Jose, CA (US)

(72) Inventor: Youngjin Choi, San Jose, CA (US)

(73) Assignee: JNK Tech, San Jose, CA (US)

( * ) Notice: Subject to any disclaimer, the term of this patent is extended or adjusted under 35 U.S.C. 154(b) by 0 days.

(21) Appl. No.: 17/647,332

(22) Filed: Jan. 6, 2022

(65) Prior Publication Data

US 2022/0336239 A1    Oct. 20, 2022

Related U.S. Application Data

(63) Continuation-in-part of application No. 17/305,838, filed on Jul. 15, 2021, now Pat. No. 11,286,567, which is a continuation of application No. 17/345,795, filed on Jun. 11, 2021.

(60) Provisional application No. 63/175,282, filed on Apr. 15, 2021.

(51) Int. Cl.
| | | |
|---|---|---|
| *G06K 9/00* | (2022.01) | |
| *H01L 21/67* | (2006.01) | |
| *H01L 21/677* | (2006.01) | |
| *H01L 21/68* | (2006.01) | |

(52) U.S. Cl.
CPC .. *H01L 21/67201* (2013.01); *H01L 21/67742* (2013.01); *H01L 21/681* (2013.01)

(58) Field of Classification Search
CPC ........... C23C 16/52; G06T 7/13; G06T 7/174; G06T 1/0014; G06T 7/0004; G06T 2207/30148; G01N 21/8851; G01N 21/958
See application file for complete search history.

(56) References Cited

U.S. PATENT DOCUMENTS

| | | | | |
|---|---|---|---|---|
| 6,215,897 B1* | 4/2001 | Beer | ..................... | H01L 21/681 |
| | | | | 348/87 |
| 6,324,298 B1* | 11/2001 | O'Dell | ............. | H01L 21/67288 |
| | | | | 257/E21.53 |
| 7,634,365 B2* | 12/2009 | Steele | .................. | G01N 27/002 |
| | | | | 702/35 |
| 9,269,923 B2 | 2/2016 | Choi et al. | | |
| 9,449,809 B2 | 9/2016 | Choi et al. | | |

(Continued)

FOREIGN PATENT DOCUMENTS

KR    10-2017-0015209 A    2/2017

OTHER PUBLICATIONS

Office Action in U.S. Appl. No. 17/305,838 (parent of this application) dated Nov. 10, 2021.

(Continued)

*Primary Examiner* — Avinash Yentrapati

(74) *Attorney, Agent, or Firm* — Knobbe Martens Olson & Bear LLP

(57) ABSTRACT

A method of inspection and an inspection system for the film deposition process for substrates that includes glass and wafer are disclosed. The inspection system includes multiple camera modules positioned in a load lock unit of a process chamber, such as the camera modules that can capture images of the substrate in the load lock. The images are analyzed by a controller of the inspection system to determine the accuracy of robots in handling the substrate, calibration of the robots based on the analysis, and defects in the substrate caused during the handling and deposition process.

21 Claims, 55 Drawing Sheets

(56) References Cited

U.S. PATENT DOCUMENTS

| | | |
|---|---|---|
| 10,043,641 B2 | 8/2018 | Choi et al. |
| 11,286,567 B1 | 3/2022 | Choi |
| 2002/0127852 A1* | 9/2002 | Kawakami ............ C23C 16/54 438/689 |
| 2003/0167612 A1 | 9/2003 | Kraus et al. |
| 2005/0031187 A1* | 2/2005 | Lin .................. H01L 21/67253 382/145 |
| 2005/0045821 A1* | 3/2005 | Noji .................... G01N 23/225 250/311 |
| 2008/0292811 A1 | 11/2008 | Choi et al. |
| 2010/0151688 A1 | 6/2010 | Choi et al. |
| 2011/0142572 A1* | 6/2011 | Blonigan .......... H01J 37/32733 414/217 |
| 2011/0188733 A1* | 8/2011 | Bardos ............... G01N 21/9501 382/149 |
| 2012/0013899 A1* | 1/2012 | Amanullah ........ G01N 21/9501 356/237.5 |
| 2014/0264296 A1* | 9/2014 | Choi ...................... H01L 33/52 438/46 |
| 2015/0254827 A1* | 9/2015 | Kobayashi ............. G06T 7/001 348/130 |
| 2017/0032510 A1* | 2/2017 | Francken ................ G06T 7/73 |
| 2018/0366357 A1* | 12/2018 | Liao .................. H01L 21/68707 |
| 2019/0057890 A1* | 2/2019 | Sato .................. H01L 21/67259 |
| 2019/0096730 A1* | 3/2019 | Morita ................. G06T 7/0004 |
| 2021/0005487 A1* | 1/2021 | Tsai ...................... H04N 5/247 |
| 2021/0097675 A1* | 4/2021 | Koga .................... G06T 7/0004 |
| 2021/0305074 A1* | 9/2021 | Wang ....................... G06T 1/20 |
| 2022/0051380 A1* | 2/2022 | Jin .......................... G06T 7/001 |

OTHER PUBLICATIONS

International Search Report in Application No. PCT/US2022/016551 dated May 31, 2022 in 5 pages.

Notice of Allowance in U.S. Appl. No. 17/305,838 dated Jan. 24, 2022.

Written Opinion in Application No. PCT/US2022/016551 dated May 31, 2022 in 7 pages.

\* cited by examiner

| UL | Active | Alarm | Warm | Value | set min | set max | Result | Unit |
|---|---|---|---|---|---|---|---|---|
| X-axis | ☐ | ▪ | ☐ | 4.1 | 3.0 | 5.0 | OK | m/m |
| Y-axis | ☐ | ▪ | ☐ | 3.8 | 3.0 | 5.0 | OK | m/m |
| C & D | ☐ | ▪ | ☐ | 130 | 1 | 300 | OK | μm |
| Corner | ☐ | ▪ | ☐ | 75 | 65 | 90 | OK | n/a |
| Edge-1 | ☐ | ▪ | ☐ | 0.6 | 0.1 | 0.4 | NG | m/m |
| Edge-2 | ☐ | ▪ | ☐ | 0.5 | 0.1 | 0.4 | NG | m/m |

System ID: AAABBBCCC
Glass ID: ######AAABBBCCC

C & D: Crack and Defect on glass
ATM Glass Loader

Fig. 7

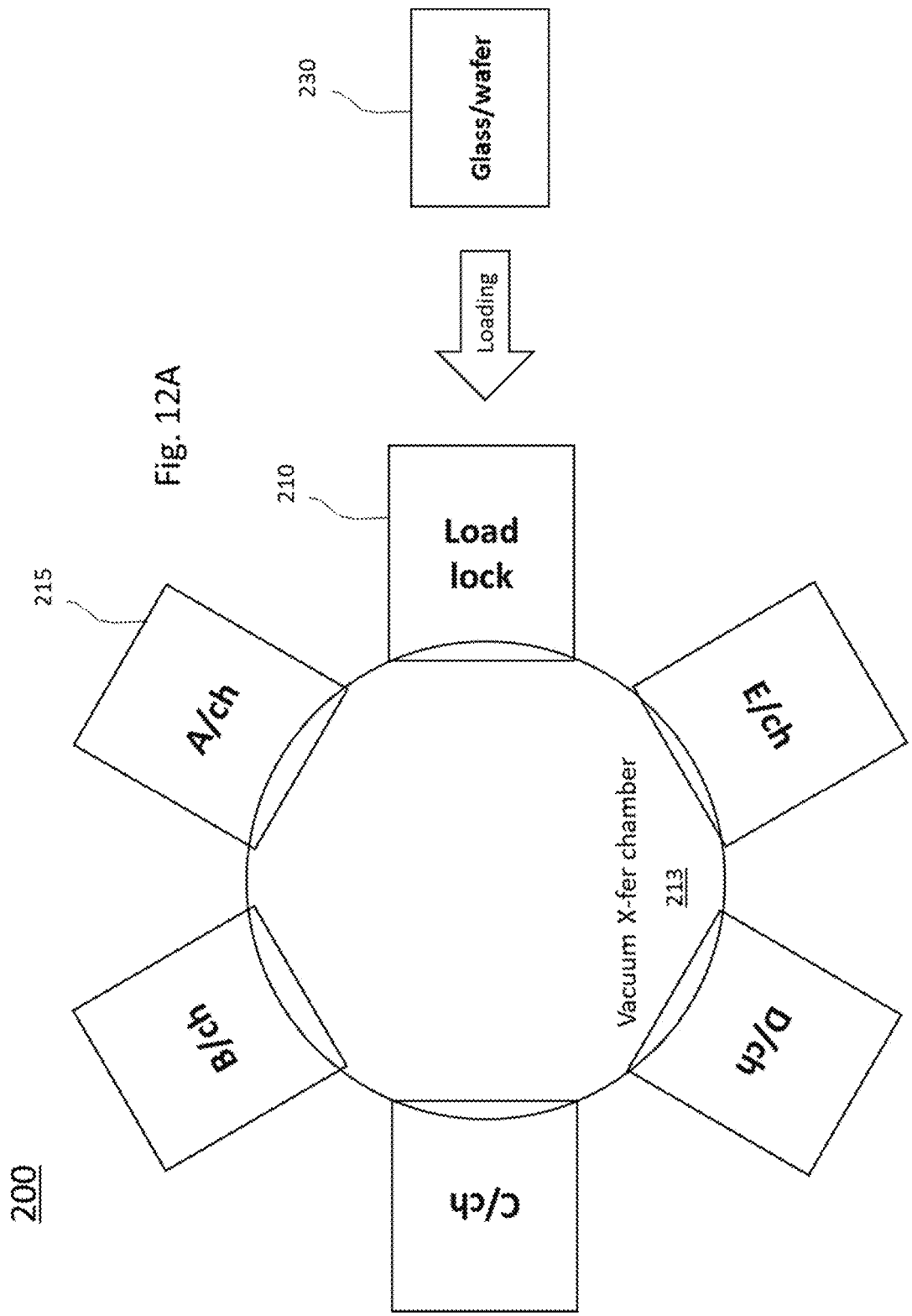

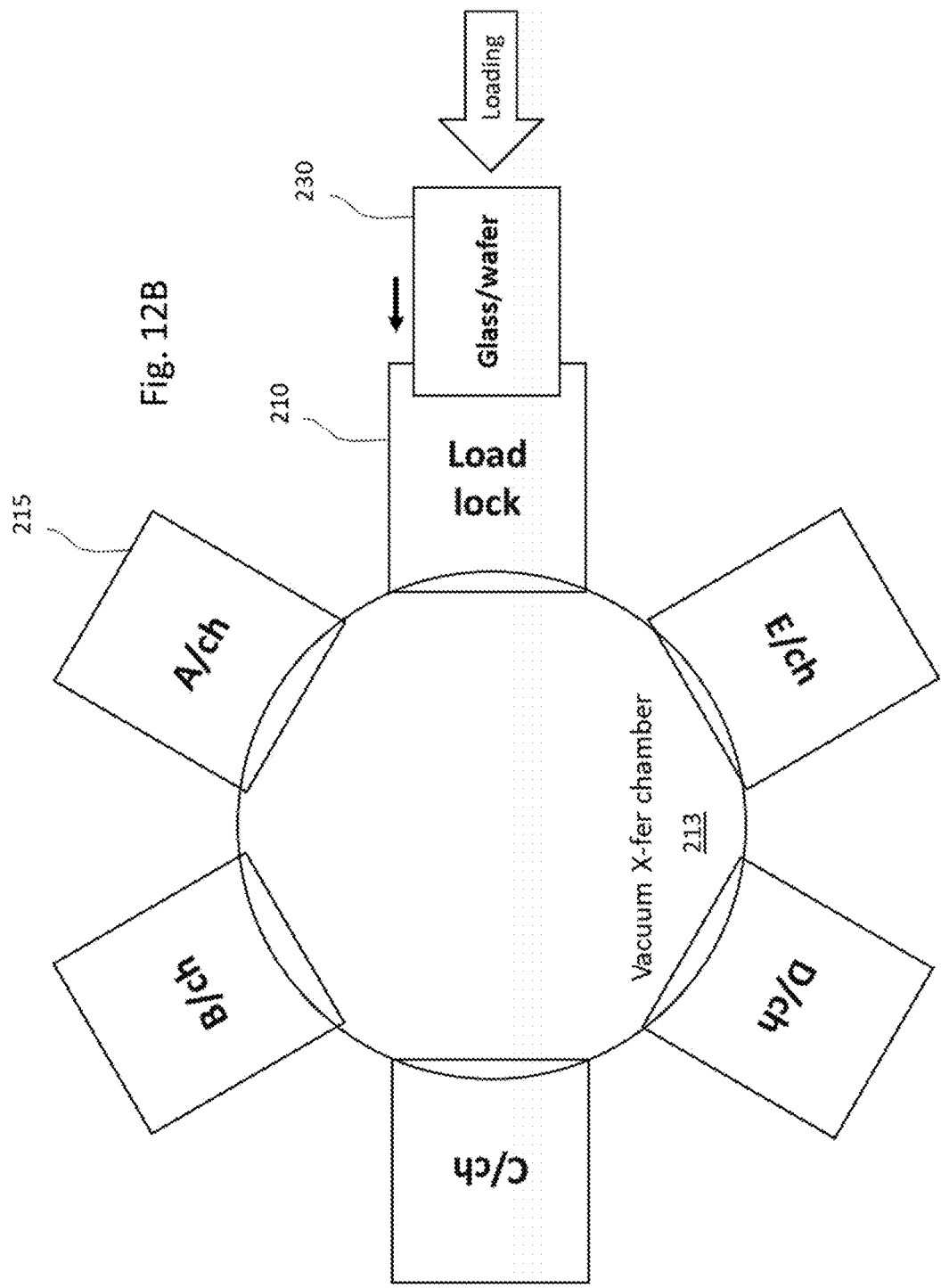

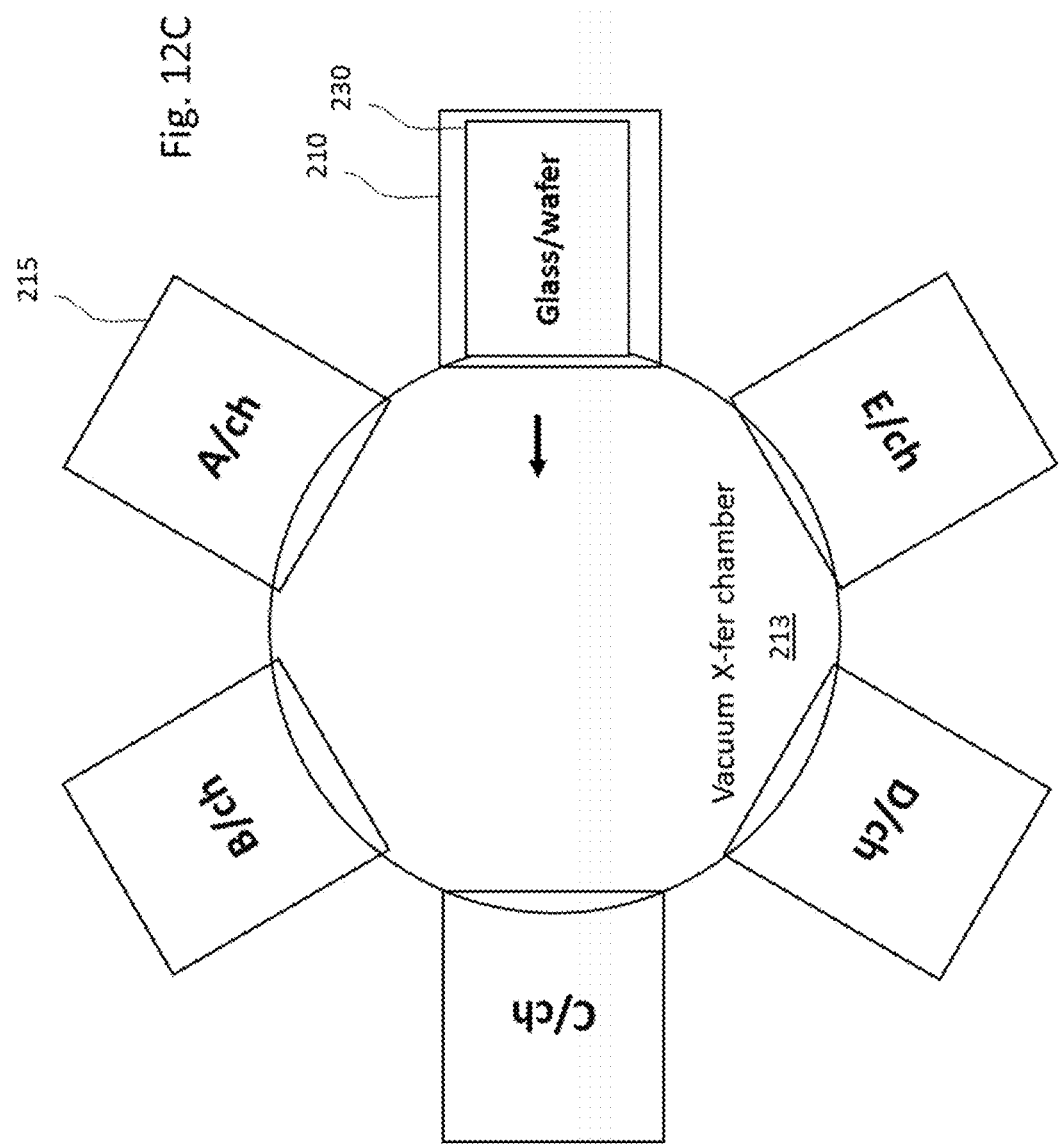

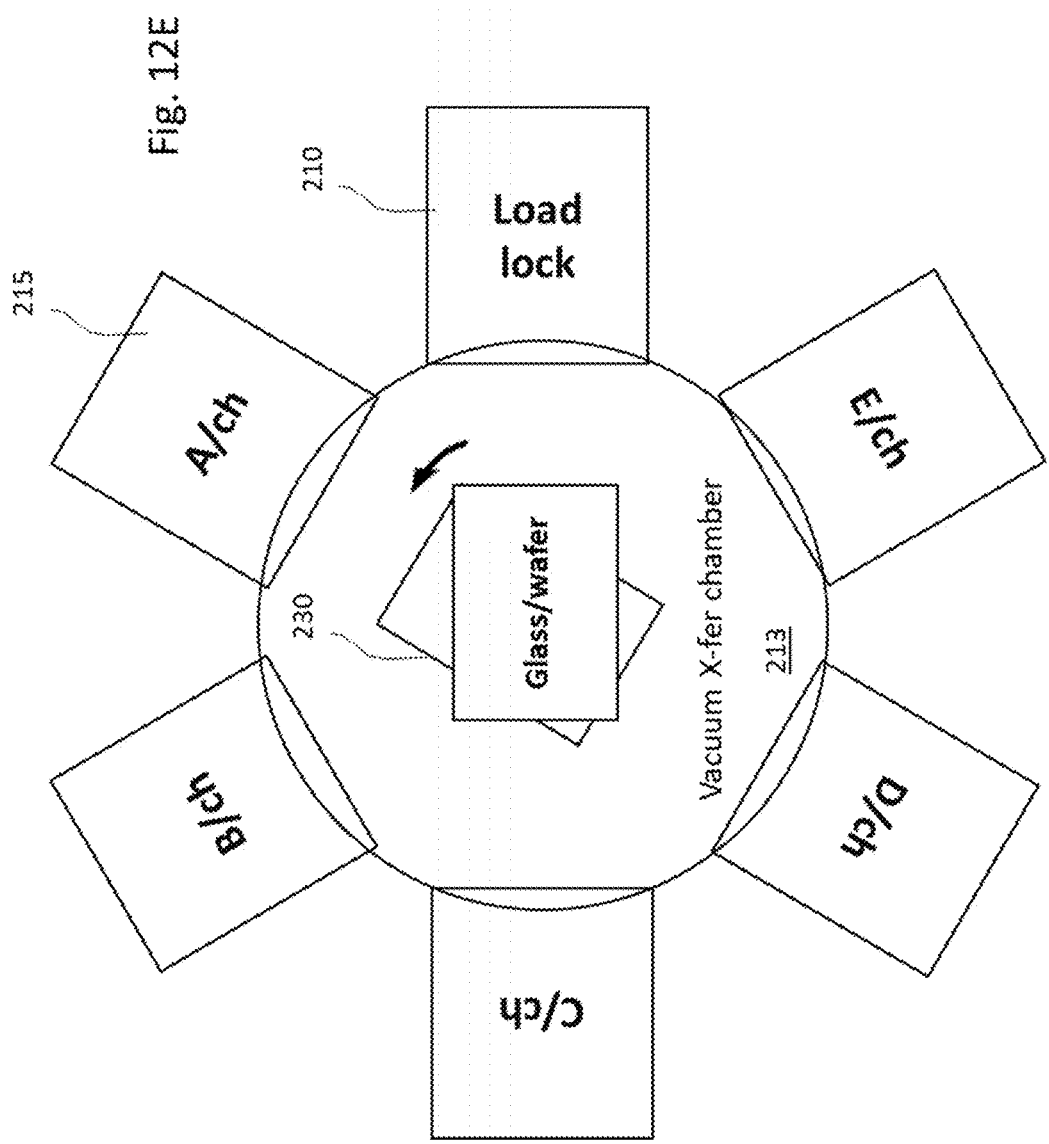

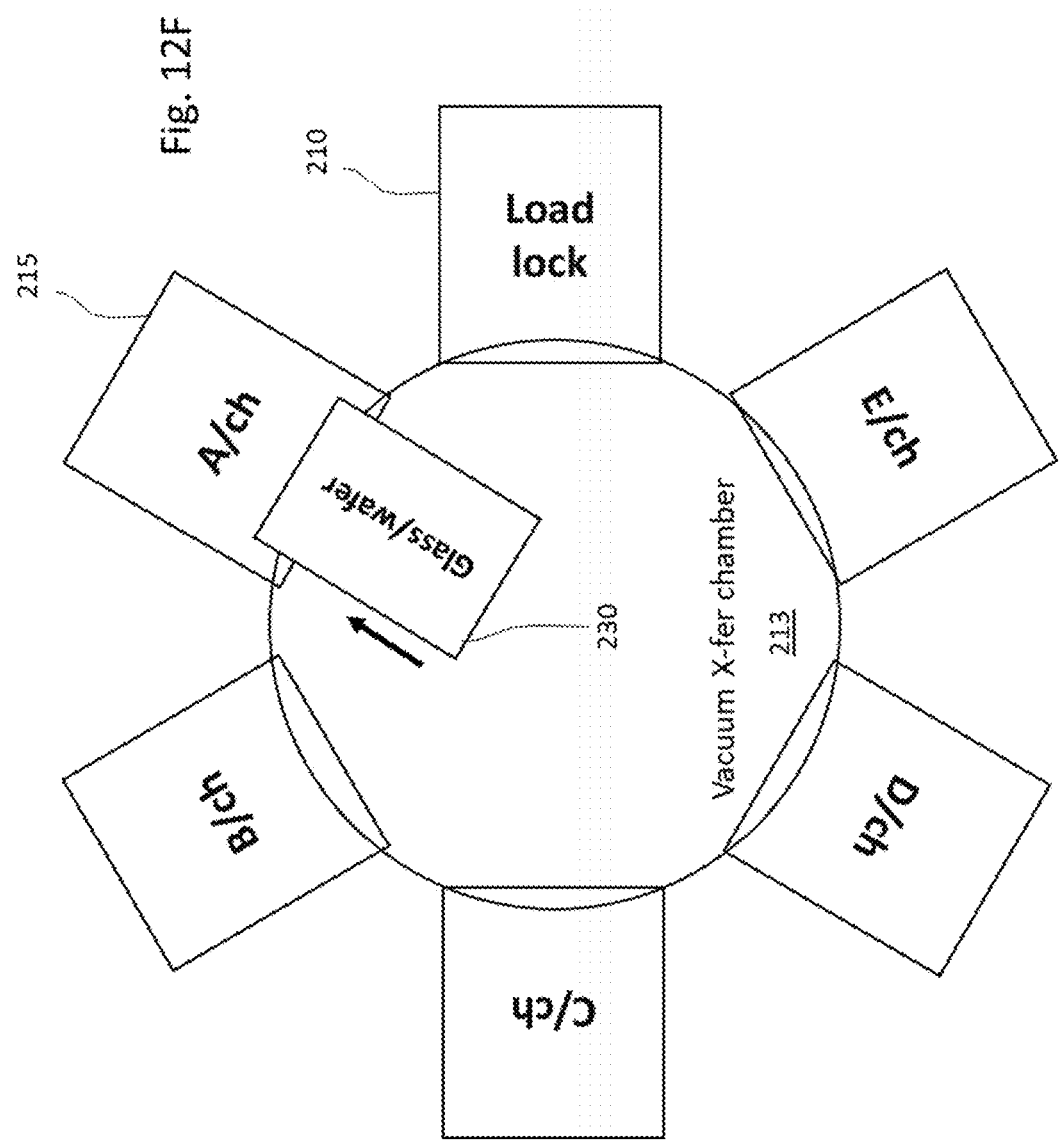

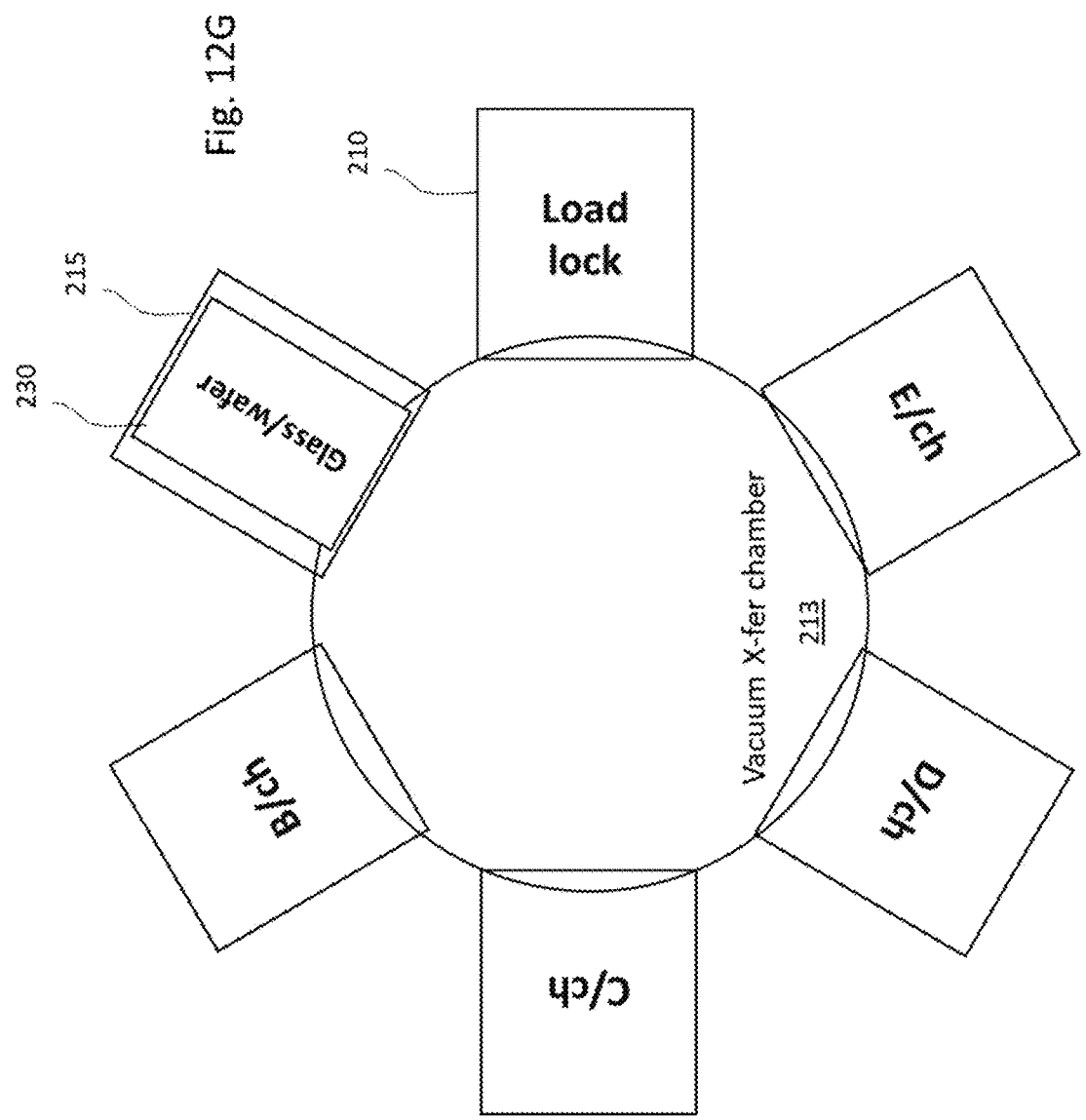

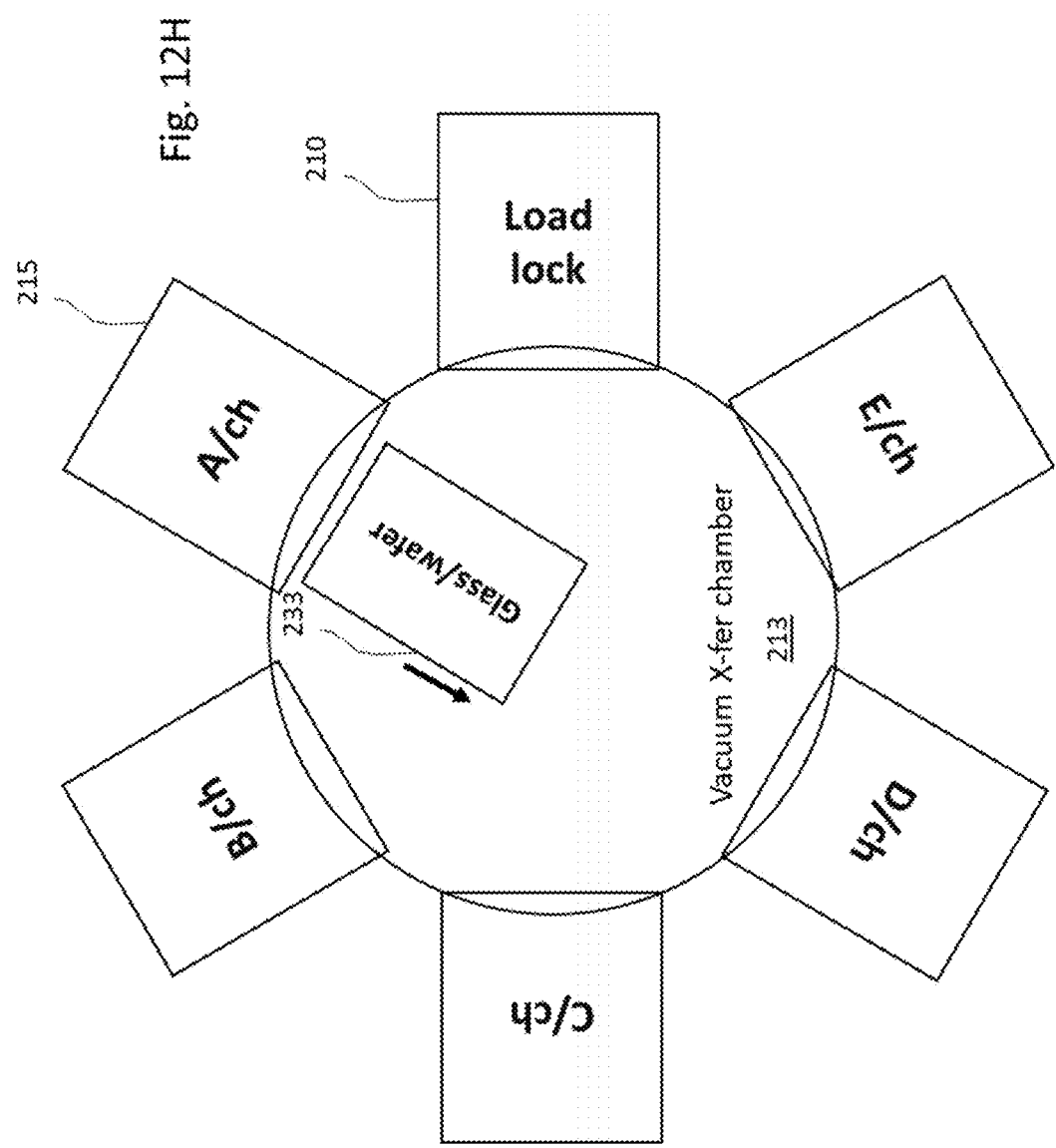

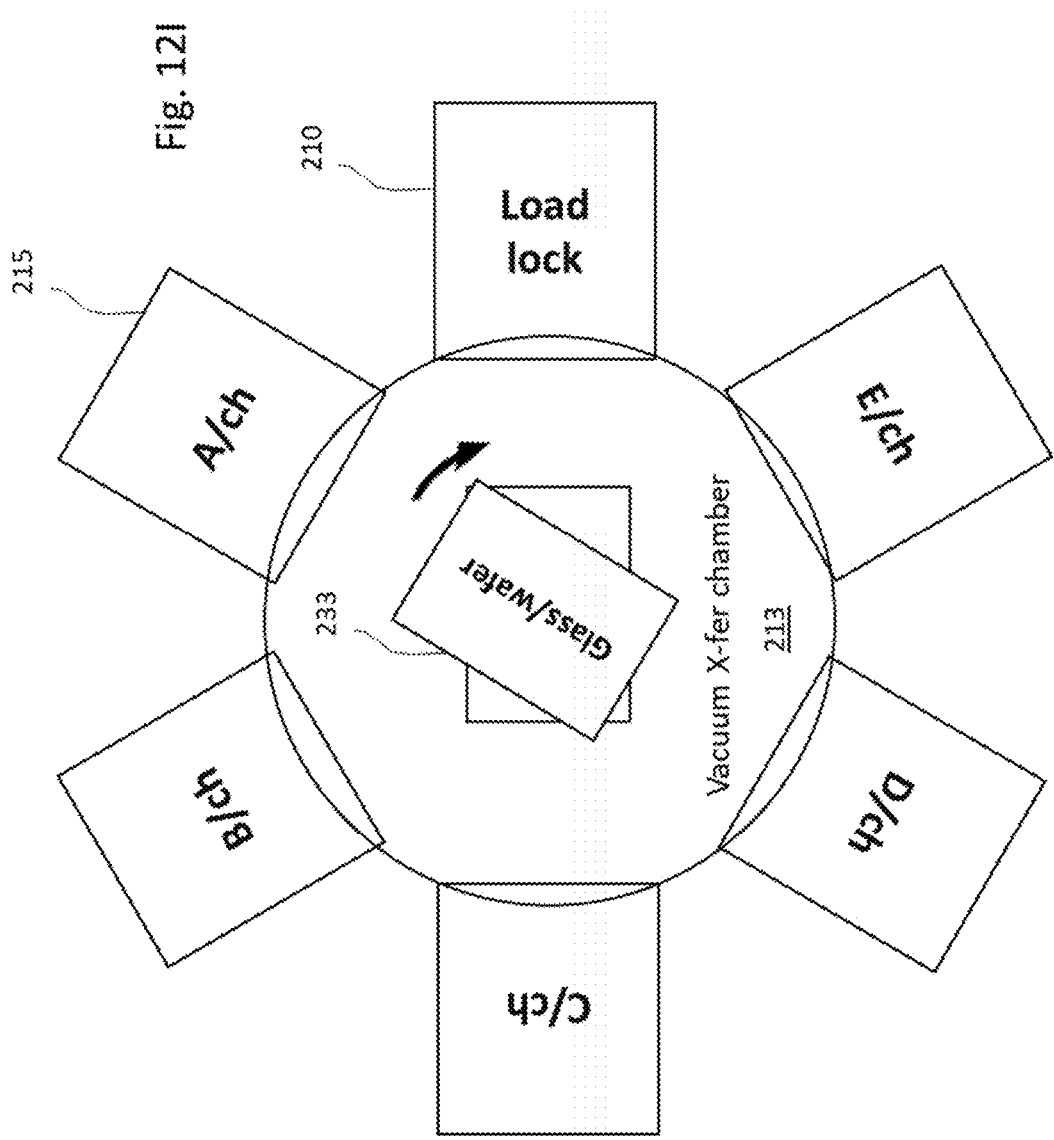

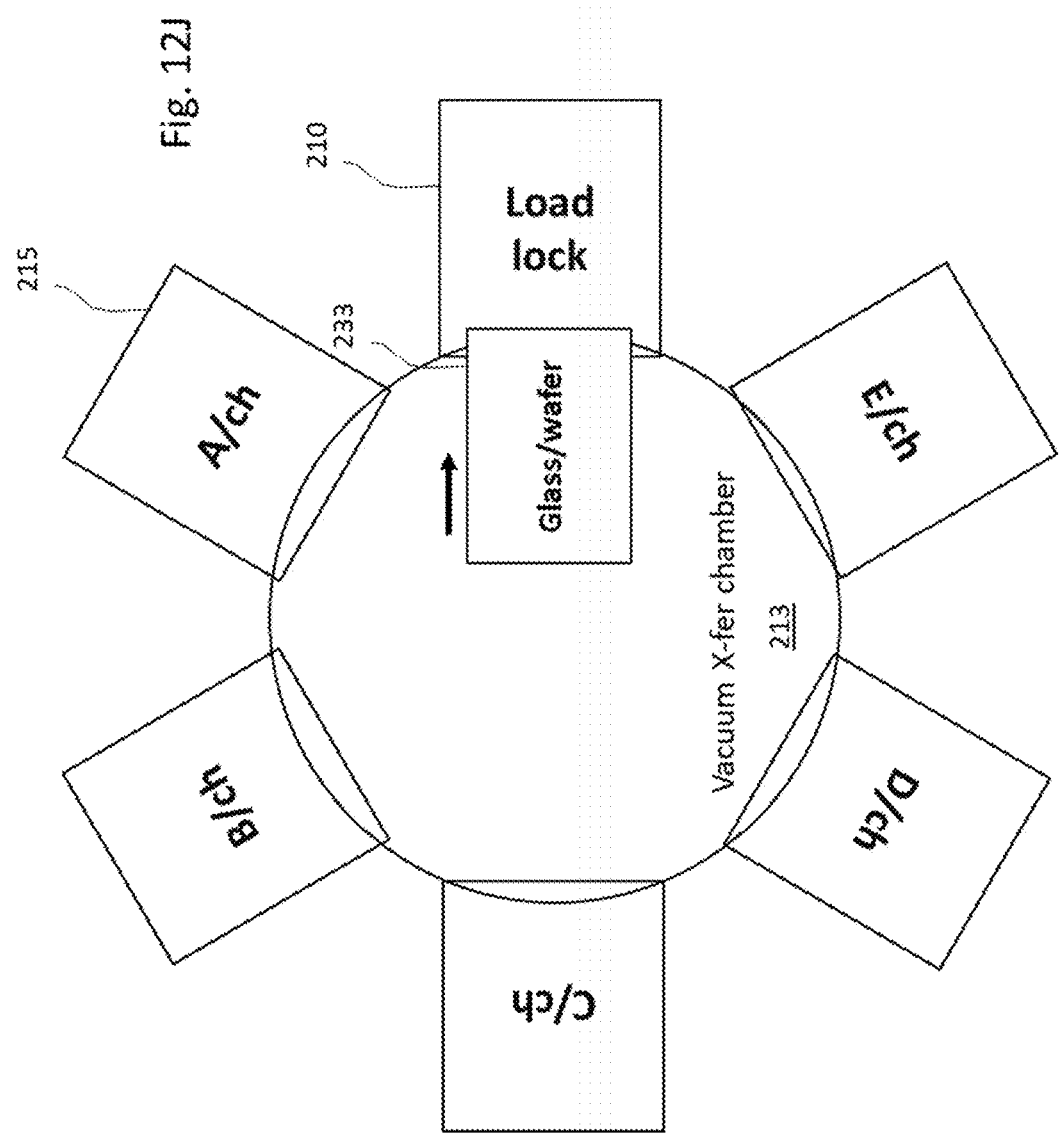

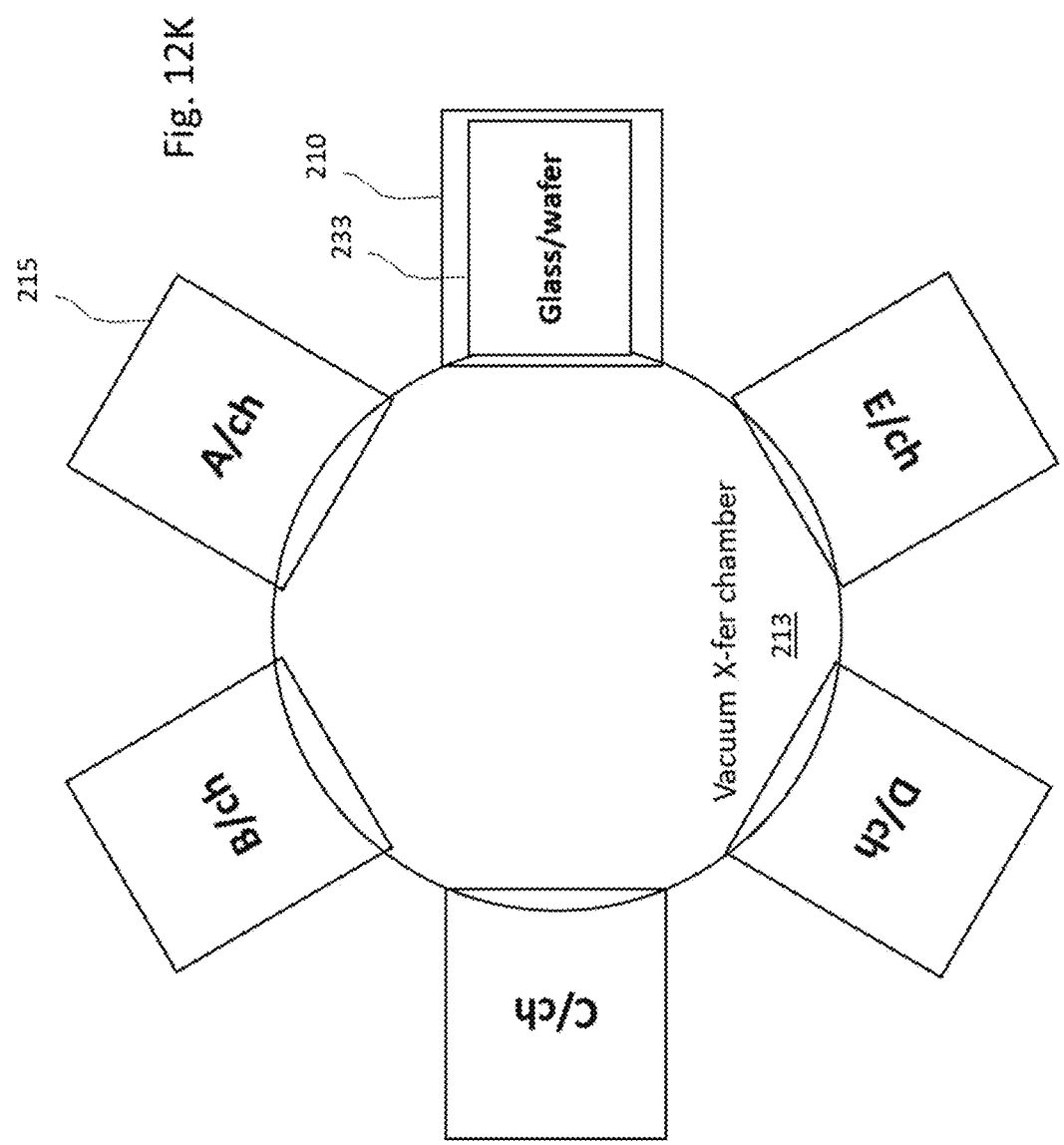

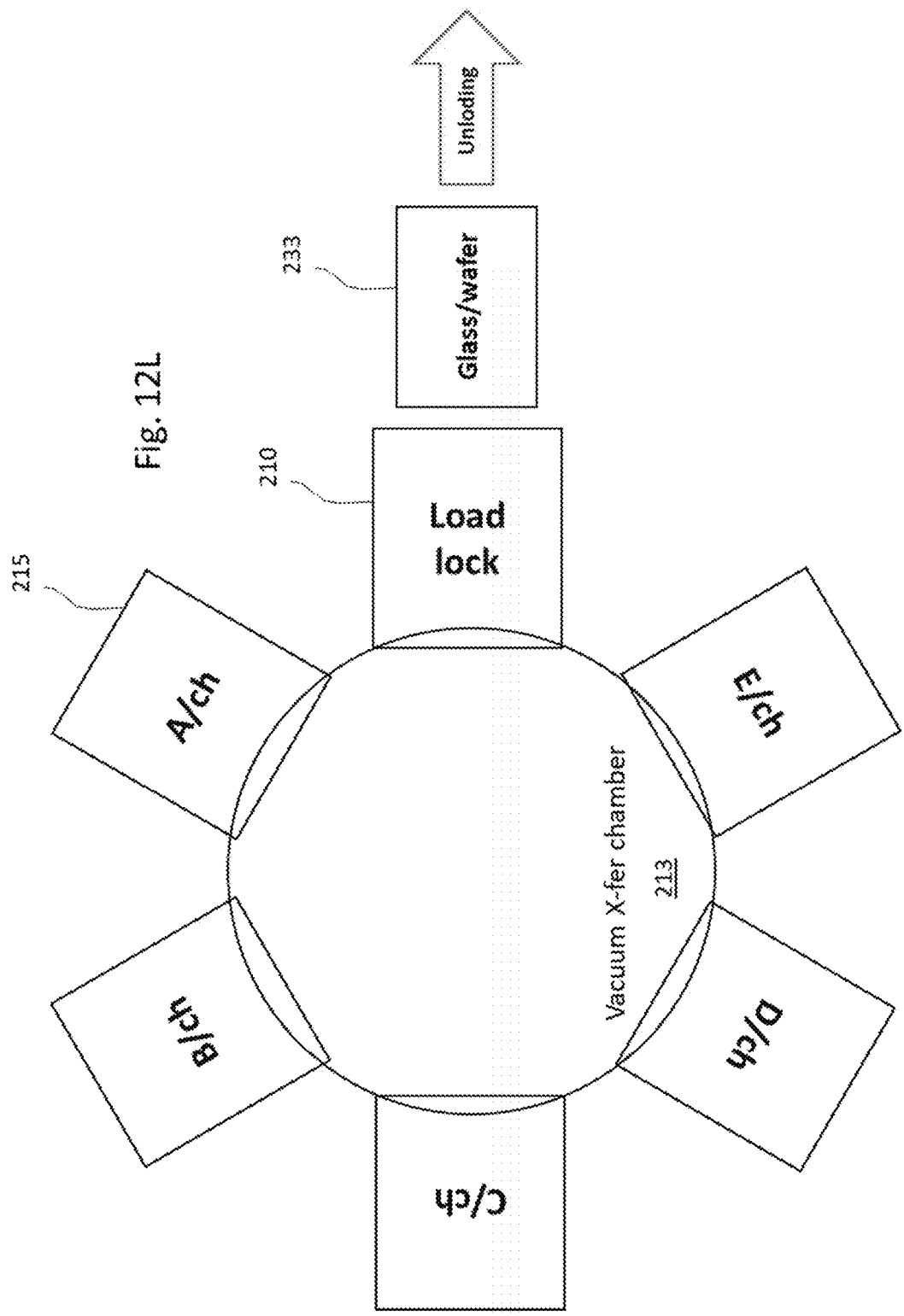

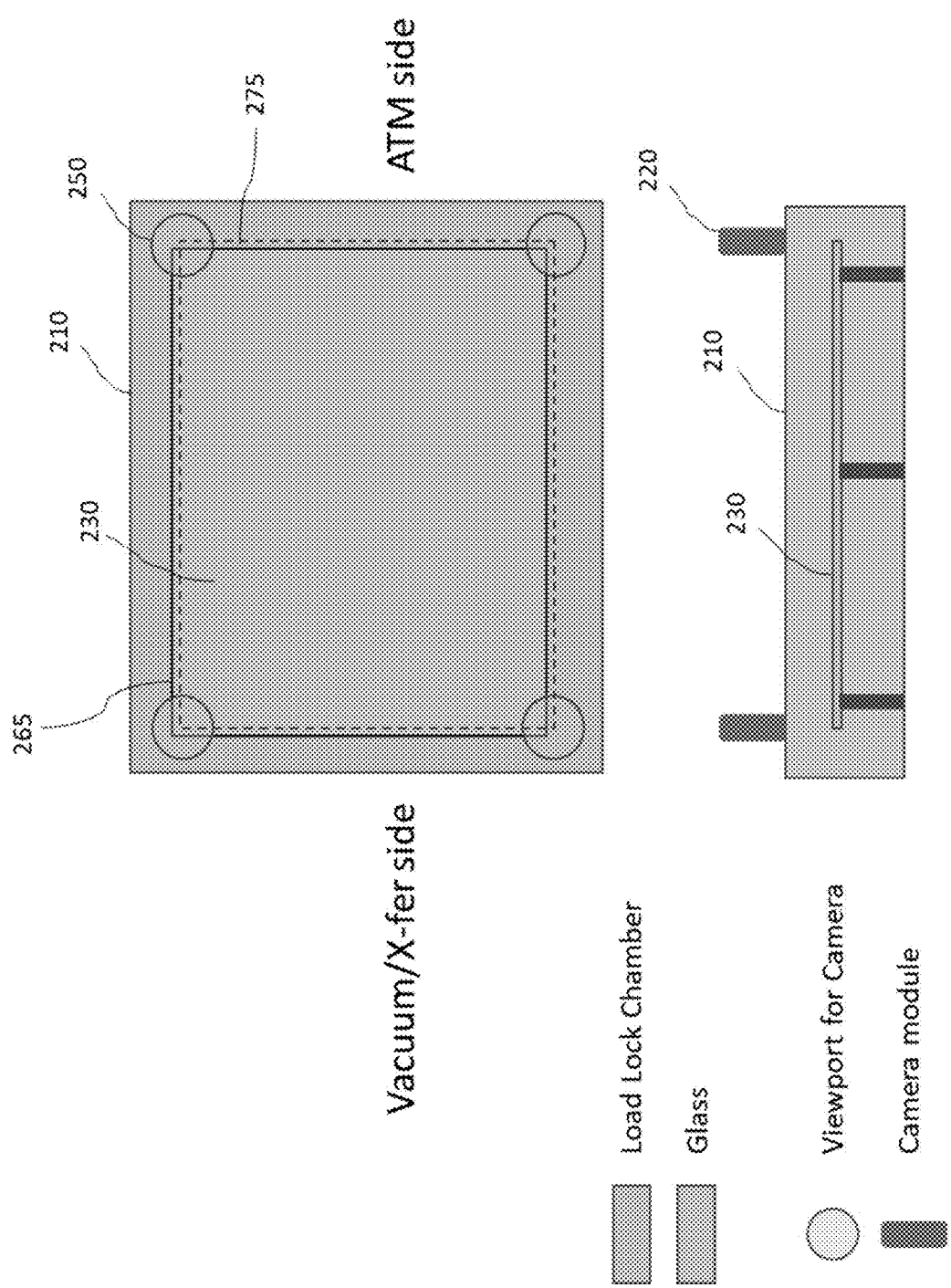

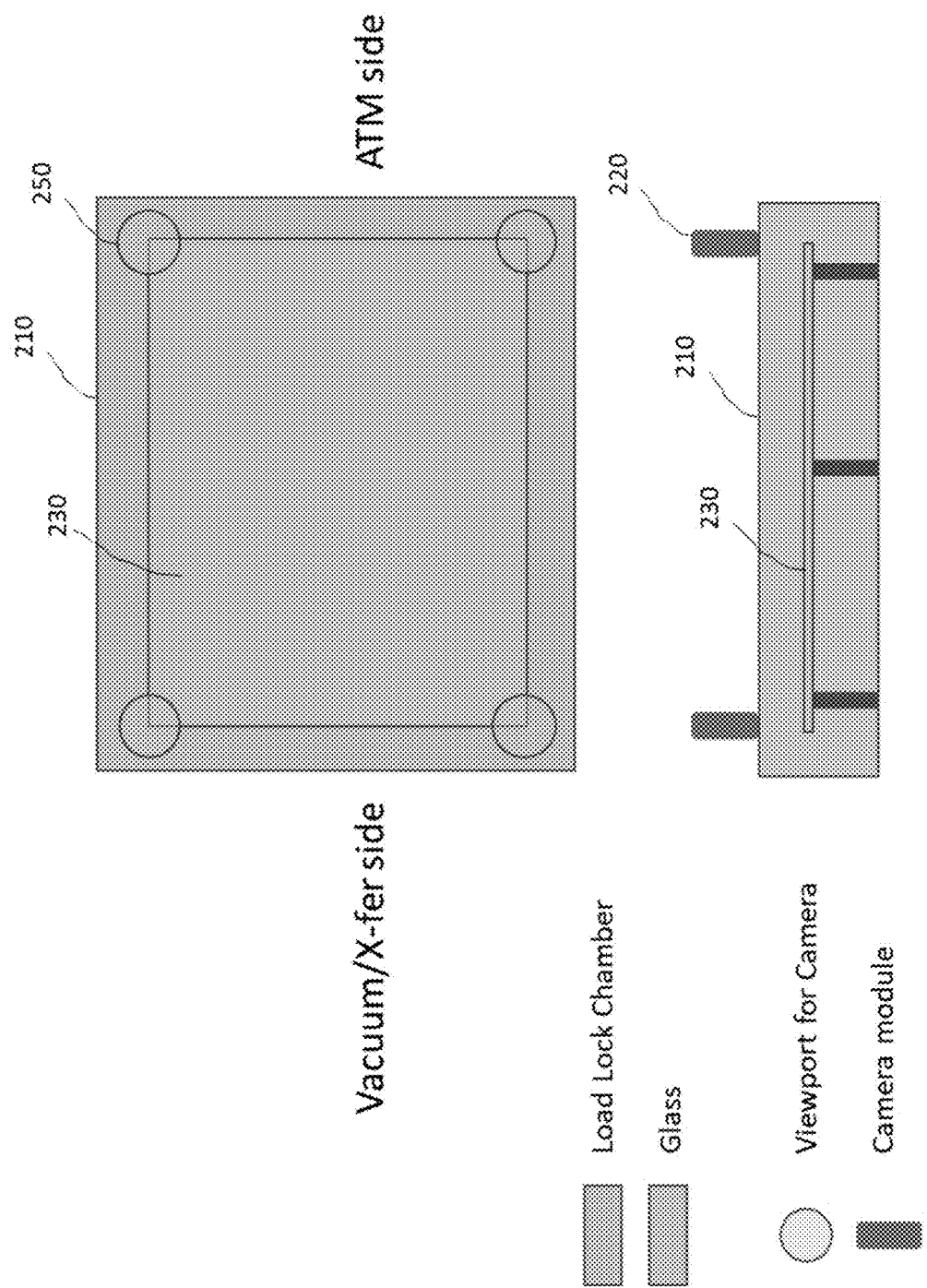

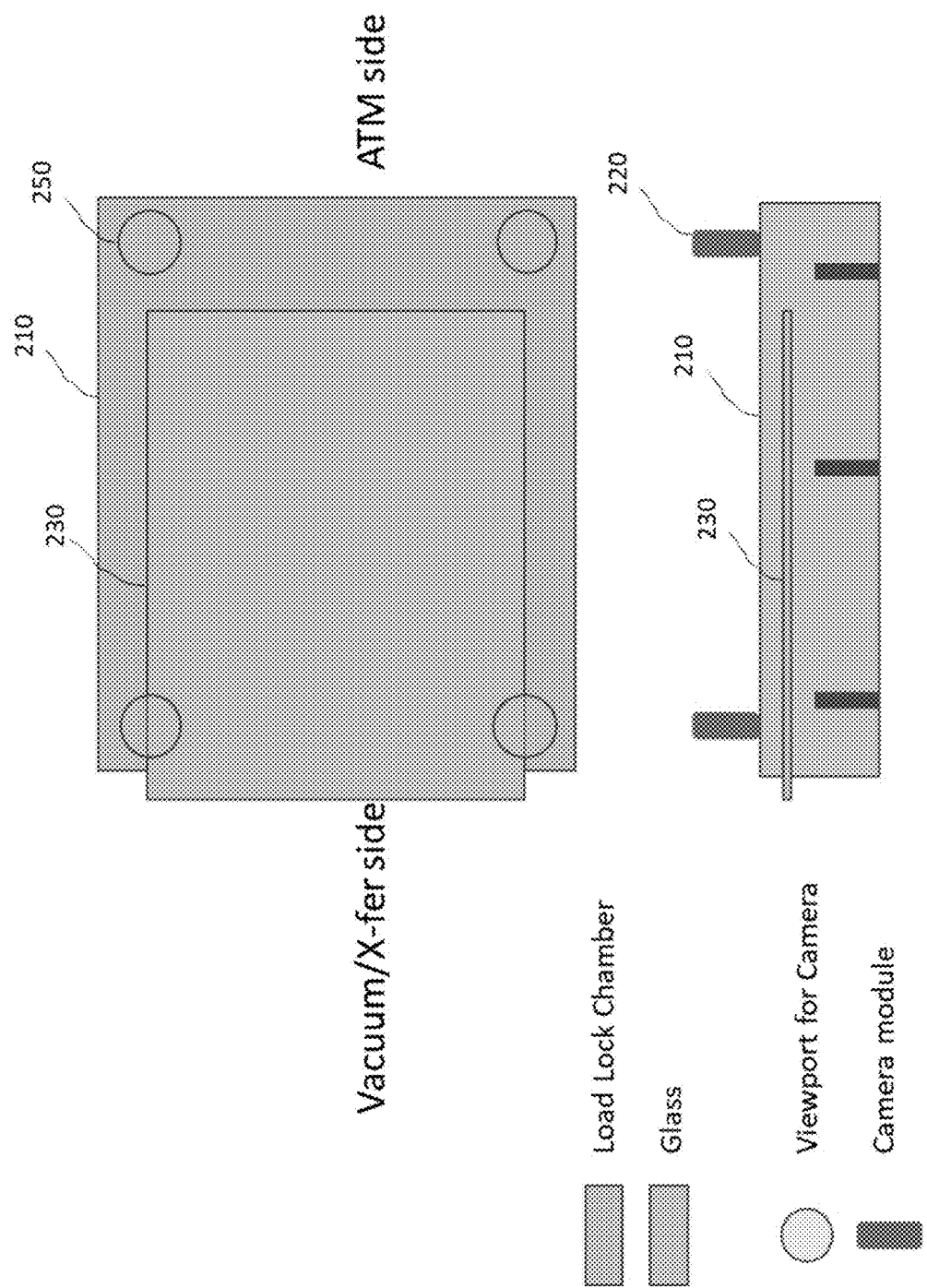

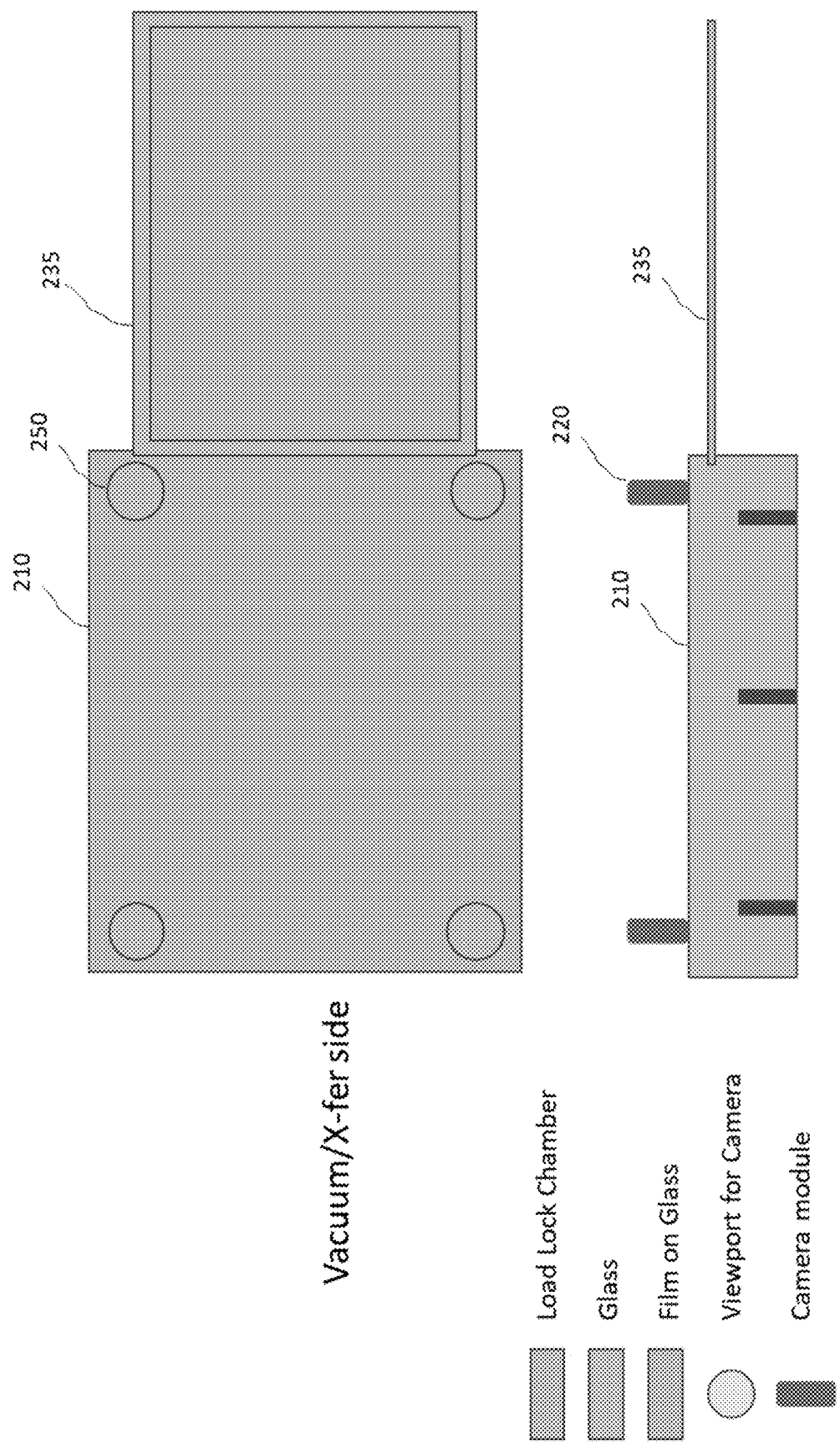

SUBSTRATE INSPECTION SYSTEM AND METHOD OF USE THEREOF

CROSS-REFERENCE TO RELATED APPLICATIONS

Any and all applications for which a foreign or domestic priority claim is identified in the Application Data Sheet as filed with the present application are hereby incorporated by reference under 37 CFR 1.57. This application is a continuation-in-part of U.S. application Ser. No. 17/305,838, filed Jul. 15, 2021, which is a continuation of U.S. application Ser. No. 17/345,795, filed Jun. 11, 2021, which claims the benefit of U.S. Provisional Application No. 63/175,282, filed Apr. 15, 2021. Each of the aforementioned applications is incorporated by reference herein in its entirety, and each is hereby expressly made a part of this specification.

BACKGROUND

Technical Field

The disclosed technologies generally relate to a glass and wafer inspection system, and more particularly the disclosed technologies relate to a camera-based inspection system and a method for inspecting a film deposition process for glass and wafers.

Description of Related Technology

Glasses and wafers (hereinafter to be interchangeably used with a substrate) are coated with a variety of coatings to enhance their mechanical, chemical, optical, electric, magnetic, or other properties. Typically, one or more thin films are deposited on the substrate by one of several processes, such as chemical vapor deposition (CVD) which is a common process for depositing thin films on substrates.

SUMMARY

One aspect of the disclosed technologies provides a method of depositing a film on a substrate, which may comprise: providing a film deposition apparatus comprising: a load lock chamber configured to receive and clamp a substrate, the load lock chamber comprising one or more viewport windows disposed to pass through a wall of the load lock chamber, a deposition chamber configured to deposit a film over the substrate to output a film-deposited substrate, a transfer robot configured to move the substrate and the film-deposited substrate between the load lock chamber and the deposition chamber, and one or more cameras coupled to an exterior portion of the one or more viewport windows of the load lock chamber and configured to capture at least one image of the substrate and/or the film-deposited substrate, disposed inside the load lock chamber, through the one or more viewport windows; loading the substrate, using a loading-unloading robot, from an outside of the load lock chamber to an inside of the load lock chamber to place the substrate in the load lock chamber; moving the substrate, by the transfer robot, from the load lock chamber to the deposition chamber; depositing a film over the substrate in the deposition chamber to output the film-deposited substrate; moving the film-deposited substrate, by the transfer robot, from the deposition chamber to the load lock chamber to place the film-deposited substrate in the load lock chamber; after the film-deposited substrate is placed in the load lock chamber, capturing, by the one or more cameras, at least one image of one or more portions of the film-deposited substrate such that the film is included in the at least one image; unloading, by the loading-unloading robot, the film-deposited substrate from the load lock chamber; analyzing, by at least one controller, the at least one image to determine whether a film deposited over the film-deposited substrate has a defect; and displaying the at least one image and analysis results on a display, wherein analyzing the at least one image comprises: obtaining contrast values of pixels in the at least one image; and processing the contrast values to determine whether the film has a defect or an error.

In the foregoing method, the one or portions of the film-deposited substrate may comprise one or more of corners, sides, or portions other than the corners or sides. Analyzing the at least one image may further comprise: processing the contrast values to detect at least one of a substrate edge line of the substrate or a film edge line of the film-deposited substrate; and determining a distance between the substrate edge line and the film edge line is greater than a predetermined value to determine whether the film has a defect. Analyzing the at least one image may further comprise: defining a target area in the pixels of the at least one image; processing the contrast values of the pixels in the target area to count the number of pixels having the contrast values; and determining the counted number of the pixels is greater than a predetermined value to determine whether the film has a defect.

Still in the foregoing method, analyzing the at least one image may further comprise: defining a target area in the pixels of the at least one image; processing the contrast values of the pixels in the target area to divide the pixels into a first group of pixels having the contrast values greater than a predetermined value and a second group of pixels having the contrast values smaller than the predetermined value; and determining whether a ratio of the first group of pixels to the second group of pixels is smaller than a threshold to determine whether the film has a defect. Analyzing the at least one image may further comprise: defining a target area in the pixels of the at least one image; processing the contrast values of the pixels in the target area to define a width of an edge of the film; and determining whether the width of the edge of the film is greater than a threshold to determine whether the film has a defect. Analyzing the at least one image may further comprise determining at least one of components in the deposition chamber related to the defect of the film, wherein the analysis results being displayed on the display comprises information on the at least one component related to the defect.

Yet in the foregoing method, analyzing the at least one image may further comprise: processing the contrast values to detect a substrate edge line of the substrate; and determining a shift of the substrate edge line from a predetermined location is greater than a predetermined value; and determining that the substrate is erroneously placed. At least one of the one or more cameras may be located at an edge of the load lock chamber, wherein the at least one image is captured by the one or more cameras after the film-deposited substrate is placed in the load lock chamber and before the film-deposited substrate moves from the load lock chamber to the outside of the load lock chamber.

Further in the foregoing method, the method may further comprise: before transferring the substrate to the deposit chamber, capturing at least one additional image of the substrate, analyzing the at least one additional image of the substrate; and displaying the at least one additional image and analysis results on the display, wherein analyzing the at least one image comprises: obtaining contrast values of pixels in the at least one additional image; processing the contrast values to detect a substrate edge line of the substrate; and determining a shift of the substrate edge line from a predetermined location is greater than a predetermined value to determine whether the substrate is erroneously placed in the load lock chamber. The one or more cameras may be located at one or more corners of the load lock chamber.

Another aspect of the disclosed technologies provides a method of depositing a film on a substrate, which may comprise: providing a film deposition apparatus comprising: a load lock chamber configured to receive and clamp a substrate, a deposition chamber configured to deposit a film over the substrate to output a film-deposited substrate, a transfer robot configured to move the substrate and the film-deposited substrate between the load lock chamber and the deposition chamber, and one or more cameras attached to an exterior of the load lock chamber and configured to capture at least one image of the substrate and/or the film-deposited substrate disposed inside the load lock chamber; loading the substrate, using a loading-unloading robot, from an outside of the load lock chamber to an inside of the load lock chamber to place the substrate in the load lock chamber; moving the substrate, by the transfer robot, from the load lock chamber to the deposition chamber; depositing a film over the substrate in the deposition chamber to output the film-deposited substrate; moving the film-deposited substrate, by the transfer robot, from the deposition chamber to the load lock chamber to place the film-deposited substrate in the load lock chamber; capturing, by the one or more cameras, at least one image of one or more portions of the film-deposited substrate such that the film is included in the at least one image; unloading, by the loading-unloading robot, the film-deposited substrate from the load lock chamber; and analyzing, by at least one controller, the at least one image to determine whether a film over the film-deposited substrate has a defect, wherein analyzing the at least one image comprises: obtaining contrast values of pixels in the at least one image, and processing the contrast values to determine whether the film has a defect or an error.

In the foregoing method, the one or portions of the film-deposited substrate may comprise one or more of corners, sides, or portions other than the corners or sides. The method may further comprise displaying the at least one image and analysis results on a display. The load lock chamber may comprise one or more viewport windows disposed to pass through a wall of the load lock chamber, and wherein the one or more cameras are disposed on an exterior portion of the one or more viewport windows of the load lock chamber to capture the at least one image of the substrate and/or the film-deposited substrate, disposed inside the load lock chamber, through the one or more viewport windows. The one or more cameras may be located at locations other than corners of the load lock chamber. The at least one image may be captured while the film-deposited substrate is moving through the load lock chamber.

Yet another aspect of the disclosed technologies provides a method of depositing a film on a substrate, which may comprise: providing a film deposition apparatus comprising: a load lock chamber configured to receive and clamp a substrate, a deposition chamber configured to deposit a film over the substrate to output a film-deposited substrate, a transfer robot configured to move the substrate and the film-deposited substrate between the load lock chamber and the deposition chamber, and one or more cameras attached to an exterior of the load lock chamber and configured to capture at least one image of the substrate and the film-deposited substrate disposed inside the load lock chamber; loading the substrate, using a loading-unloading robot, from an outside of the load lock chamber to an inside of the load lock chamber to place the substrate in the load lock chamber; capturing, by the one or more cameras, at least one first image of one or more portions of the substrate; analyzing the at least one first image; clamping the substrate in the load lock chamber; capturing, by the one or more cameras, at least one second image of the one or more portions of the substrate; analyzing the at least one second image; moving the substrate, by the transfer robot, from the load lock chamber to the deposition chamber; depositing a film over the substrate in the deposition chamber to output the film-deposited substrate; moving the film-deposited substrate, by the transfer robot, from the deposition chamber to the load lock chamber to place the film-deposited substrate in the load lock chamber; capturing, by the one or more cameras, at least one third image of the one or more portions of the film-deposited substrate placed in the load lock chamber such that the film is included in the at least one third image; analyzing the at least one third image; unloading, by the loading-unloading robot, the film-deposited substrate from the load lock chamber; analyzing, by at least one controller, the at least one third image to determine whether a film over the film-deposited substrate has a defect; and displaying the at least one third image and analysis results on a display, wherein analyzing the at least one third image comprises: obtaining contrast values of pixels in the at least one third image; and processing the contrast values to determine whether the film has a defect or an error.

In the foregoing method, analyzing the at least one third image may further comprise: processing the contrast values to detect at least one of a substrate edge line of the substrate and a film edge line of the film-deposited substrate; and determining a distance between the substrate edge line and the film edge line is greater than a predetermined value to determine whether the film has a defect. Analyzing the at least one third image may further comprise: defining a target area in the pixels of the at least one image; processing the contrast values of the pixels in the target area to count pixels having the contrast values; and determining the counted number of the pixel is greater than a predetermined value to determine whether the film has a defect. Analyzing the at least one third image may further comprise: defining a target area in the pixels of the at least one image; processing the contrast values of the pixels in the target area to divide the pixels into a first group of pixels having the contrast values greater than a predetermined value and a second group of pixels having the contrast values smaller than the predetermined value; and determining whether a ratio of the first group of pixels to the second group of pixels is smaller than a threshold to determine whether the film has a defect.

Still in the foregoing method, analyzing the at least one third image may further comprise: defining a target area in the pixels of the at least one image; processing the contrast values of the pixels in the target area to define a width of an edge of the film; and determining whether the width of the edge of the film is greater than a threshold to determine whether the film has a defect. Analyzing the at least one third image may further comprise determining at least one of components in the deposition chamber related to the defect of the film, wherein the analysis results being displayed on the display comprises information on the at least one component related to the defect. The method may further comprise clamping the film-deposited substrate, wherein the at least one third image is captured after the film-deposited substrate is unloaded from the deposition chamber and before the film-deposited substrate is clamped in the load lock chamber.

A further another aspect of the disclosed technologies provides a film deposition apparatus, which may comprise: a load lock chamber comprising a first door and a second door, the first door of the load lock chamber configured to receive a glass substrate from an outside of the film deposition apparatus, the load lock chamber configured to clamp the received glass substrate; a deposition chamber coupled to the second door of the load lock chamber, the deposition chamber configured to deposit a film over the glass substrate to form a film-deposited glass substrate, the deposition chamber further configured to receive the glass substrate from the load lock chamber and release the film-deposited glass substrate to the load lock chamber; a transfer chamber connected to the load lock chamber and the deposition chamber; a transfer robot disposed in the transfer chamber and configured to move the glass substrate between the load lock chamber and the deposition chamber; a plurality of cameras attached to an exterior of the load lock chamber to capture images of one or more corners of each of the glass substrate and the film-deposited glass substrate while the glass substrate and the film-deposited glass substrate are disposed inside the load lock chamber; and at least one controller configured to control operations of one or more of the load lock chamber, the deposition chamber, and the transfer robot, the at least one controller being further configured to: cause the plurality of cameras to capture a first set of images of the one or more corners of the glass substrate after the glass substrate is received from the outside of the film deposition apparatus by the load lock chamber, cause the plurality of cameras to capture a second set of images of the one or more corners of the glass substrate after the received glass substrate is clamped by the load lock chamber, cause the plurality of cameras to capture a third set of images of the one or more corners of the film-deposited glass substrate after the film-deposited glass substrate is released from the deposition chamber and received by the load lock chamber, cause the plurality of cameras to capture a fourth set of images of the one or more corners after the film-deposited glass substrate is clamped by the load lock chamber, analyze at least one of the first, second, third or fourth set of images to determine whether at least one of the glass substrate or the film-deposited glass substrate has a defect, and cause a display to display analysis results and the at least one of the first, second, third or fourth set of images.

In the foregoing apparatus, the plurality of cameras may comprise two or more cameras arranged at two or more corner areas of the load lock chamber, respectively, and configured to capture images of two or more corners of each of the glass substrate and the film-deposited glass substrate that are disposed below the two or more corner areas of the load lock chamber. The plurality of cameras may comprise four cameras arranged at four corner areas of the load lock chamber, respectively, and configured to capture images of four corners of each of the glass substrate and the film-deposited glass substrate that are disposed below the four corner areas of the load lock chamber.

Still in the foregoing apparatus, when analyzing the at least one of the first, second, third or fourth set of images, the at least one controller may be configured to: analyze edge lines of the deposited film in the third or fourth set of images of the one or more corners of the film-deposited glass substrate to evaluate status of parts in the deposition chamber. When analyzing the at least one of the first, second, third or fourth set of images, the at least one controller may be configured to: analyze reflectiveness and refractiveness of the deposited film in the third or fourth set of images of the one or more corners of the film-deposited glass substrate to evaluate operation of parts in the deposition chamber. When analyzing the at least one of the first, second, third or fourth set of images, the at least one controller may be configured to: analyze film corner profiles of the deposited film in the third or fourth set of images of the one or more corners of the film-deposited glass substrate to evaluate at least one of a status of a substrate fixture, sagging of an electrode, a flatness of susceptor, arc formation, or a gap between the electrode and the substrate fixture in the deposition chamber.

Further in the foregoing apparatus, when analyzing the at least one of the first, second, third or fourth set of images, the at least one controller may be configured to: compare the first set of images and the second set of images to evaluate an operation accuracy of a loading-unloading robot configured to load the glass substrate in the load lock chamber. When analyzing the at least one of the first, second, third and fourth sets of images, the at least one controller may be configured to: compare the third set of images and the fourth set of images to evaluate an operation accuracy of the transfer robot.

The foregoing apparatus may further comprise: a plurality of secondary cameras disposed on the outside of the load lock chamber and configured to scan the glass substrate being loaded to the load lock chamber by a loading-unloading robot, wherein the at least one controller is further configured to analyze images scanned by the plurality of secondary cameras to detect a defect of the glass substrate.

Another aspect of the disclosed technologies provides a film deposition apparatus, which may comprise: a load lock chamber comprising a first door and a second door, the first door of the load lock chamber configured to receive a glass substrate from an outside of the film deposition apparatus, the load lock chamber configured to clamp the received glass substrate; a deposition chamber coupled to the second door of the load lock chamber, the deposition chamber configured to deposit a film over the glass substrate to form a film-deposited glass substrate, the deposition chamber further configured to receive the glass substrate from the load lock chamber and release the film-deposited glass substrate to the load lock chamber; a transfer chamber connected to the load lock chamber and the deposition chamber; a transfer robot disposed in the transfer chamber and configured to move the glass substrate between the load lock chamber and the deposition chamber; a plurality of cameras attached to an exterior of the load lock chamber to capture images of one or more portions of each of the glass substrate and the film-deposited glass substrate while the glass substrate and the film-deposited glass substrate are disposed inside the load lock chamber; and at least one controller configured to control operations of one or more of the load lock chamber, the deposition chamber, and the transfer robot, the at least one controller being further configured to: cause the plurality of cameras to capture a first set of images of the one or more portions of the glass substrate after the glass substrate is received from the outside of the film deposition apparatus by the load lock chamber, cause the plurality of cameras to capture a second set of images of the one or more portions of the glass substrate after the received glass substrate is clamped by the load lock chamber, cause the plurality of cameras to capture a third set of images of the one or more portions of the film-deposited glass substrate after the film-deposited glass substrate is released from the deposition chamber and received by the load lock chamber, cause the plurality of cameras to capture a fourth set of images of the one or more portions after the film-deposited glass substrate is clamped by the load lock chamber, analyze at least one of the first, second, third or fourth set of images to determine whether at least one of the glass substrate or the film-deposited glass substrate has a defect, and cause a display to display analysis results and the at least one of the first, second, third or fourth set of images.

Still another aspect of the disclosed technologies provides a method of depositing a film on a glass substrate, which may comprise: providing a film deposition apparatus comprising: a load lock chamber configured to receive and clamp a glass substrate, a deposition chamber configured to deposit a film over the glass substrate to form a film-deposited glass substrate, a transfer chamber connected to the load lock chamber and the deposition chamber, a transfer robot disposed in the transfer chamber and configured to move the glass substrate and the film-deposited glass substrate between the load lock chamber and the deposition chamber, and a plurality of cameras attached to an exterior of the load lock chamber to capture images of one or more corners of each of the glass substrate and the film-deposited glass substrate; moving the glass substrate, using a loading-unloading robot, from an outside of the load lock chamber to an inside of the load lock chamber to place the glass substrate in the load lock chamber; upon placing the glass substrate, capturing, by the plurality of cameras, a first set of images of the one or more corners of the glass substrate; clamping the glass substrate loaded from the outside of the load lock chamber; upon clamping the glass substrate in the load lock chamber, capturing, by the plurality of cameras, a second set of images of the one or more corners of the glass substrate; moving the glass substrate, by the transfer robot in the transfer chamber, from the load lock chamber to the deposition chamber; depositing a film over the glass substrate in the deposition chamber to form the film-deposited glass substrate; moving the film-deposited glass substrate, by the transfer robot, from the deposition chamber to the load lock chamber to place the film-deposited glass substrate in the load lock chamber; upon placing the film-deposited glass substrate in the load lock chamber, capturing, by the plurality of the cameras, a third set of images of the one or more corners of the film-deposited glass substrate; clamping the film-deposited glass substrate in the load lock chamber; upon clamping the film-deposited glass substrate, capturing a fourth set of images of the one or more corners of the film-deposited glass substrate; unloading the film-deposited glass substrate, by the loading-unloading robot, from the load lock chamber; analyzing, by at least one controller, at least one of the first, second, third or fourth set of images to determine whether at least one of the glass substrate or the film-deposited glass substrate has a defect; and displaying the at least one of the first, second, third or fourth set of images and analyzing results on a display.

In the foregoing method, the glass substrate may have a rectangular shape, and the plurality of cameras may comprise four cameras arranged at four corner areas of the load lock chamber, respectively, and configured to capture images of four corners of the glass substrate and the film-deposited glass substrate that are disposed below the four corner areas of the load lock chamber.

Still in the foregoing method, the analyzing may comprise: analyzing edge lines of the deposited film in the third or fourth set of images of the one or more corners of the film-deposited glass substrate to evaluate status of parts in the deposition chamber. The analyzing may comprise: analyzing reflectiveness and refractiveness of the deposited film in the third or fourth set of images of the one or more corners of the film-deposited glass substrate to evaluate operation of parts in the deposition chamber. The analyzing may comprise: analyzing film corner profiles of the deposited film in the third or fourth set of images of the one or more corners of the film-deposited glass substrate to evaluate at least one of a status of a substrate fixture, sagging of an electrode, a flatness of susceptor, arc formation, or a gap between the electrode and the substrate fixture in the deposition chamber.

Further in the foregoing method, the analyzing may comprise: comparing the first set of images and the second set of images to evaluate an operation accuracy of the loading-unloading robot. The analyzing may comprise: comparing the third set of images and the fourth set of images to evaluate an operation accuracy of the transfer robot. The foregoing method may further comprise: scanning, by a plurality of secondary cameras disposed outside the load lock chamber, the glass substrate being loaded to the load lock chamber by the loading-unloading robot to detect a defect of the glass substrate.

In the foregoing methods discussed above, the film can be deposited by using at least one of chemical vapor deposition (CVD) including but not limited to plasma enhanced CVD (PECVD), physical vapor deposition (PVD), atomic layer deposition (ALD) including but not limited to plasma enhanced ALD (PEALD), or a printing film deposition method including but not limited to an inkjet film deposition method.

In the foregoing methods discussed above, instead of clamping the glass substrate using a clamping device after being disposed in the load lock chamber by the loading-unloading robot or the transfer robot, the glass substrate may be aligned or re-positioned using other alignment devices, such as a motion controller that can adjust the position of the glass substrate in a x-direction and in a y-direction.

In the foregoing methods discussed above, when analyzing the pictures discussed above, brightness of the pixels may be used along with or instead of the contrast values of the pixels. Further, differences between the contrast values of the pixels and/or differences between brightness values of the pixels may be used.

A further aspect of the disclosed technologies provides a non-transitory storage medium storing instructions therein, wherein when executed by the at least one controller of the foregoing film deposition apparatus, the instructions may cause the at least one controller to: cause the plurality of cameras to capture a first set of images of the one or more corners of the glass substrate after the glass substrate is received from the outside of the film deposition apparatus by the load lock chamber, cause the plurality of cameras to capture a second set of images of the one or more corners of the glass substrate after the received glass substrate is clamped by the load lock chamber, cause the plurality of cameras to capture a third set of images of the one or more corners of the film-deposited glass substrate after the film-deposited glass substrate is released from the deposition chamber and received by the load lock chamber, cause the plurality of cameras to capture a fourth set of images of the one or more corners after the film-deposited glass substrate is clamped by the load lock chamber, analyze at least one of the first, second, third or fourth set of images to determine whether at least one of the glass substrate or the film-deposited glass substrate has a defect, and cause a display to display analysis results and the at least one of the first, second, third or fourth set of images.

The following presents a simplified summary of one or more embodiments of the disclosed technologies in order to provide a basic understanding of such embodiments. This summary is not an extensive overview of all contemplated embodiments and is intended to neither identify key or critical elements of all embodiments nor delineate the scope of any or all embodiments. Its sole purpose is to present some concepts of one or more embodiments in a simplified form as a prelude to the more detailed description that is presented later.

Another aspect of the disclosed technologies is directed to an inspection system.

It is another aspect of the disclosed technologies that the inspection system can recognize the glass location in a process chamber apparatus.

It is still another aspect of the disclosed technologies that the inspection system can recognize the fixture status on the substrate.

It is yet another aspect of the disclosed technologies that the inspection system can recognize the sagging of big size electrodes in the process chamber apparatus.

It is still another aspect of the disclosed technologies that the inspection system can detect substrate breakage, crack, stain, or spot.

It is a further aspect of the disclosed technologies that the inspection system can detect transfer robot performance with glass position data.

In one aspect, disclosed is a method of inspection and an inspection system for film deposition process for substrates includes glass and wafer. The inspection system includes multiple cameras positioned in a load lock unit of the deposition chamber, such as the cameras can capture the substrate in the load lock.

In one aspect, the cameras are coupled to a controller, wherein the controller is configured to analyze the images obtained from the camera for defects in the deposition process and the process itself including breakage, crack, stain or spot, transfer robot performance with glass position data, fixture alignment status with analysis of film edge line, and electrode sagging with film analysis of corner area.

In one aspect, disclosed is a method for analyzing the film with different reflectiveness and refractiveness of induced light in the camera module.

In one aspect, disclosed is a method for corner film profile analysis that can check susceptor/electrode flatness, arc generation, and the assembling status of substrate fixtures (S/F).

In one aspect, disclosed is a method for evaluating the accuracy and precision of the transfer robot in the substrate loading and unloading.

Any of the features of an aspect is applicable to all aspects identified herein. Moreover, any of the features of an aspect is independently combinable, partly or wholly with other aspects described herein in any way, e.g., one, two, or three or more aspects may be combinable in whole or in part. Further, any of the features of an aspect may be made optional to other aspects. Any aspect of a method can comprise another aspect of a film deposition apparatus, and any aspect of a film deposition apparatus can be configured to perform a method of another aspect.

These and other aspects, features and advantages of the embodiments herein and the summary will become readily apparent from the following detailed description taken in conjunction with the accompanying drawings.

BRIEF DESCRIPTION OF THE DRAWINGS

The accompanying figures, which are incorporated herein, form part of the specification and illustrate embodiments of the disclosed technologies. Together with the description, the figures further explain the principles of the disclosed technologies and to enable a person skilled in the relevant arts to make and use the disclosure.

FIG. 7 shows an interface provided by a controller on a display, according to an embodiment.

FIGS. 12A-12L show how the glass substrate is loaded to and unloaded from a load lock and deposition chambers in the film deposition process according to an embodiment.

FIGS. 13A-13G show loading statuses of a glass substrate when being loaded in a film deposition system according to an embodiment.

FIG. 14 shows loading status of a glass substrate with a deposited film for depositing an additional film layer when loaded in a film deposition system according to another embodiment.

DETAILED DESCRIPTION

Figure 1:
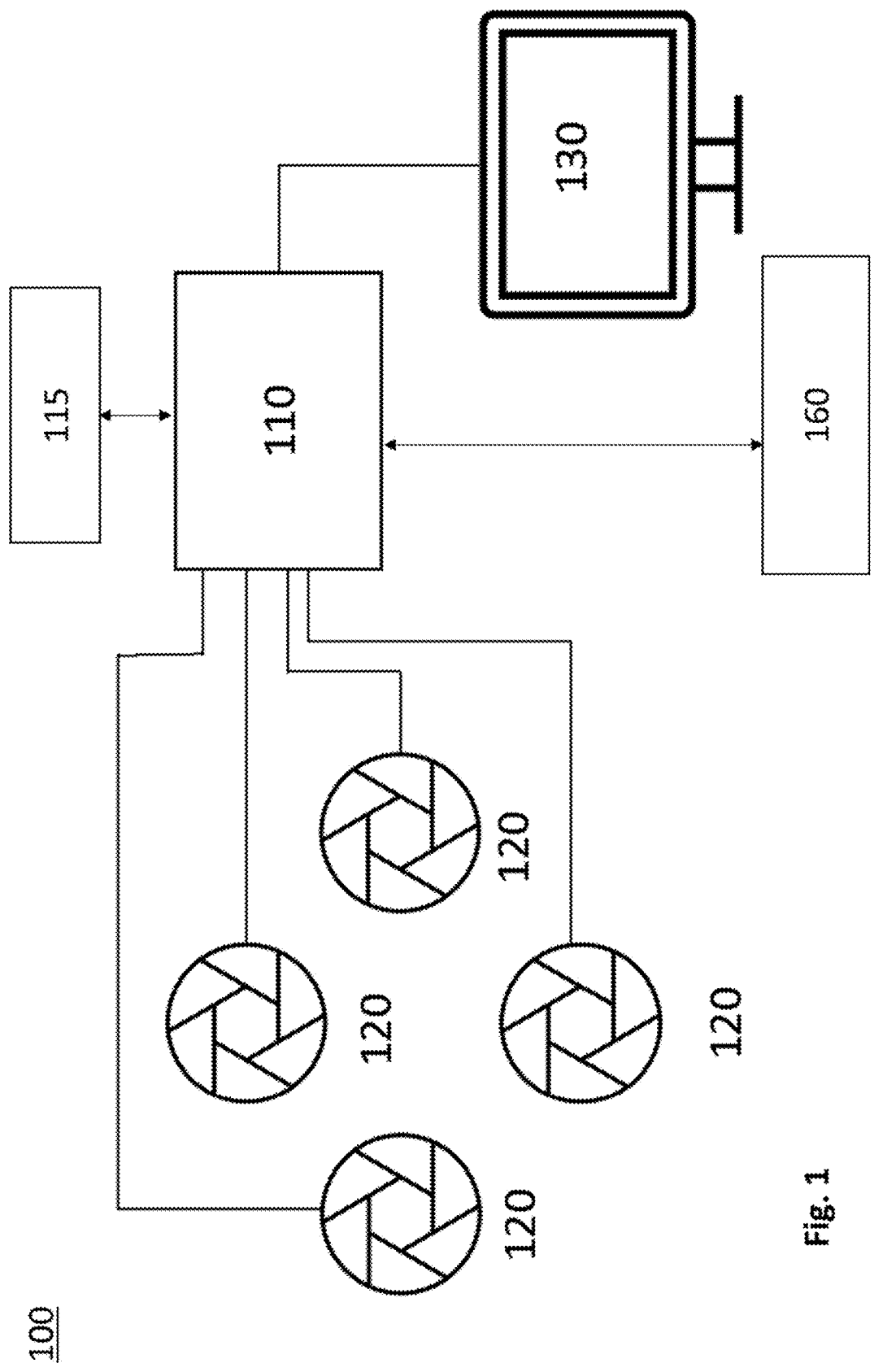
FIG. 1 is a block diagram showing a substrate inspection system, according to an embodiment.

A film deposition process can be conducted in special chambers, such as plasma enhanced CVD (PECVD) or physical vapor deposition (PVD) chambers. Robots can be used to handle the glass in and out of the chambers without any human intervention. The deposition process is generally monitored or inspected for any defects, such as chipping, break, spot/stain etc., which can be detected with known vision systems. Currently known inspection methods have several limitations. The deposition process is prone to several kinds of defects which cannot be detected by known inspection systems. Moreover, the known inspection systems cannot recognize the substrate location in the process chamber apparatus and a lot of other process parameters. There currently exists an industry need for an inspection system that can more efficiently and accurately detect defects in both the substrate processing and the processing parameters.

Subject matter will now be described more fully hereinafter with reference to the accompanying drawings, which form a part hereof, and which show, by way of illustration, embodiments. Subject matter may, however, be embodied in a variety of different forms and, therefore, covered or claimed subject matter is intended to be construed as not being limited to any embodiments set forth herein; embodiments are provided merely to be illustrative. Likewise, a reasonably broad scope for claimed or covered subject matter is intended. Among other things, for example, the subject matter may be embodied as methods, devices, components, or systems. The following detailed description is, therefore, not intended to be taken in a limiting sense.

The word "exemplary" is used herein to mean "serving as an example, instance, or illustration." Any embodiment described herein as "example" is not necessarily to be construed as preferred or advantageous over other embodiments. Likewise, the term "embodiment" or "embodiments" does not require that all embodiments of the disclosure include the discussed feature, advantage, or mode of operation.

The terminology used herein is for the purpose of describing particular embodiments only and is not intended to be limiting of embodiments of the disclosure. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

The following detailed description discusses embodiments of the disclosure. The description is not to be taken in a limiting sense but is made merely for the purpose of illustrating the general principles of the disclosure, since the scope of the disclosure will be defined by the allowed claims of any resulting patent.

FIG. 1 shows a substrate inspection system 100 that can be used for monitoring a thin film deposition process in a deposition chamber for substrates including a glass and a wafer. The inspection system 100 can include a control unit or controller 110 that can be connected to several camera modules 120 wirelessly or by wire. Although only four camera modules 120 are shown in FIG. 1, less than or more than four camera modules can be provided, depending on the embodiment. The camera modules 120 can be installed in the substrate load lock unit 220 of the process chamber apparatus 200 (see FIG. 2), also referred to hereinafter as a load lock. The controller 110 can control the camera modules 120. For example, the controller 110 of the inspection system 100 can be connected to or communicate data with the process chamber apparatus 200 (see FIG. 2) to detect steps of the operation, such as glass loading. The controller 110 of the inspection system 100 can communicate with components of the process chamber apparatus 200, for example, camera modules 220, a load lock 210, and/or a processor controller (not shown) of the process chamber apparatus 200 to determine deposition steps. Based on the input from the process chamber apparatus 200, the controller 110 can control the activation of the camera modules 120. The controller 110 can also be connected to a display 130, wherein the controller 110 can provide an interface on the display 130 graphically presenting different parameters of the inspection and the identified values of the parameters. The inspection system 100 can also include a memory 115 in data communication with the controller 110. The memory 115 may include instructions causing the controller 110 to perform inspection operations disclosed herein. The memory 115 may also store substrate images that have been taken by the camera modules 120 (or 220 in FIG. 2). When the substrate images are stored in the memory 115, the controller 110 may retrieve and analyze the captured images for various potential defects disclosed herein.

Figure 2:
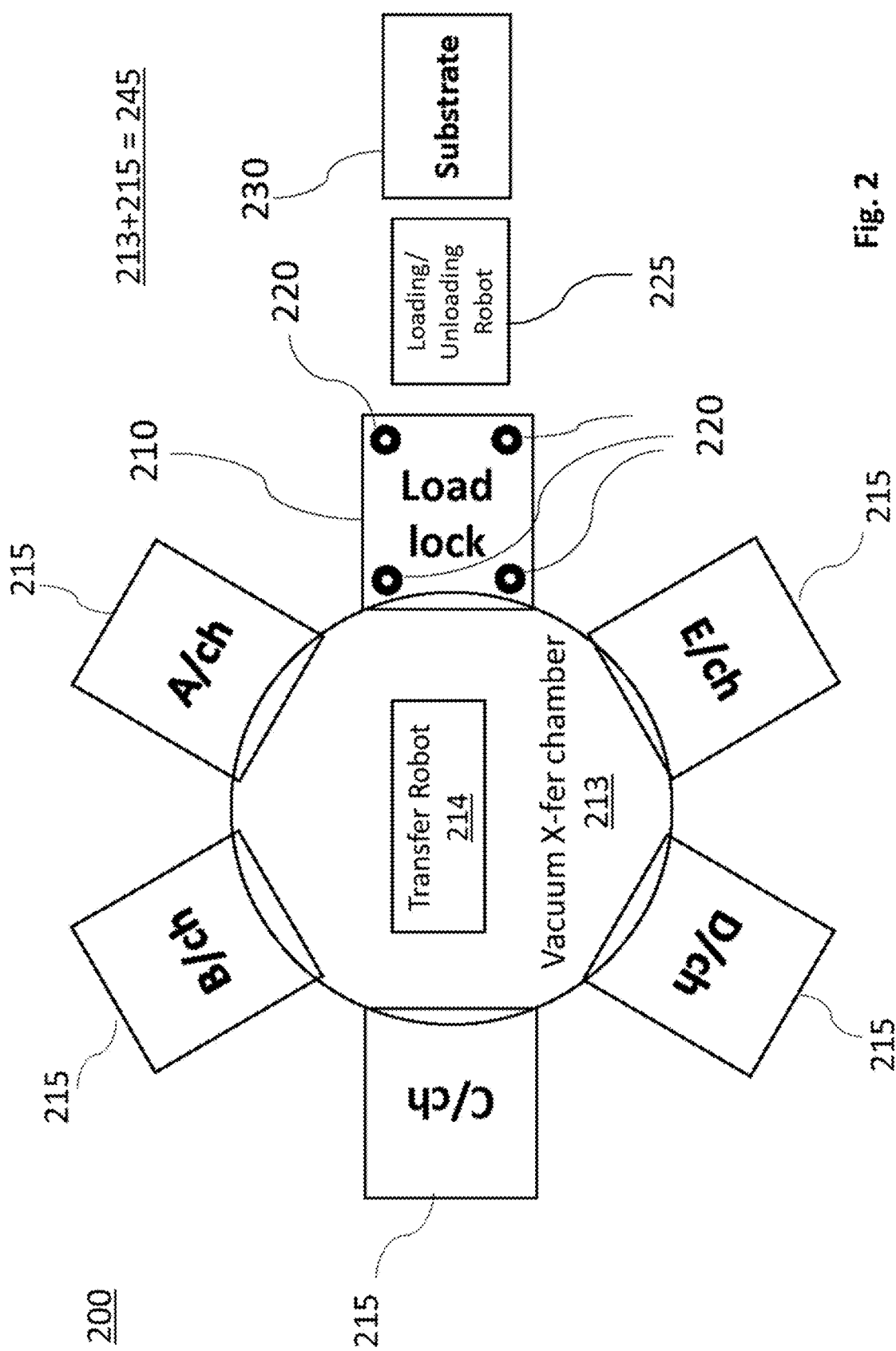
FIG. 2 shows an embodiment of the arrangement of camera modules in a process chamber apparatus to be used for the inspection system of FIG. 1, according to an embodiment.

FIG. 2 shows an embodiment of the arrangement of camera modules in a process chamber apparatus 200 to be used for the inspection system 100 of FIG. 1, according to an embodiment. For the purpose of convenience, the controller 110, memory 115, and display 130 are not shown in FIG. 2. The process chamber apparatus 200 can perform thin film deposition or coating on a substrate 230, such as glass or wafer. The process chamber apparatus 200 can include a substrate load lock unit 210 that can receive the substrate 230, a loading/unloading robot 225 for loading the glass into the load lock 210 and unloading the glass from the load lock 210, and a processing module 245 that includes a vacuum transfer chamber 213 and one or more deposition chambers 215. The substrate load lock unit 210 can include a front door that receives the substrate 230 from the outside of the process chamber apparatus 200. Another door, coupled to the vacuum transfer chamber 213, separates the processing module 245 from the load lock 210. The process chamber apparatus 200 can further include a transfer robot 214 that includes robotic arms having substrate fixtures and that can move the substrate 230 into and from the substrate load lock unit 210. The substrate 230 is generally introduced into the load lock 220 first and then transferred into the processing module 245. The processing module 245 can include one or more vacuum chambers 215 in which deposition processes like sputtering, electron beam evaporation, or thermal evaporation take place. The load lock 210 can be another vacuum chamber that is connected to the processing module 245. The load lock 210 can be separated by a gate valve (not shown), and have their own high vacuum pump down and vent control.

The camera modules 220 can be positioned in or adjacent to the load lock 210 to capture the handling and status of the substrate 230 before and after the processing. FIG. 2 shows four camera modules 220 mounted to the load lock 210 for capturing images of the substrate 230 in the load lock 210. All the four camera modules 220 can be in electrical communication with the controller 110. It is to understand that FIG. 2 shows four camera modules, however, two or more camera modules are within the scope of the disclosed technologies.

Although FIG. 2 shows that all of the four camera modules 220 are disposed at or near corners of the load lock 210, the present disclosure is not limited thereto. For example, at least one of the four camera modules 220 can be disposed at a non-corner portion (e.g., side portion) of the load lock 210, and at least another one of the four camera modules 220 can be disposed at a portion of the load lock 210. Furthermore, a distance between two adjacent camera modules may not necessarily be equal to a distance between another two adjacent camera modules.

In some embodiments, at least one of the four camera modules 220 can be positioned on a top exterior surface of the load lock 210 so that the at least one camera module can be directly placed above portions (e.g., corner or side portions) of the substrate 230 to be captured. In other embodiments, at least one of the four camera modules 220 can have an adjustable capturing angle to capture different portions of the substrate 230 when the at least one camera module is in a downward oblique arrangement with respect to portions of the substrate 230 to be captured. For example, at least one first camera module having an adjustable capturing angle can be positioned at a first exterior side wall of the load lock 210, and can capture a portion of the substrate positioned near at a second exterior side wall of the load lock 210 that is opposite to the first exterior side wall of the load lock 210. As another example, at least one second camera module having an adjustable capturing angle can be positioned at the second exterior side wall of the load lock 210, and can capture a portion of the substrate positioned near the first exterior side wall of the load lock 210 that is opposite to the second exterior side wall of the load lock 210.

The camera modules 220 can be positioned at or attached to an outer surface of the load lock 210 that allows the camera modules 220 to view therethrough and capture portions of the substrate 230 that has been introduced into the inside of the load lock 210. The outer surface of the load lock 210 can include a transparent viewing port (to be described in greater detail).

The process chamber apparatus 200 can include the loading/unloading robot 225 that can transfer a new substrate 230 into the load lock 210. The front door of the load lock 210 can be opened to receive the substrate 230 into the load lock 210. The robot 225 can extend the arm to deliver the substrate 230 into the load lock 210 and lowers the substrate 230 onto support pins in the load lock 210 and the arm can then be retracted. Upon receiving the substrate 230 and removal of the arm, the front door can be closed. Thereafter, the load lock 210 can pump down to get the base vacuum level, which generally takes about 20 or 30 secs. During the pumping down in the glass loading chamber, the controller 110 can trigger the four camera modules 220 to capture images of the substrate 230 disposed in the load lock 210. The images can be analyzed by the controller 110 for the position of the substrate 230 in the load lock 210.

Figure 3:
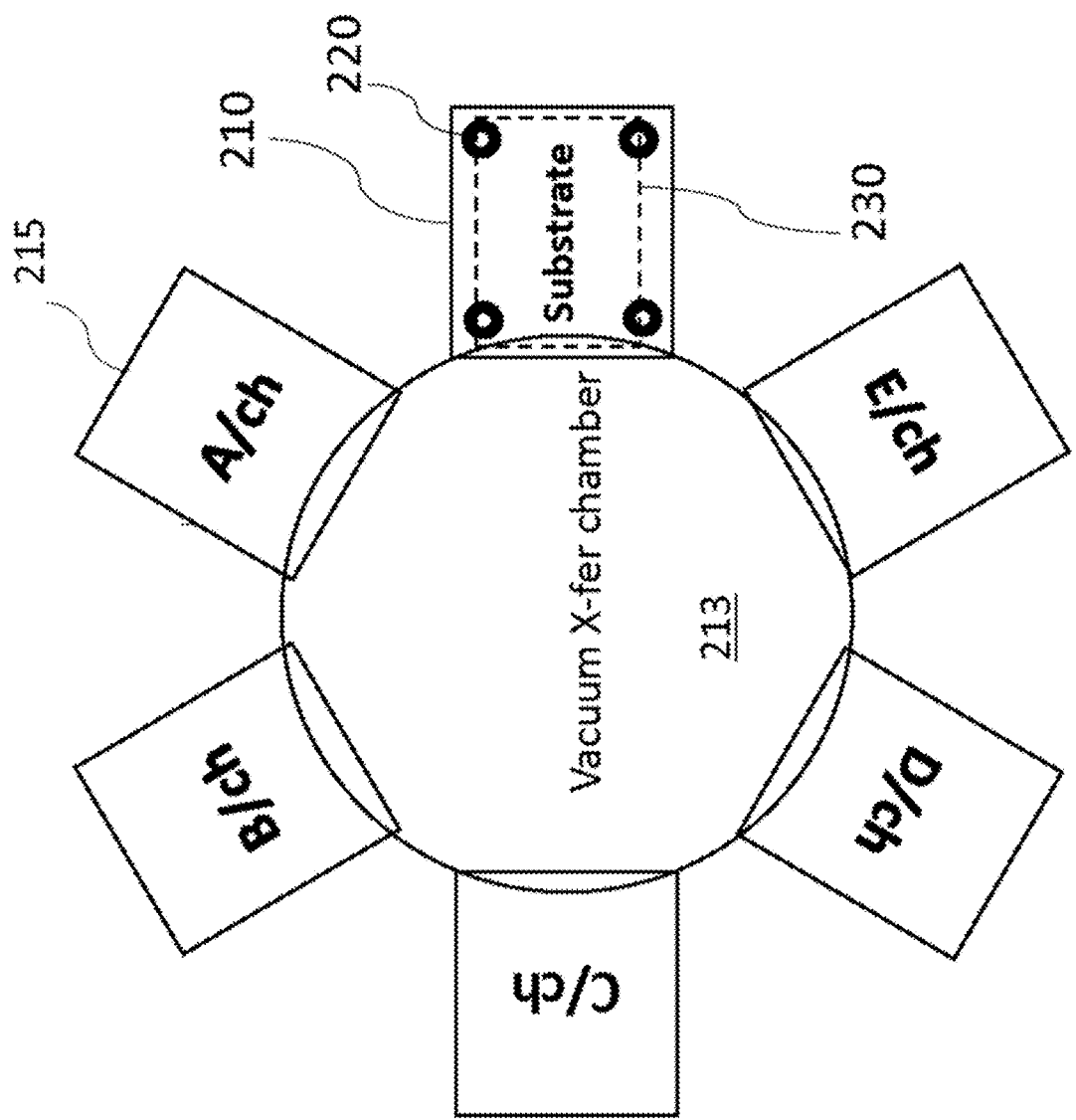
FIG. 3 shows the substrate loaded in a substrate loading chamber, according to an embodiment.

FIG. 3 shows the substrate 230 that has been loaded in the load lock 210. The position of the four camera modules 220 can be relative to the substrate 230. The arrangement of the camera modules 220 in the load lock 210 can be changed with respect to the substrate 230 without departing from the scope of the disclosed technologies.

Figure 4:
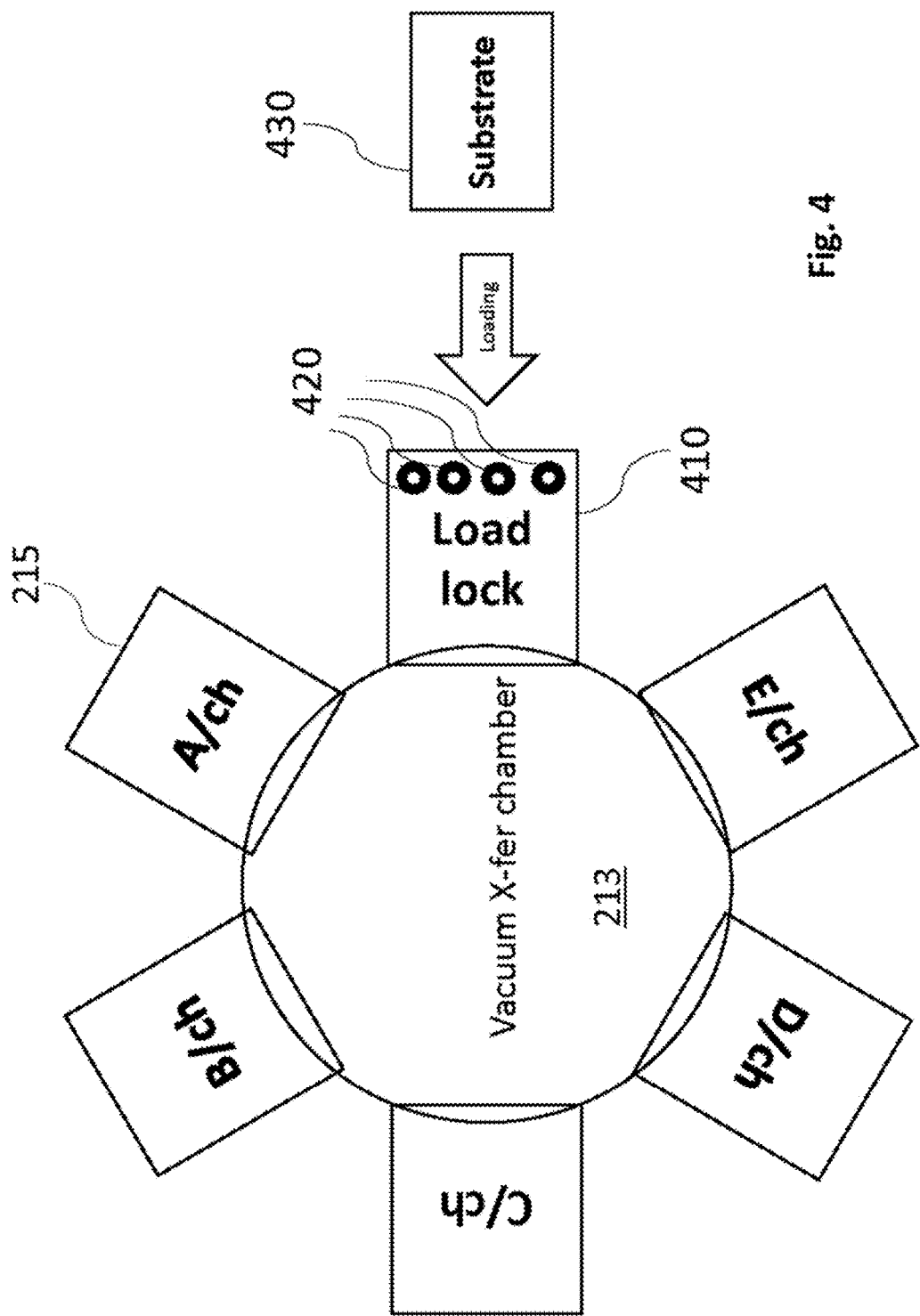
FIG. 4 shows a different arrangement of the camera modules in a process chamber apparatus to be used for the inspection system of FIG. 1, according to an embodiment.

FIG. 4 shows a different arrangement of camera modules 420 in a process chamber apparatus to be used for the inspection system 100 of FIG. 1, according to an embodiment. In FIG. 4, the four camera modules 420 are linearly arranged at the entrance of a load lock 410 so that once a substrate 430 is introduced into the load lock 410, different portions of the same side of the substrate 230 can be captured by the camera modules 420.

Figure 5:
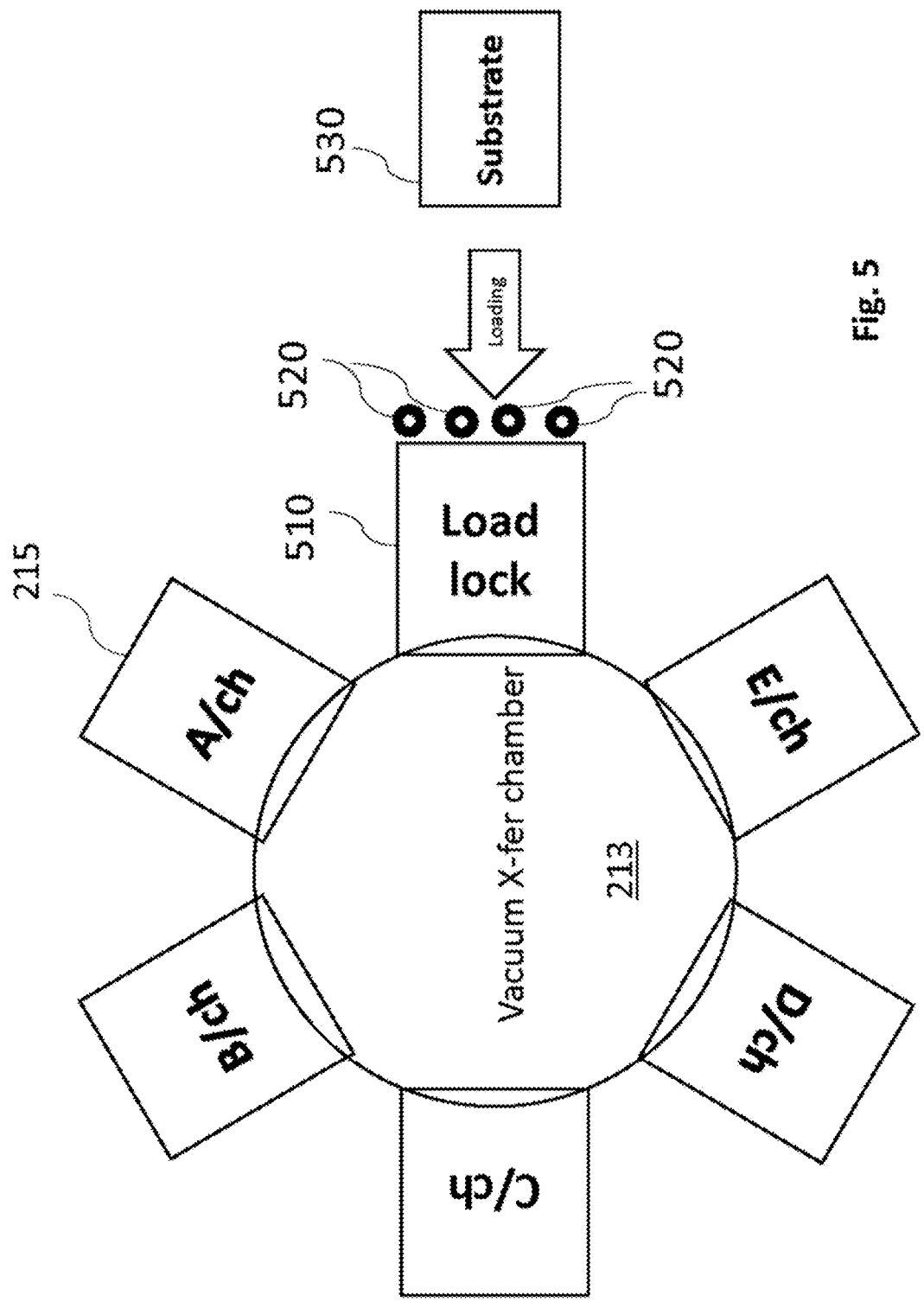
FIG. 5 shows yet another arrangement of the camera modules in a process chamber apparatus to be used for the inspection system of FIG. 1, according to an embodiment.

FIG. 5 shows yet another arrangement of camera modules 520 in a process chamber apparatus to be used for the inspection system 100 of FIG. 1, according to an embodiment. In FIG. 5, the four camera modules 520 are still arranged linearly but positioned differently with respect to a substrate 530 near the entrance of the load lock 510. The arrangements of the four camera modules shown in FIGS. 2-5 are merely examples, and a skilled person will appreciate that the position and arrangement of the four camera modules can be optimized based on the process parameters.

Figure 6:
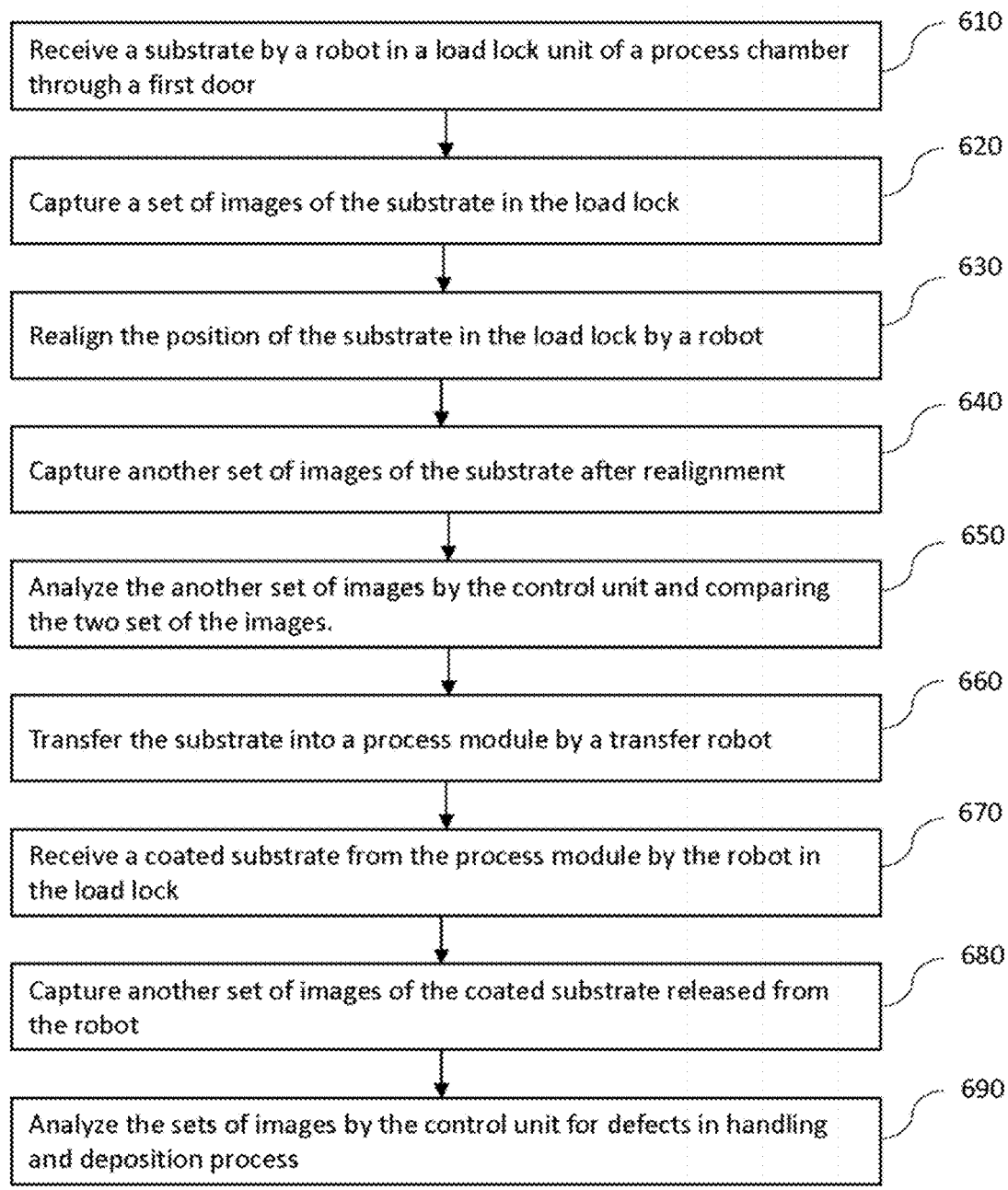
FIG. 6 is a flowchart showing a method of inspecting a substrate coating process, according to an embodiment.

FIG. 6 is a flowchart showing an embodiment of the method of monitoring the substrate coating process in a process chamber apparatus. FIG. 6 is merely an example method for monitoring the substrate coating process in a process chamber apparatus, and certain steps may be removed, other steps added, two or more steps combined or one step can be separated into multiple steps depending on the specification and requirements. At least some steps of FIG. 6 can be performed or caused to be performed by a computing device such as the controller 110 of FIG. 1. For the purpose of the convenience, the description will be made based on the controller 110 performing at least some of the process of FIG. 6.

First, a substrate can be received by a robot in a substrate load lock unit of the process chamber apparatus, at step 610. The robot can release the substrate in the load lock on support pins and get retracted from the load lock. In step 610, the controller 110 may control the robot to transfer the substrate into the load lock unit. The controller 110 can trigger the camera modules to capture the images of the substrate in the load lock rested on the support pins, at step 620. Images captured at this stage can be useful in determining the accuracy and precision of the robot in handling the substrate. A robot typically handles the substrate four times in the load lock i.e., receiving the substrate, transferring the substrate to the process modules, receiving from the process modules, and transferring outside the process chamber apparatus. Clamping of the substrate by the robot can also damage the substrate or coating on the substrate. The controller 110 can analyze the images captured at step 620 to track the defects in the substrate caused by clamping. The image can be received by the controller 110 and using the predefined rules, the controller 110 can analyze the images to detect inspect any damage, scratch, stain on the substrate. The controller 110 can use the position of the substrate in the load lock to check the accuracy of the robot and do any calibrations if needed.

In the next stage, the controller 110 can control the robot to realign the position of the substrate in the load lock if required by shifting or sliding the substrate within the load lock, at step 630. The controller 110 can control the camera modules to capture the new position of the substrate after realignment by the robot, at step 640. The controller 110 can analyze the images captured at step 640 to measure the displacement of the substrate and detect any defect resulted from the clamping, at step 650. The controller 110 can perform the analysis by comparing the images captured at step 640 with the images captured at step 620. After receiving the substrate at step 610, the load lock generally pumps the air to create a vacuum. Upon completion of the pumping, the controller 110 can control the load lock and processing module such that the door of the transfer chamber side can be open, and the transfer chamber robot arm can pick the substrate for transferring to the process modules, at step 660. The film deposition process can be carried out in the process modules. Once the deposition process is complete, the controller 110 can control the transfer robot to move the substrate such that the substrate can be moved back to the load lock, at step 670. The transfer robot can deliver the substrate in the load lock and retract. In the load lock, the controller 110 can control the camera modules 220 to take another set of images of the substrate, at step 680. The controller 110 can use this set of images to analyze the accuracy of the transfer robot in positioning the substrate in the load lock, at step 690. Moreover, the controller 110 can analyze the set of images to inspect the substrate for scratches, cracks, or abnormal plasma. Any displacement of the substrate by the transfer robot can again be inspected using another set of images captured. After clamping, another set of images can be captured by the camera modules. Comparing the image set after clamping with the image set just before clamping can reveal any errors in the handling, such as any crack or scratch by clamping. The analysis can be done by the controller 110 which can receive the set of the images captured by the camera modules.

The final set of images captured for the coated substrate, i.e., after the film deposition process, the set of images can be analyzed by the controller 110 for any defects in the deposition process. For example, the controller 110 can analyze the film condition at the corner areas. If there is a gap between the electrode of the ground side and the glass fixture, there may be an unclear edge line and different film densities at the corner area. The controller 110 can be equipped with suitable algorithms to detect the susceptor/ electrode flatness, Arc generation, assembling status of substrate fixture (S/F) using the corner film profile. The controller 110 can further analyze substrate fixture sitting status and the robot's accuracy and precision at different stages in handling the substrate.

FIG. 7 shows an interface provided by the controller 110 on the display 130 (see FIG. 1), according to an embodiment. Referring to FIG. 7, the controller 110 can be connected to a suitable display and an interface can be provided by the controller 110 on the display for monitoring the status of the substrate before and after the deposition process. The interface can be an interactive interface that may allow a user to interact with the system to determine and inspect different parameters, defining thresholds. The interface can include multiple frames for displaying the images. FIG. 7 shows four frames that can show the processed images of the upper left, upper right, lower left, and the lower right of the substrate. On the right side can be seen different parameters for the substrate. Thresholds including the minimum and maximum can be provided for desired parameters. The user can see the parameters for either upper left, upper right, lower left, and the lower right, wherein clickable tabs can be provided to switch between windows presenting the parameters for the upper left, upper right, lower left, and the lower right. FIG. 7 shows the clickable tabs in the upper right position.

Figure 8:
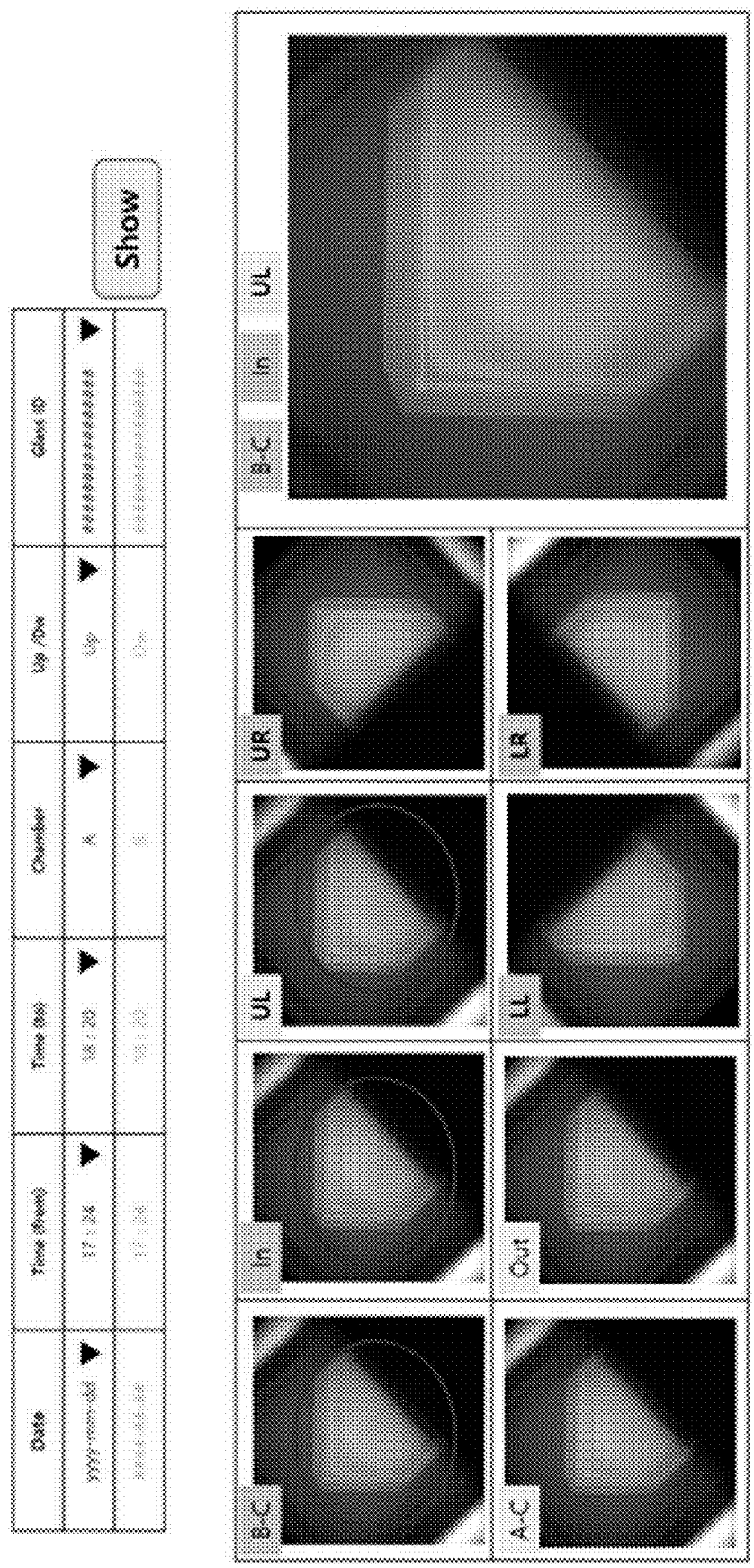
FIG. 8 shows an embodiment of the interface having a frame for images, according to an embodiment.

FIG. 8 shows the set of images captured for the corner profile analysis. The interface can provide options to view the image set of desired time duration and stage of different process modules. The user can navigate through the list and select an entry to view the images and related parameters.

Figure 9:
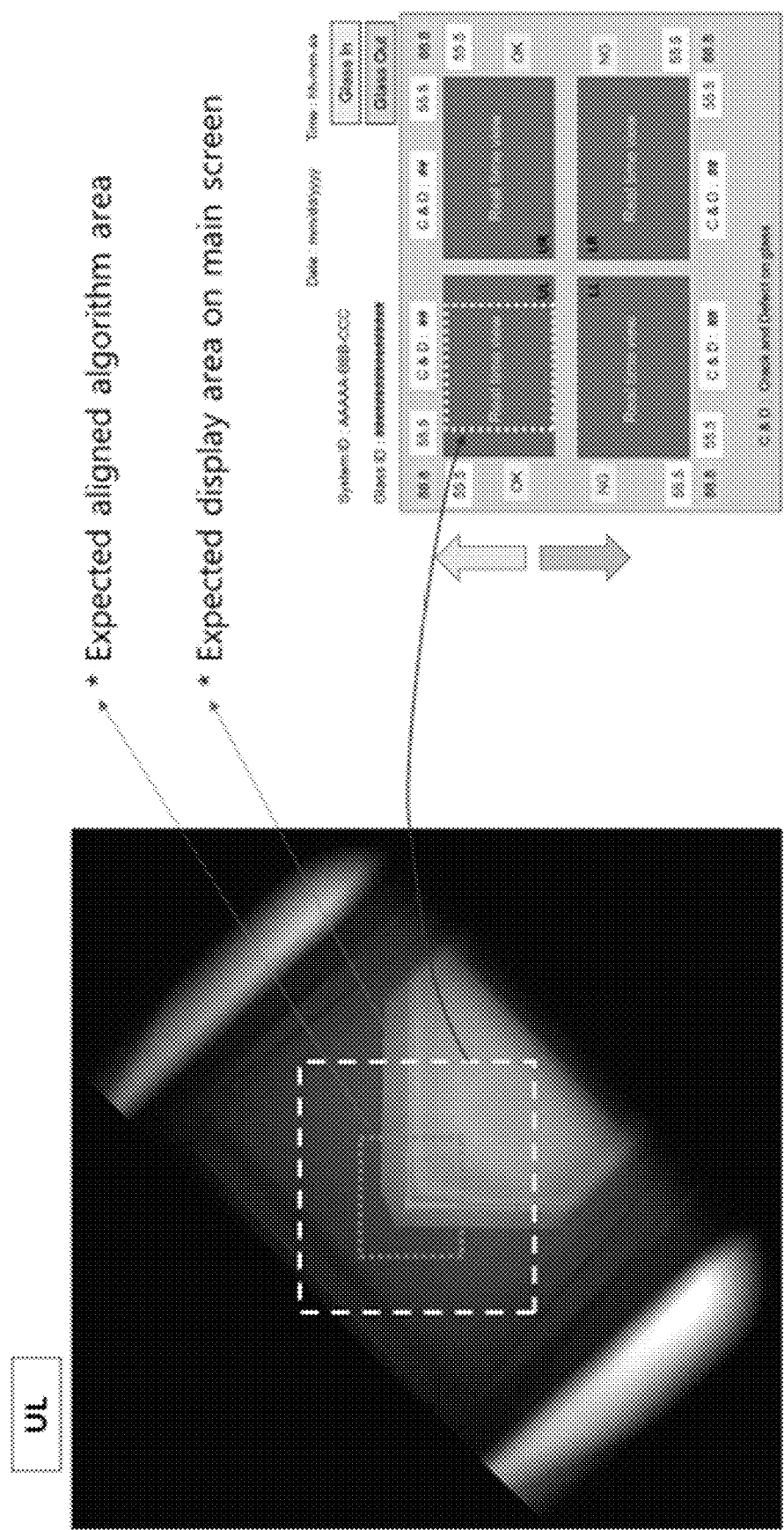
FIG. 9 shows an image for corner profile analysis and the frame view of the image as displayed on the interface of FIG. 7, according to an embodiment.
Figure 10:
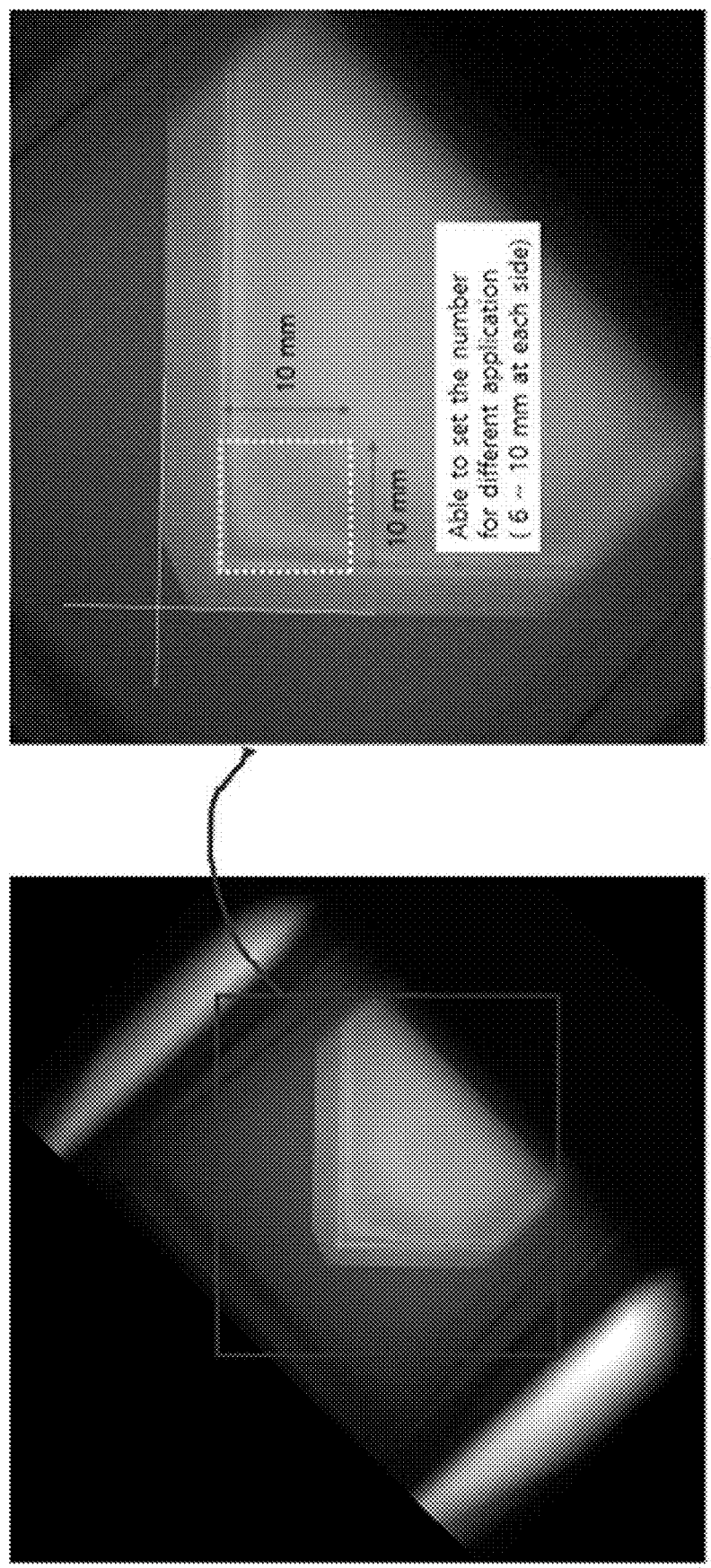
FIG. 10 shows an embodiment of analyzing an image for corner profile analysis, according to an embodiment.

FIG. 9 illustrates how the controller can process the image using the predefined rules and algorithms and display a section of the image in the frame of the main interface shown in FIG. 7. FIG. 10 shows how to set thresholds for the corner profile analysis.

Additional embodiments are further discussed below.

Overview of Film Deposition Process

Figure 11:
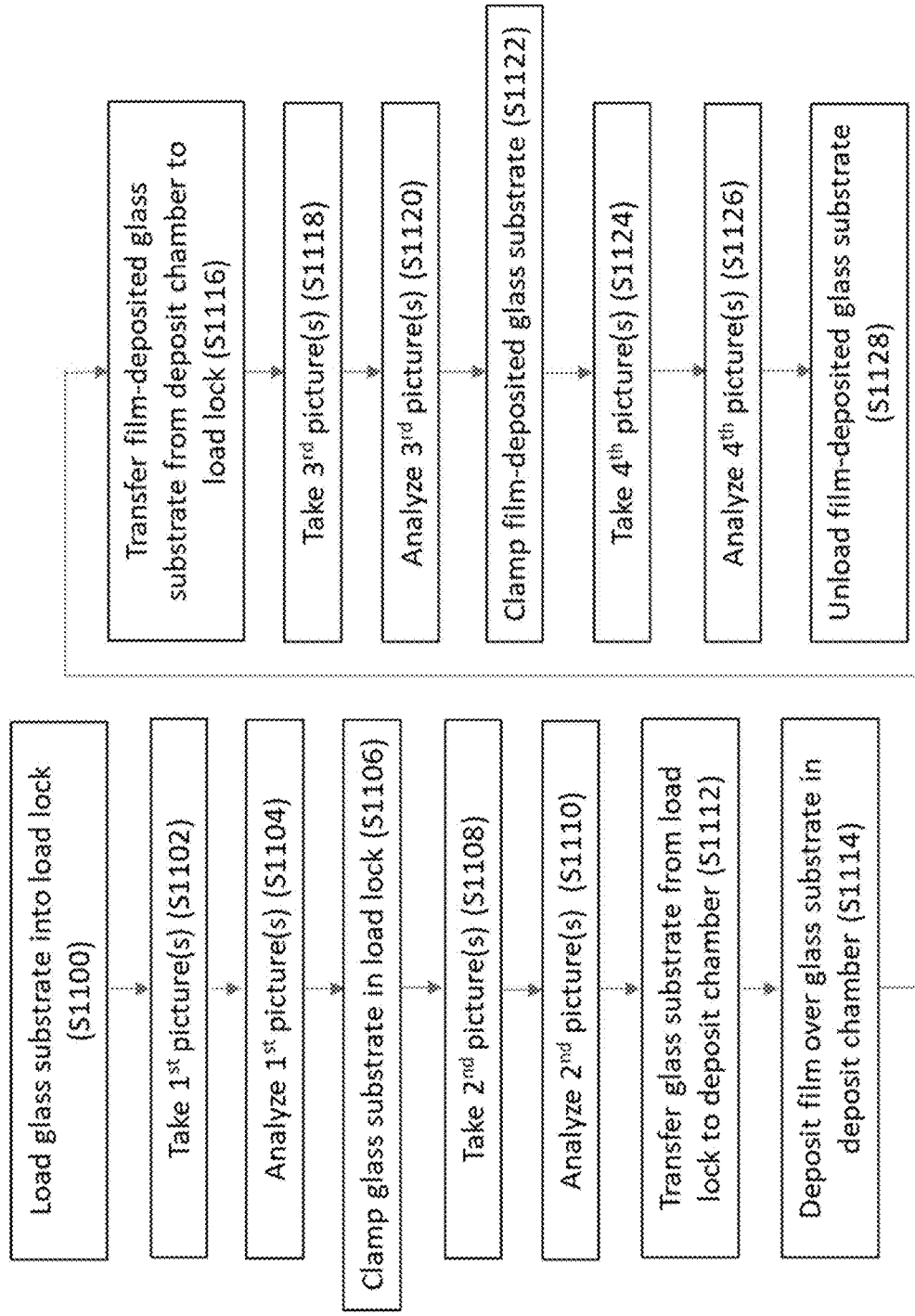
FIG. 11 is a flowchart of a film deposition process according to an embodiment, in which a glass substrate and a film deposited on the glass substrate are being inspected.
Figure 12D:
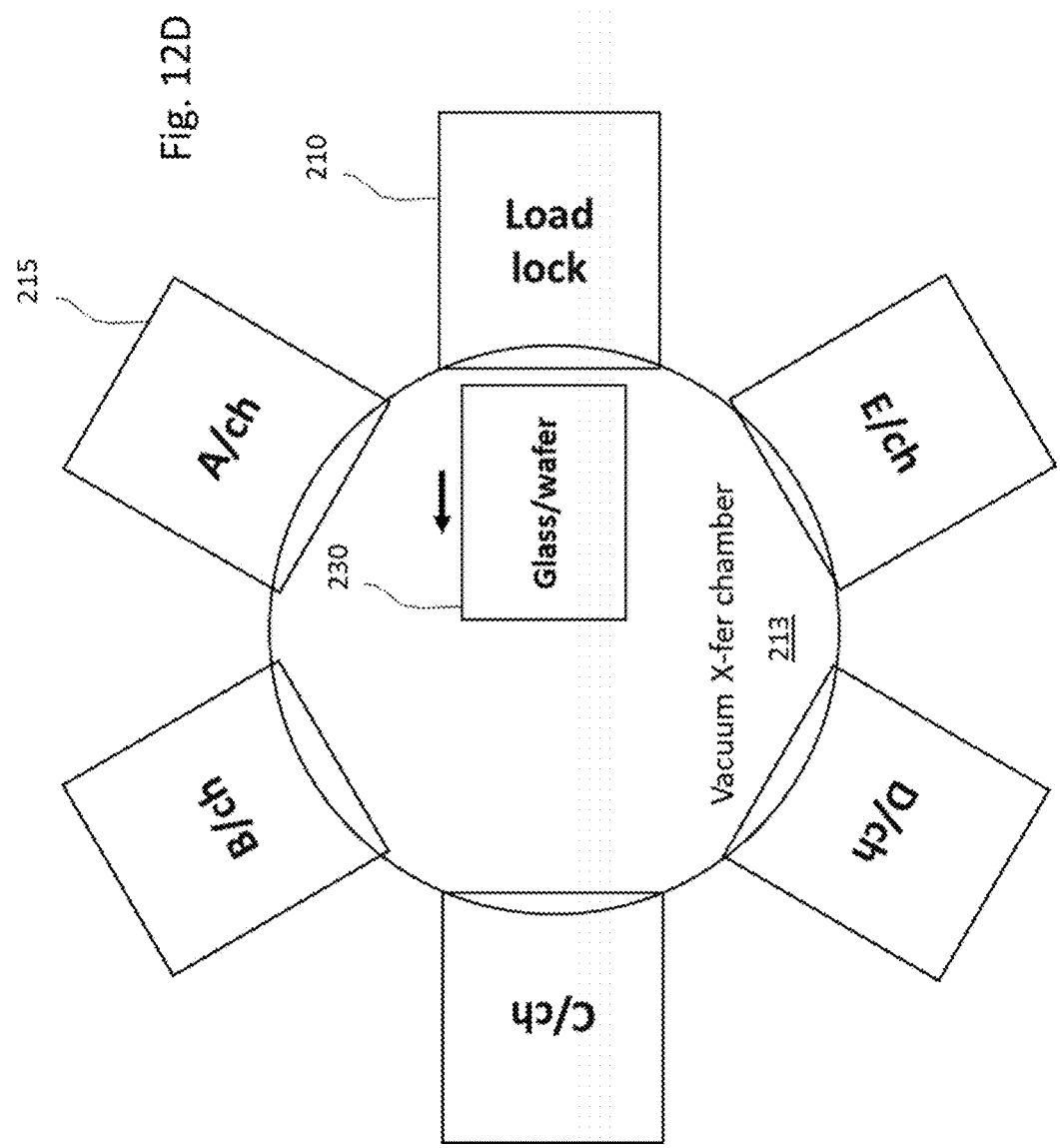

FIG. 11 is a flowchart of a film deposition process according to an embodiment, in which a glass substrate and a film deposited on the glass substrate are being inspected. FIG. 11 is merely an example film deposition process, and certain steps may be removed, other steps added, two or more steps combined or one step can be separated into multiple steps depending on the specification and requirements. At least part of steps can be performed or caused by a computing device such as the controller 110 of FIG. 1. For the purpose of the convenience, the description will be made based on the controller 110 performing at least some of the process of FIG. 11.

Referring to FIG. 11, in a film deposition process according to embodiments, a glass substrate is loaded or controlled to be loaded into a load lock (S1100). One or more cameras take or are controlled to take first pictures or images of the glass substrate that has been loaded to the load lock (S1102). The first pictures may be stored in the memory 115 or directly sent to the controller 110. The controller 110, in data communication with the cameras, can receive the first pictures from the cameras or retrieve the first pictures from the memory 115, and analyze the received or retrieved first pictures (S1104). After the first pictures are taken, the glass substrate is clamped or controlled to be clamped in the load lock (S1106). The cameras take or are controlled to take second pictures or images of the glass substrate that has been clamped in the load lock (S1108). The second pictures may be stored in a memory or directly sent to the controller 110. The controller 110 analyzes the second pictures that are received from the cameras or retrieved from the memory 115 (S1110). Subsequently, the glass substrate is transferred or controlled to be transferred from the load lock to a film deposit chamber (S1112), and a film is deposited or controlled to be deposited on the glass substrate to form a film-deposited glass substrate (S1114). The film-deposited glass substrate is transferred or controlled to be transferred from the deposit chamber back to the load lock (S1116). The cameras take or are controlled to take third pictures or images of the film-deposited glass substrate that has been transferred to the load lock (S1118). The controller 110 analyzes the third pictures that are received from the cameras or retrieved from the memory 115 (S1120). After the third pictures are taken, the film-deposited glass substrate is clamped or controlled to be clamped in the load lock (S1122). The cameras take or are controlled to take fourth pictures or images of the film-deposited glass substrate that has been clamped in the load lock (S1124). The controller 110 analyzes the fourth pictures that are received from the cameras or retrieved from the memory 115. Finally, the film-deposited glass substrate is unloaded or controlled to be unloaded from the load lock (S1128). In this disclosure, pictures, photos and images can be interchangeably used with each other. In processing and analyzing the pictures, photos and images, the controller 110 can use one or more of: an analog form of the captured images, a digital form of the captured images, or a combination thereof.

Although FIG. 11 describes that the cameras are controlled to take pictures of the glass substrate four times (i.e., first to fourth pictures), the present disclosure is not limited thereto. For example, the cameras may be controlled to take pictures of the glass substrate less than or more than four times. Furthermore, although FIG. 11 shows that the controller 110 analyzes each captured image right after the capturing, the present disclosure is not limited thereto. For example, the controller 110 may defer analyzing captured images until two or more pictures (e.g., second to fourth pictures) are taken. Moreover, although FIG. 11 describes a glass substrate, the present disclosure is not limited thereto, and other substrates such as semiconductor substrates can also be used.

Loading Glass Substrate (S1100)

FIGS. 12A-12L show how the glass substrate 230 is loaded to and unloaded from a load lock 210 and deposition chambers 210 in the film deposition process performed by a deposition apparatus 200 according to an embodiment. Referring to FIGS. 11 and 12A-12C, in embodiments, the glass substrate 230 is loaded into the load lock 210 by a loading-unloading robot or atmosphere (ATM) robot (e.g., the robot 225 in FIG. 2) from the outside of the deposition apparatus. Referring to FIGS. 13A-13D, the ATM robot introduces the glass substrate 230 from the outside to the inside of the load lock 210. FIGS. 13A-13G, 14 and 15A-15F show camera viewport windows 250 or cameras 220 positioned on exterior portions of the load lock 210. Although the camera viewport windows 250/cameras 220 are disposed on top exterior corner portions of the load lock 210, directly above the four corners of the substrate 230, the present disclosure is not limited thereto as described above.

Figure 13A:
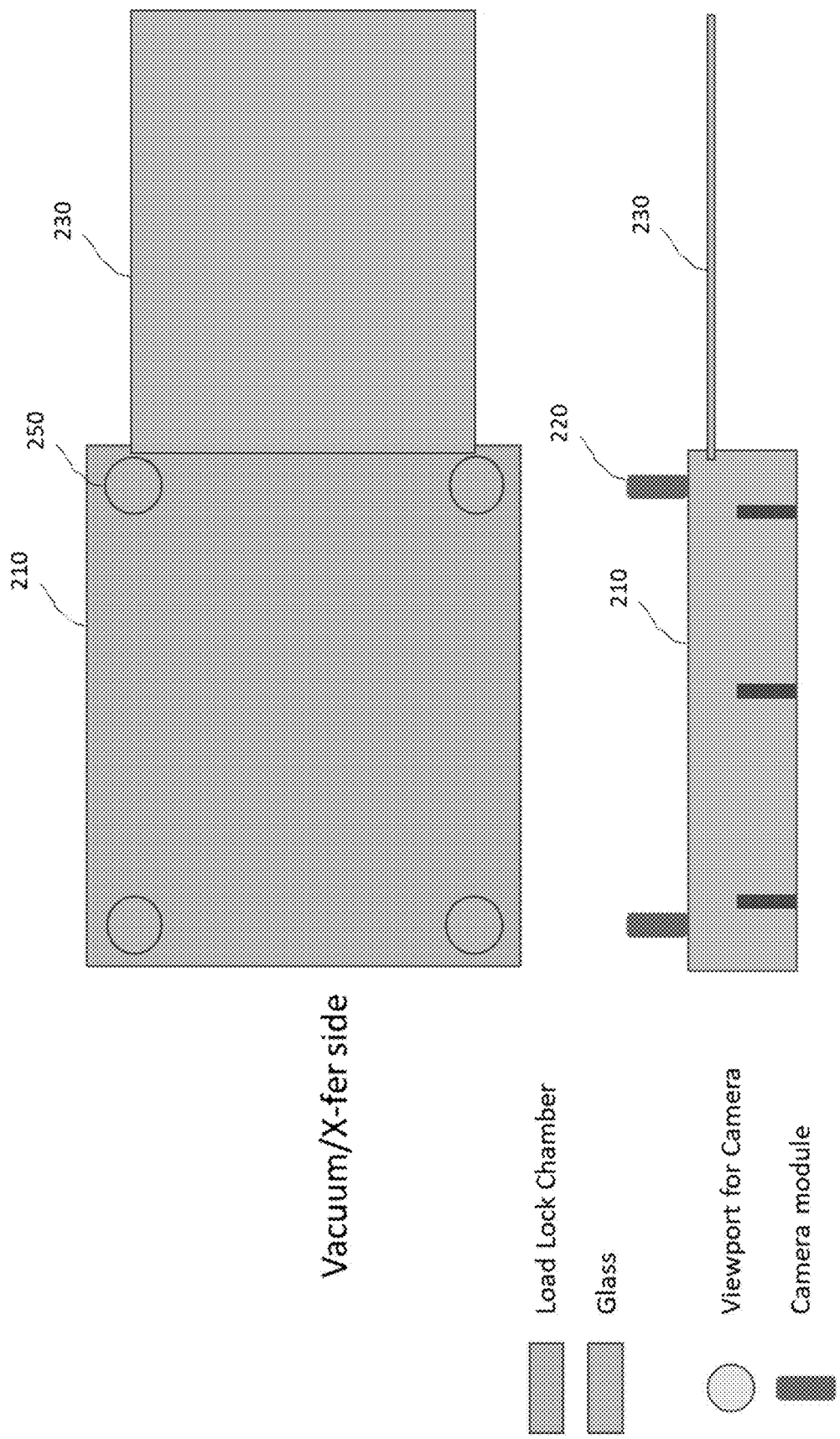
Figure 13B:
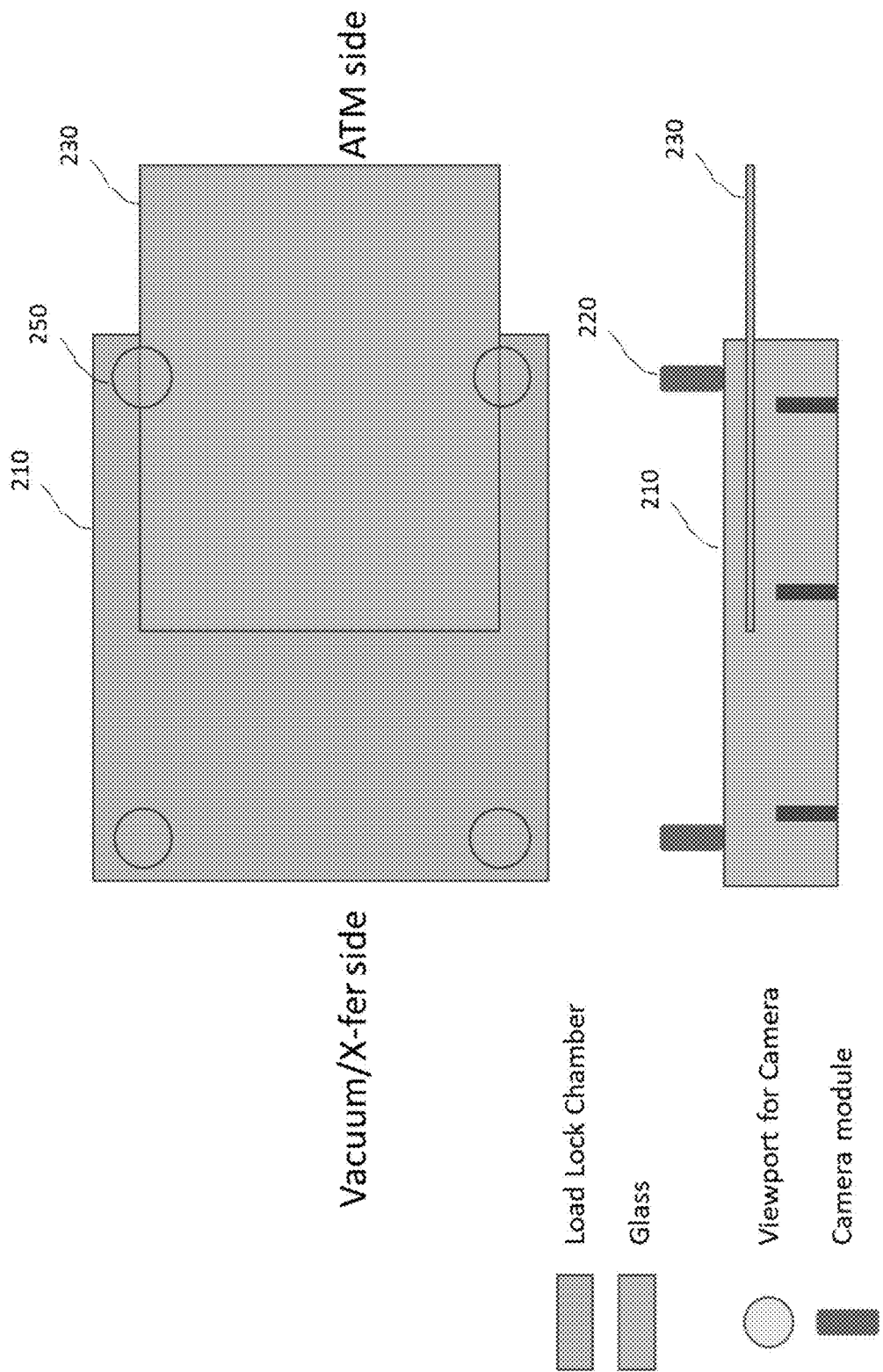
Figure 13C:
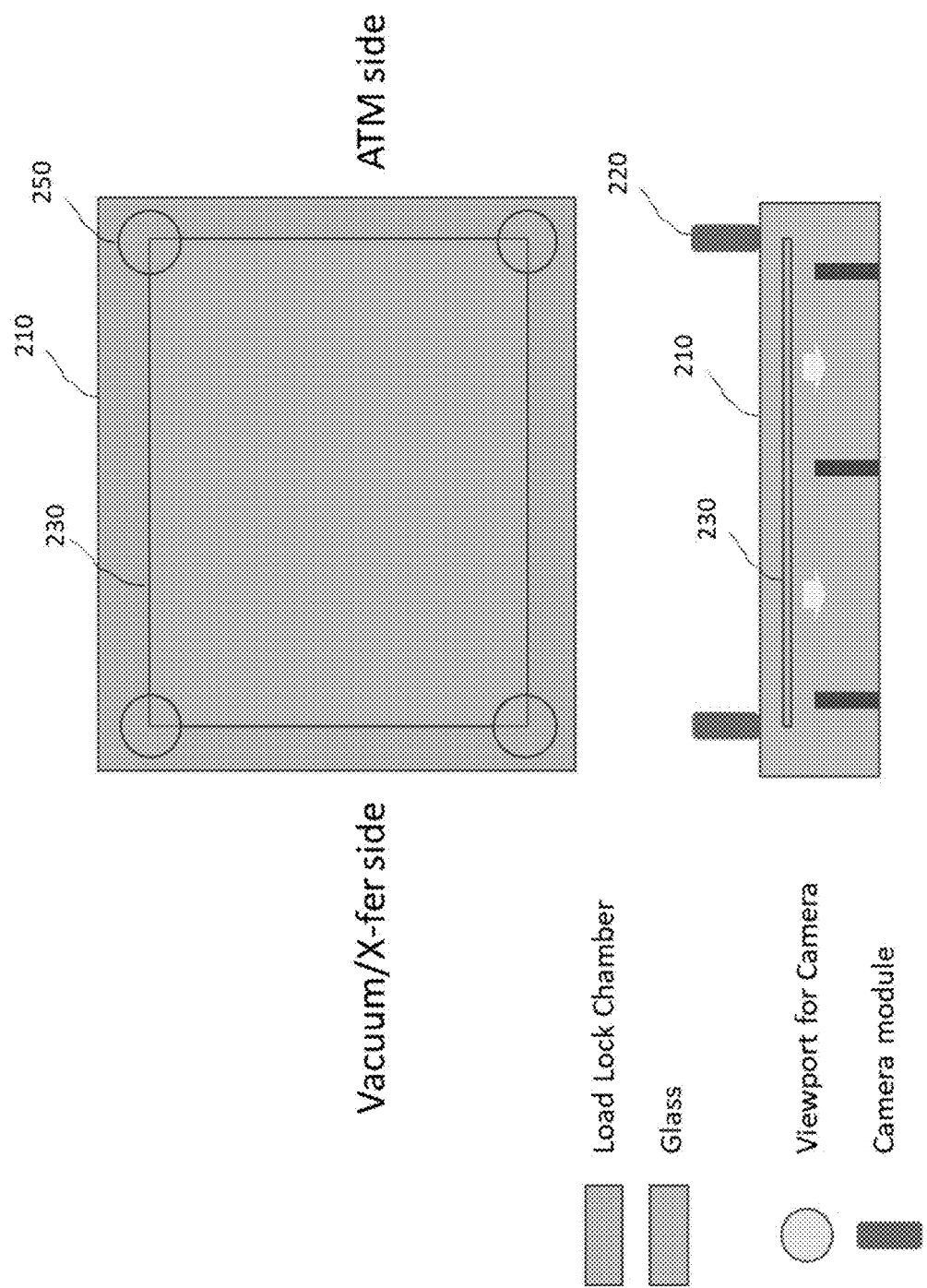
Figure 13F:
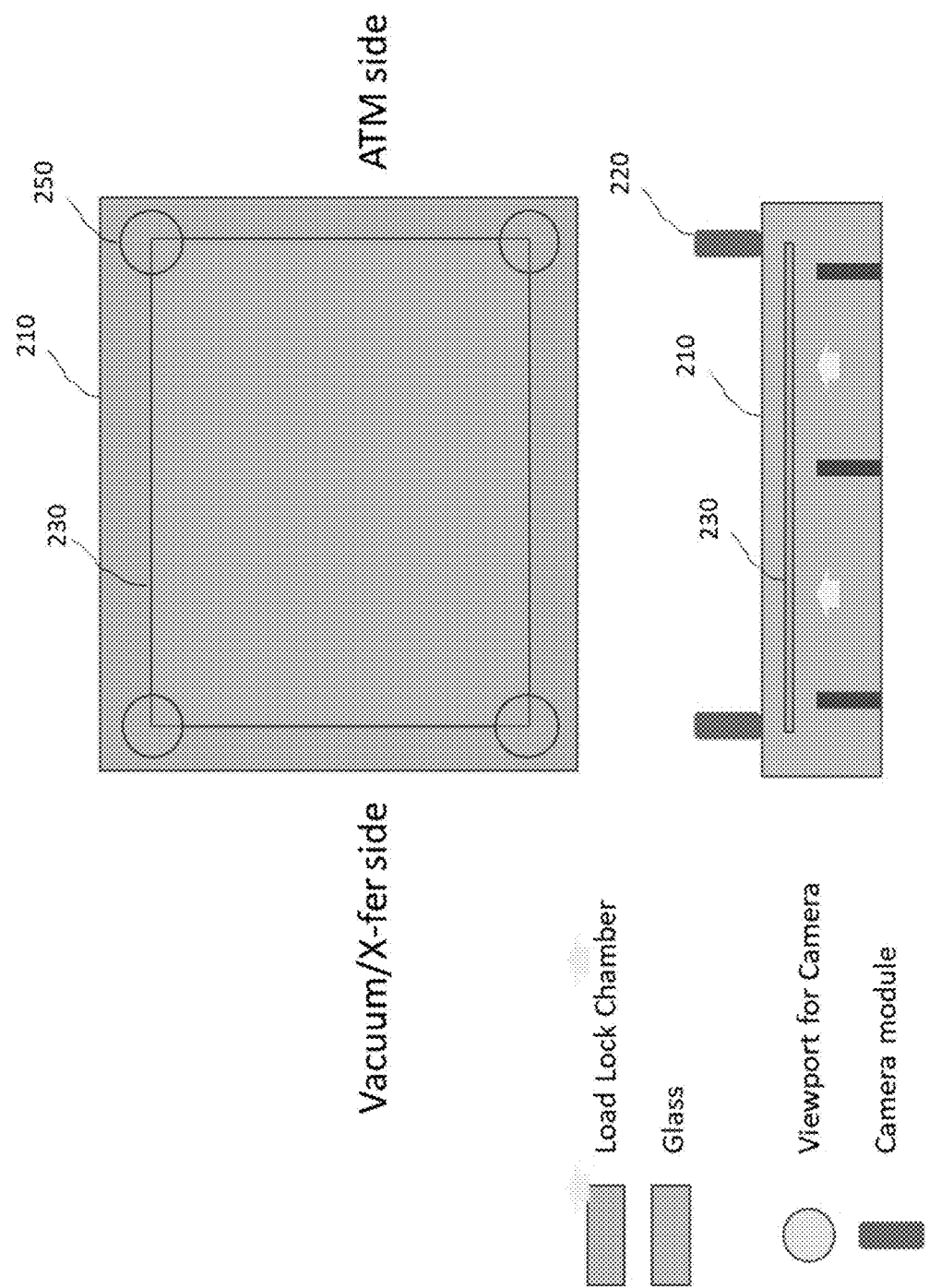

Upper diagrams of FIGS. 13A-13C show a substrate loading process viewed from the top of the load lock 210, and lower diagrams of FIGS. 13A-13C show the substrate loading process viewed from the side of the load lock 210. FIGS. 13A-13C respectively generally correspond to FIGS. 12A-12C (also viewed from the top of the load lock 210). FIGS. 12A and 13A show that the substrate 230 is ready to be introduced (or started being introduced) into the load lock 210. FIGS. 12B and 13B show that the substrate 230 is being introduced into the load lock 210. FIGS. 12C and 13C show that an entire portion of the substrate 230 has been introduced into the load lock 210.

After the glass substrate 230 is introduced to the inside of the load lock 210, the ATM robot moves the glass substrate 230 and places the glass substrate 230 on supports in the load lock 210. As described above, the controller 110 can control the ATM robot to load the substrate 230 into the load lock 210. FIGS. 13A-13G show an embodiment where no film is deposited on the glass substrate 230. FIG. 14 shows another embodiment where a glass substrate 235 with a film pre-deposited thereon is loaded, and an additional film may be deposited on the pre-deposited film later in the deposition chamber.

Taking First Pictures (S1102)

In some embodiments, as shown in FIG. 13D, after the glass substrate 230 is introduced into the load lock 210, the cameras 220 attached to an exterior portion of the load lock 210 can take first pictures of one or more of four corners of the glass substrate 230. In some embodiments, the controller 110 can detect a timing when the substrate 230 has been introduced into the load lock 210 and is ready for taking pictures. In these embodiments, upon detecting the timing, the controller 110 can automatically control the cameras 220 to take pictures of portions of the substrate 230. The cameras 220 may include a sensor (e.g., proximity sensor) that can detect whether the substrate has been placed on the supports of the load lock 230 so that the cameras 220 can take pictures of the substrate 230 in response to the sensor detecting that the substrate has been placed on the supports of the load lock 230. In other embodiments, a user or an operator may manually operate the cameras 220 to take pictures of the sub state 230 after the substrate 230 has been introduced into the load lock 210.

In some embodiments, the cameras 220 may take a picture of all of the four corners of the glass substrate 230. In other embodiments, the cameras 220 may take a picture of only one, only two, or only three of the four corners of the glass substrate 230. In these embodiments, the cameras 220 may also capture one, two, or three of the four corners of the glass substrate 230. The cameras 220 may also capture one, two, three, or all of four sides of the substrate 230 between the four corners. The cameras 220 may also capture at least one of the sides of the glass substrate 230 and capture a non-corner or a non-side portion (e.g., a middle portion of the substrate 230). In some embodiments, the controller 110 may control or cause the cameras 220 to send the captured first images to the controller 110. In other embodiments, the controller 110 may control or cause the captured first images to be stored in the memory 115. In some embodiments, the controller 110 may immediately or automatically analyze the first captured images upon receiving them from the cameras 220. In other embodiments, the controller 110 may cause the first images to be stored in the memory 115, and retrieve and analyze them later, e.g., after capturing second, third, and/or fourth images. In these embodiments, the controller 110 may analyze the first images with some or all of the second, third, or fourth images.

Camera and Viewport Windows

Figure 29:
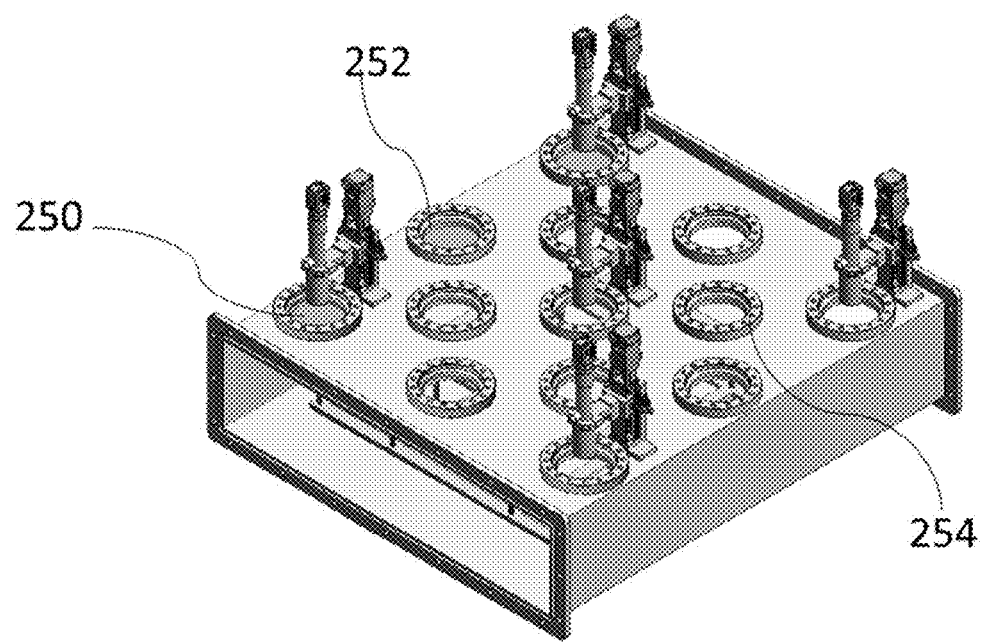
FIG. 29 is a perspective view of a load lock chamber with camera windows and cameras attached to the load lock according to an embodiment.
Figure 30:
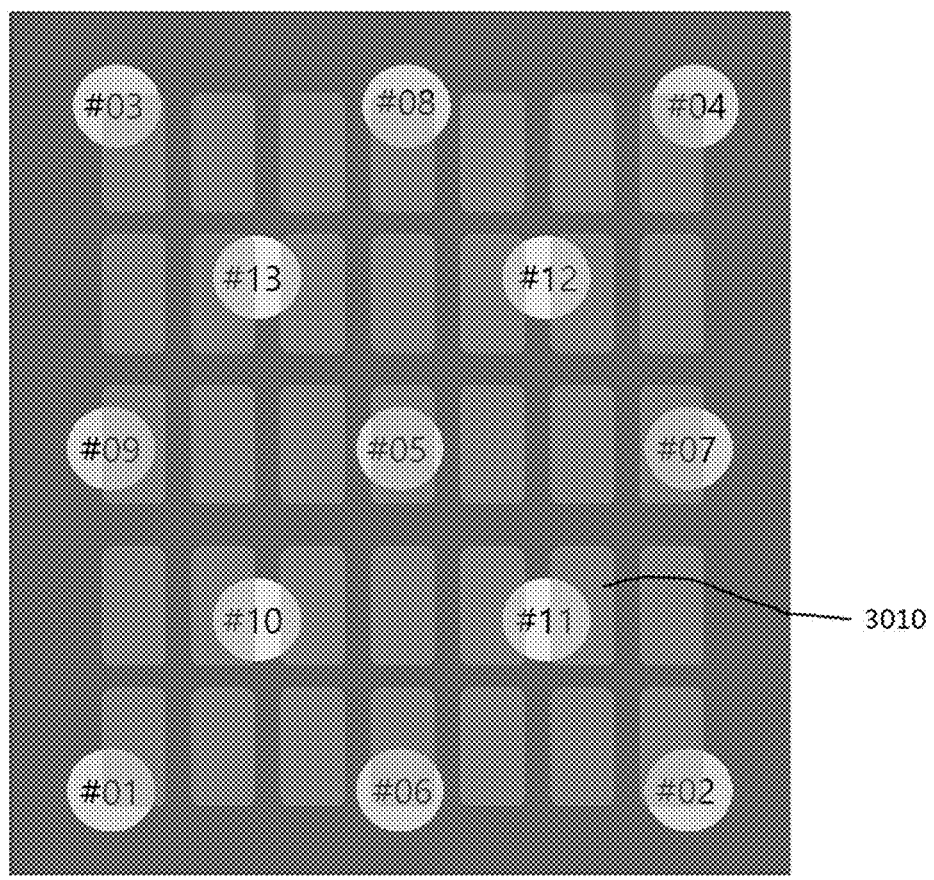
FIG. 30 is a top plan view of the load lock shown in FIG. 29.

For taking pictures of the substrate 230, the cameras 220 can be provided on an exterior portion of the load lock 210. In some embodiments, shown in FIGS. 13A-15F, the load lock 210 includes a top exterior wall with one or more viewport windows 250, in which each camera is installed to capture a portion of the substrate 230, that has been introduced into the load lock 210, through the corresponding viewport window 250. In one embodiment, the viewport windows 250 are placed at four corner locations in the top exterior wall of the load lock 210. In another embodiment, the load lock includes additional viewport windows as shown in FIGS. 29 and 30. In the embodiment illustrated in FIG. 29, the top wall of the load lock includes one or more side view port windows 252 and one or more middle (or non-corner/non-side) viewport windows 254, in addition to the corner viewport windows 250. The number, position, and arrangement of the viewport windows shown in FIGS. 13A-15F, 29, and 30 are merely examples, and the present disclosure is not limited thereto. For example, more than or less than the number of the viewport windows shown in FIGS. 29 and 30 can be provided. Furthermore, other positions and arrangements of the viewport windows are also possible, as long as they can capture portions of the substrate 230 in the load lock 210. In the embodiment shown in FIGS. 29 and 30, the cameras are installed over some or all of the viewport windows #01-#13 below which a plurality of films 3010 can be formed and arranged on the glass substrate. Although FIGS. 13A-15F, 29, and 30 show that the viewport windows have the same size, the present disclosure is not limited thereto. For example, at least one of the viewport windows may have a size different from those of the other viewport windows. In these embodiments, at least one of the camera modules 220 may have a different size corresponding to the viewport window having a different size. However, for the purpose of convenience, the description will be largely made based on the viewport windows positioned directly above four corners the substrate 230 that is introduced into the load lock 210.

In some embodiments, the first, the second, third and fourth pictures may be taken by the same set of cameras 220. In other embodiments, at least two of the first, the second, third or fourth pictures may be taken by different cameras 220.

Analyzing First Pictures (S1104)

The controller 110 can receive the first pictures from the cameras 220 or retrieve the first pictures from the memory 115 to analyze the first pictures. In some embodiments, as shown in FIG. 13D, the glass substrate 230 may be placed at a location 275 that is shifted from a reference location 265 (see dotted lines in FIG. 13D). If an amount of the shift is greater than a shifting threshold, the glass substrate 230 may be damaged during the clamping process. The controller 110 can analyze the shifted amount and determine whether it is greater than the shifting threshold. The controller 110 can be configured to set different shifting thresholds depending on the embodiment or application. The various shifting thresholds can be stored in the memory 115. The controller 110 can analyze the first pictures to determine whether a loading error has occurred. In one embodiment, the controller 110 can analyze four first pictures taken in all the four corners. In another embodiment, the controller 110 can analyze only one, only two, or only three of the four first pictures to determine the loading error. In other embodiments, the controller 110 can control the cameras 220 to take more than four first pictures, for example, one or more pictures taken in one or more corners of the substrate 230, one or more pictures taken in one or more sides of the substrate 230, and/or one or more pictures taken in middle portions of the substrate 230. In these embodiments, the controller 110 can analyze some or all of the first pictures to determine the loading error. As described above, the controller 110 can analyze the first pictures before or after the cameras 220 take second, third or fourth pictures.

Figure 19:
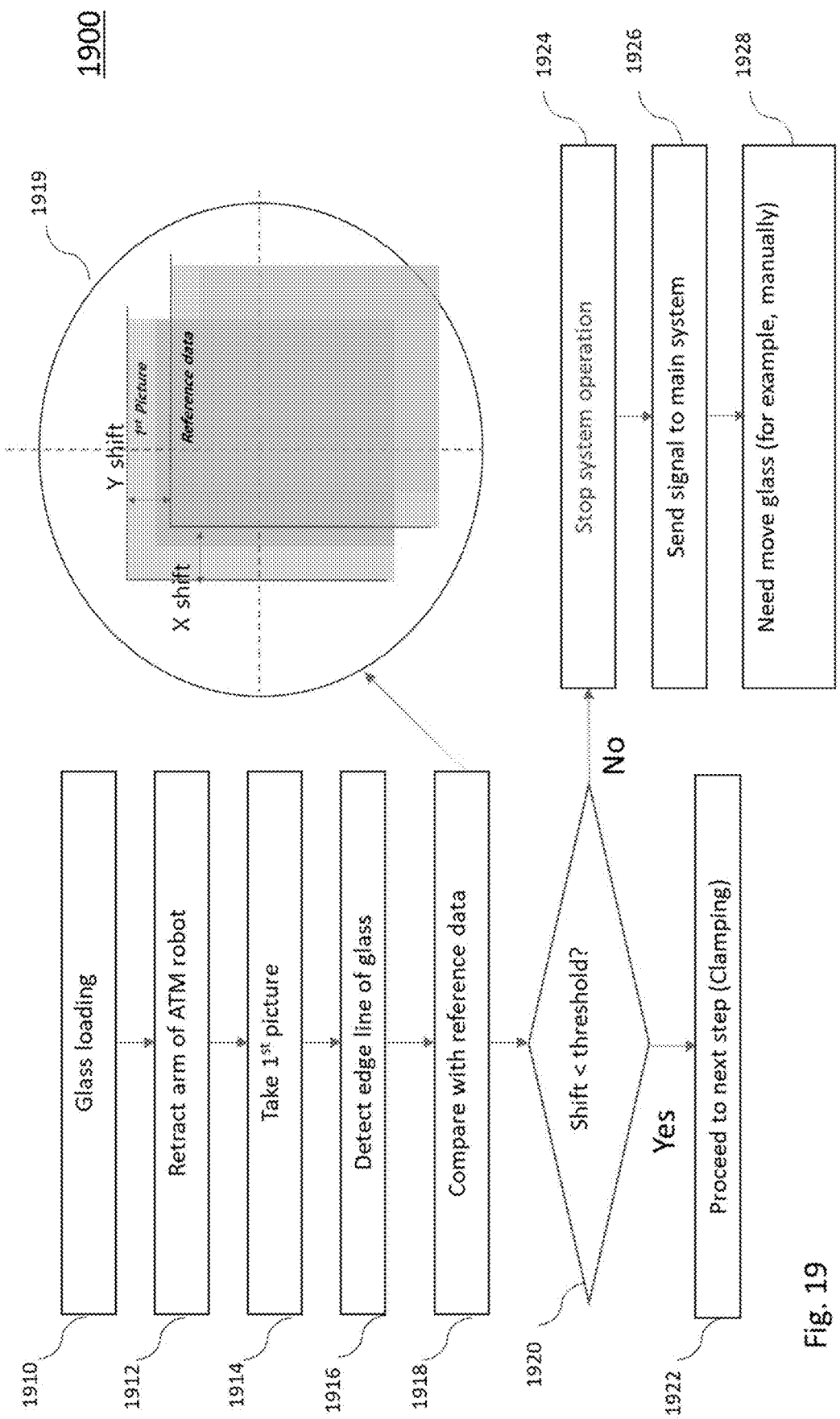
FIG. 19 shows a flowchart of a process of determining loading errors of a glass substrate according to an embodiment.

FIG. 19 shows a flowchart of a process 1900 of determining loading errors of a glass substrate according to an embodiment. FIG. 19 is merely an example loading error determining process, and certain steps may be removed, other steps added, two or more steps combined or one step can be separated into multiple steps depending on the specification and requirements. At least part of steps can be performed or caused by a computing device such as the controller 110 of FIG. 1. For the purpose of the convenience, the description will be made based on the controller 110 performing at least some of the process 1900 of FIG. 19.

The process of determining loading errors will be described by referring to FIG. 13D and FIG. 19. After the glass substrate 230 is loaded on the supports of the load lock 210 (step 1910), the ATM robot is retracted (step 1912), and the first pictures are taken (step 1914). The controller 110 can process and analyze the first pictures to detect edges of the glass substrate (step 1916). The controller 110 can compare the detected edges with the reference location data (step 1918). Based on the comparison, the controller 110 can determine whether the position of the substrate 230 is shifted from a reference position. The reference position data can be stored in the controller 110 or memory 115. The controller 110 can determine an amount or a degree of the shift. For example, referring to a magnified view (1919), the shift can include an X-shift (i.e., a shift in the X-direction), and/or a Y-shift (i.e., a shift in the Y-direction). Although the magnified view (1919) of FIG. 19 shows that the substrate 230 is shifted in both the X-direction and Y-direction, the present disclosure is not limited thereto. For example, the substrate 230 may be shifted only in one of the X-direction or Y-direction.

The controller 110 can determine whether the shift amount is greater than a threshold (step 1920). If it is determined in step 1920 that the shift amount is less than the threshold, the controller 110 can control the system to proceed to the next step (i.e., clamping) (step 1922). If it is determined in step 1920 that the shift amount is not less than the threshold, the controller 110 can stop the system operation to avoid a risk of damaging the glass substrate 230 while it is being clamped (step 1924). In some embodiments, if each of the X-shift and Y-shift is smaller than a threshold, the glass substrate 230 is clamped or controlled to be clamped. If one of the X-shift and Y-shift is greater than the threshold, the controller 110 can stop the system operation. The controller 110 can control the display 130 to display analysis results and shifted amounts, etc. After the system operation is stopped, the controller 110 can send a signal to a main system 160 (see FIG. 1) indicating that the system operation has been stopped due to an unacceptable loading error (step 1926). In some embodiments, the glass substrate 230 may be manually moved to the reference location (step 1928). In another embodiment, the glass substrate 230 is moved by a device, e.g., the ATM robot or a mechanism provided in the load lock 210.

Controller

In some embodiments, the controller 110 may be implemented with a computer system, for example, a hardware, a software, a hardware combined with a software, a firmware, or a hardware or software combined with a firmware. The controller 110 can be configured with a server computer or a cloud computer in wireless data communication with other system components. The controller 110 can include a memory that stores programs for performing various analysis processes that are discussed in this disclosure. In another embodiment, the controller is combined with the main system or main controller 160 (see FIG. 1) that controls the operation of the whole deposition system.

Edge Line Detection of Glass Substrate

Figure 20:
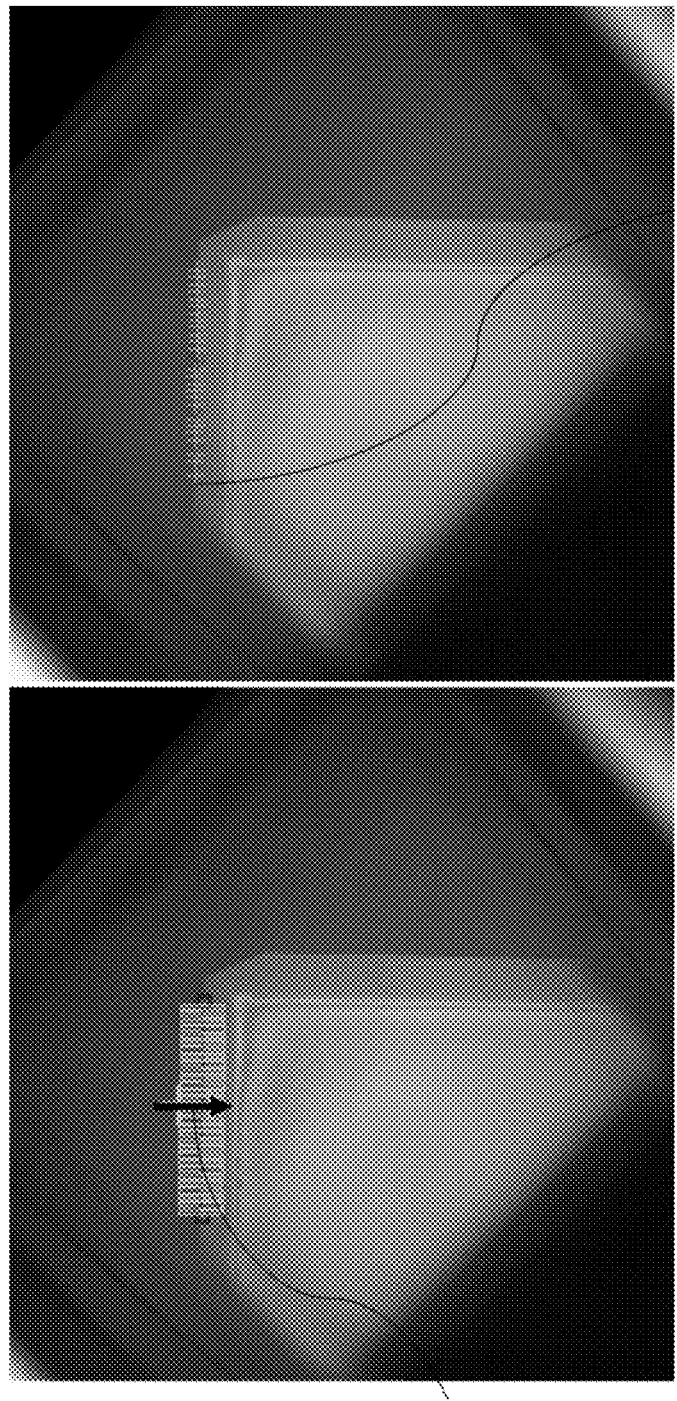
FIGS. 20A and 20B show a method of detecting an edge line of a glass substrate according to an embodiment.

The controller 110 can detect an edge line of the glass substrate 230 that has been introduced into the load lock 210. The detected edge line can be used for various operations including detecting a loading error, a clamping error (to be described with reference to FIG. 21), a reloading error (to be described with reference to FIG. 22), etc. For example, referring to FIGS. 20A and 20B, pixels of captured images are scanned to determine a change in contrast values of the pixels. The controller 110 can check the contrast values of the pixels in the direction of an arrow 2010 (see FIG. 20A) to determine changes in the contrast value. The controller 110 can count the pixels having the contrast value changes greater than a threshold value (for example, about 60%). The counted pixels can be lined up as displayed in green color (as horizontal and vertical lines) in the display as shown in FIG. 20B. The positions of the counted pixels can be further detected and connected to form an edge line of the glass substrate as displayed in green color (as a horizontal line 2020) in the display 130 as shown in FIG. 20B. The above edge line detection method is merely an example, and the present disclosure is not limited to the embodiment discussed above. Any other edge detection method for identifying an edge line of the glass substrate from the first pictures, second pictures, third pictures or fourth pictures can be used. For example, the brightness of the pixels, instead of the contrast values of the pixels, can be used to detect an edge line of the glass substrate.

Clamping Glass Substrate and Taking Second Pictures (S1106/S1108)

As described with respect to FIG. 19, when a loading error is not detected or negligible (e.g., shift is less than a threshold), the system operation can go to the next step once the substrate has been loaded into the load lock 210. For example, as shown in FIGS. 11, 12C, and 13E, the glass substrate 230 can be clamped in the load lock 210. Once the glass substrate 230 is properly clamped in the load lock 210, the controller 110 can control the cameras 220 to take second pictures of one or more of the four corners of the glass substrate 230.

Analyzing Second Pictures (S1110)

The controller 110 can receive the second pictures from the cameras 220 or retrieve the second pictures from the memory 115 to analyze the second pictures. As described above, the second pictures are taken after the substrate 230 is clamped. Similarly to detection of a possible loading error by analyzing the first pictures, the controller 110 can analyze the second pictures whether there is a clamping error in the clamped substrate 230. For example, when the glass substrate 230 is positioned in a location shifted more than a threshold in a clamped state, there are risks for the glass substrate 230 to be damaged by a transfer (X-fer) robot during transferring to the deposition chamber 215 or by components in the deposition chamber. When the glass substrate 230 is broken, the deposition system should be stopped for cleaning debris from a broken glass substrate.

Figure 21:
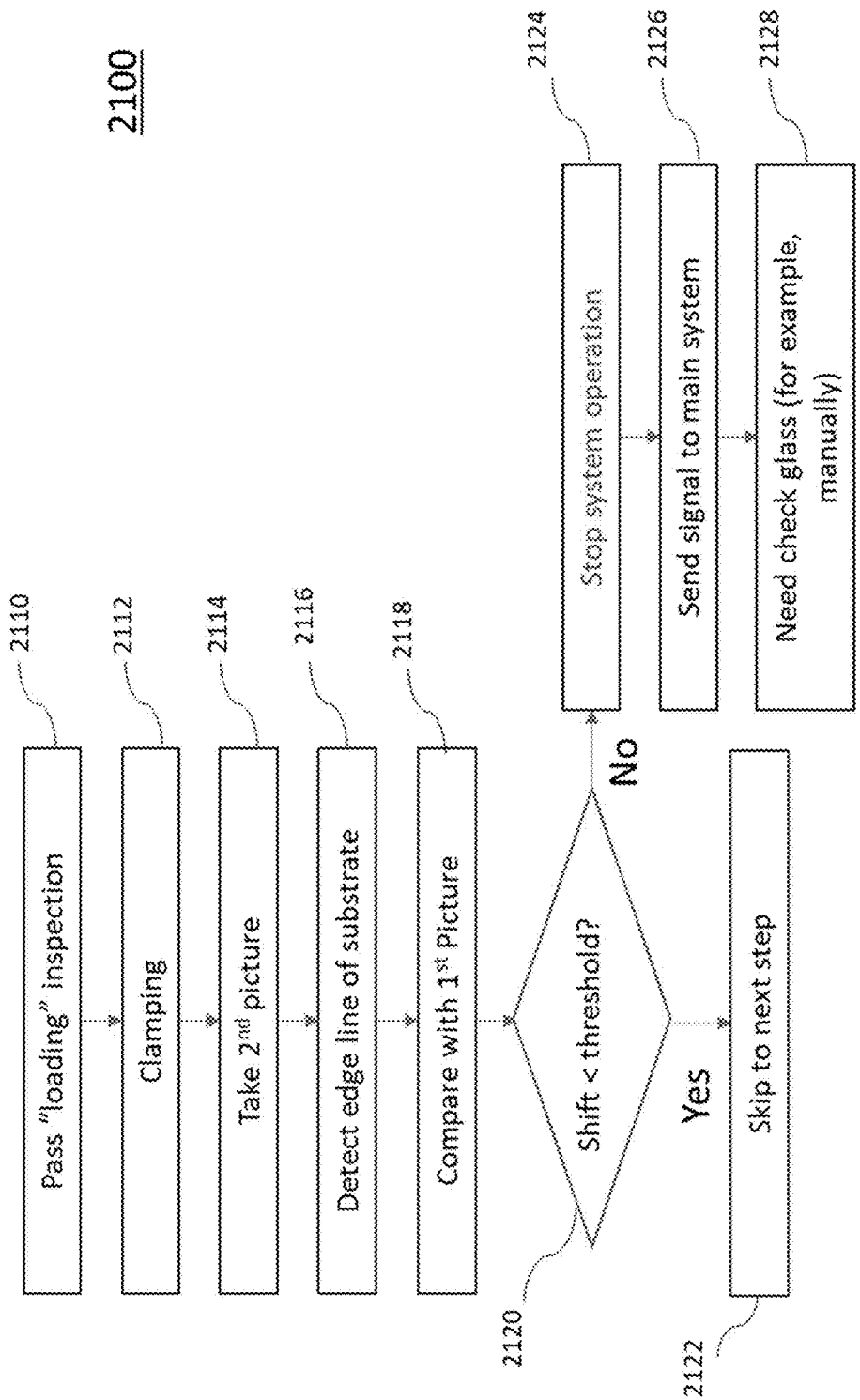
FIG. 21 shows a flowchart of a process of determining clamping errors of a glass substrate according to an embodiment.

FIG. 21 shows a flowchart of a process 2100 of determining clamping errors of a glass substrate according to an embodiment. FIG. 21 is merely an example clamping error determining process, and certain steps may be removed, other steps added, two or more steps combined or one step can be separated into multiple steps depending on the specification and requirements. At least part of steps can be performed or caused by a computing device such as the controller 110 of FIG. 1. For the purpose of the convenience, the description will be made based on the controller 110 performing at least some of the process 2100 of FIG. 21.

Referring to FIG. 21, after the loading error inspection is successful (step 2110) and the substrate 230 is claimed (step 2112), the controller 110 can control the cameras 220 to take second pictures of the substrate 230 (step 2114). The controller 110 can process and analyze the second pictures to detect edge lines of the glass substrate (step 2116). The controller 110 can use the edge line detection method described with respect to FIGS. 20A and 20B, however, the present disclosure is not limited thereto.

The controller 110 can compare the detected edges with the edge line detected in the first pictures (step 2118). Based on the comparison, the controller 110 can determine whether the position of the clamped substrate 230 is shifted from a reference position. The reference position data can be stored in the controller 110 or memory 115. The controller 110 can determine an amount or a degree of the shift. The controller 110 can determine whether the shift amount is less than a threshold (step 2120). If it is determined in step 2120 that the shift amount is not less than the threshold, the controller 110 can control the system to proceed to the next step (step 2122). For example, if the shifts between edge lines of the first and second pictures are smaller than the threshold, the glass substrate 230 can be transferred as discussed below. In another embodiment, the shifts can be obtained by comparing the edge lines of the second pictures and the reference location data.

If it is determined in step 2120 that the shift amount is not less than the threshold (e.g., at least one of the shifts between edge lines of the first and second pictures are greater than the threshold), the controller 110 can stop the system operation to avoid a risk of damaging the glass substrate 230 while it is being transferred or placed in the deposition chamber (step 2124). The controller 110 can control the display 130 to display analysis results and shifted amounts, etc. After the system operation is stopped, the controller 110 can send a signal to a main system 160 (see FIG. 1) indicating that the system operation has been stopped due to an unacceptable clamping error (step 2126). After the system operation is stopped, the glass substrate 230 may be manually checked (step 2128) or moved to the reference location.

Transferring Glass Substrate to Deposition Chamber (S1112)

After the second photos are taken and analyzed, the glass substrate 230 can be moved upward and then moved out of the transfer robot from the load lock 210. For example, as shown in FIGS. 11, 12C-12G, and 13F-13G, a transfer robot in the transfer chamber 213 can transfer the glass substrate 230 to the deposition chamber 215. After pulling out of the load lock 210, the transfer robot can transfer the glass substrate 230 to one of the deposition chambers 215 connected to the transfer robot. Once the glass substrate 230 is retrieved from one deposition chamber, the transfer robot can transfer the glass substrate 230 to a next deposition chamber 215. Depending on the embodiment, the glass substrate 230 can be transferred to only one of the deposition chambers 215, or two or more of the deposition chambers 215.

Forming Film on Glass Substrate (S1114)

Figure 16:
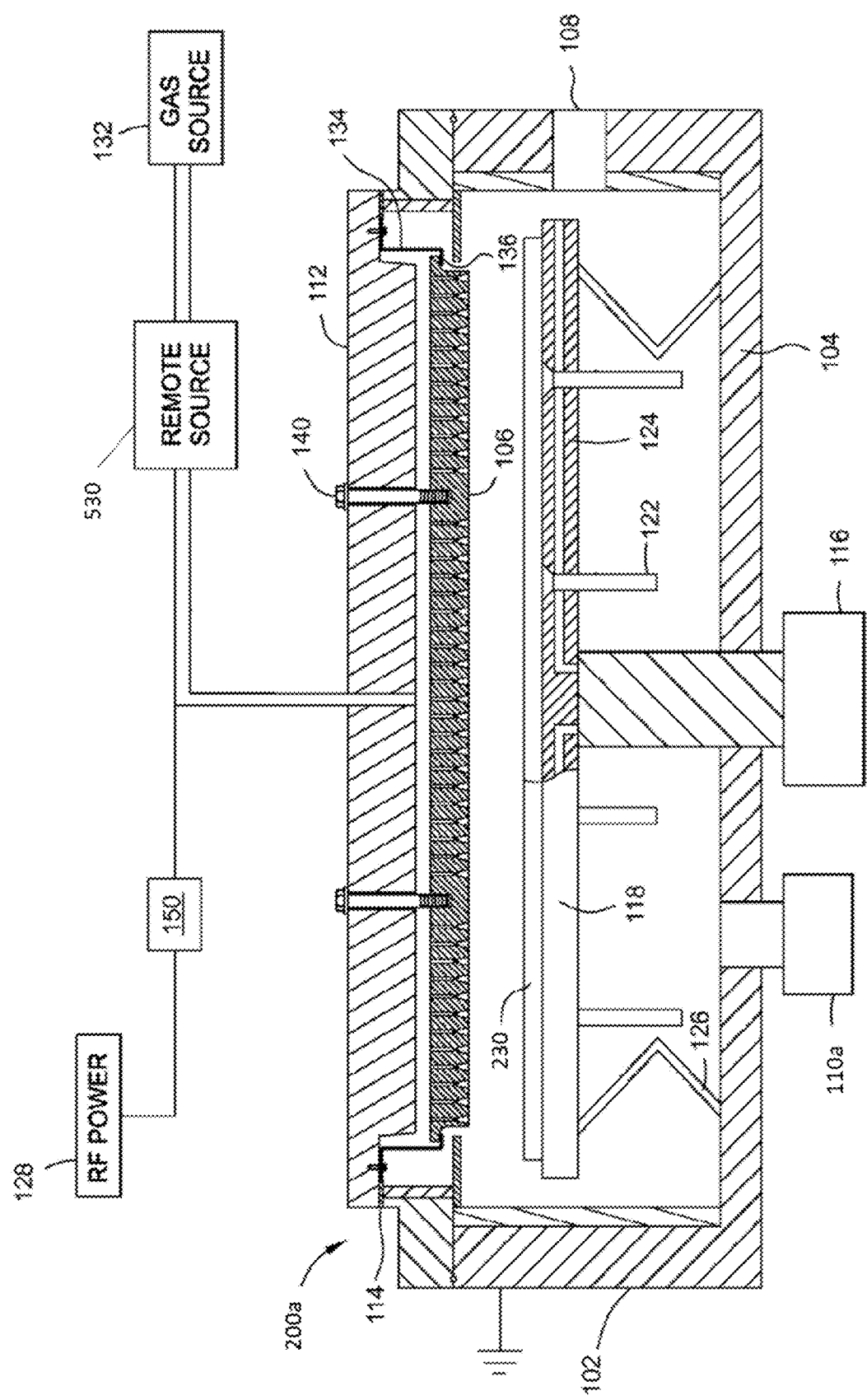
FIG. 16 shows a sectional view of a deposition chamber according to an embodiment.

In some embodiments, as shown in FIGS. 11, 12G and 16, once the glass substrate 230 is inserted into the deposition chamber 215, a film can be deposited on the glass substrate 230. In an embodiment, a glass substrate may include a substrate 235 on which a film was previously deposited as shown in FIG. 14, and an additional film may be deposited on the previously deposited film of the substrate 235 in the deposition chamber 215.

Deposition Chamber

FIG. 16 is a schematic, cross sectional view of a process chamber or deposition chamber that may be used to perform the operations in embodiments. In the deposition chamber 200a according to embodiments, one or more films may be deposited onto a substrate 230. The chamber 200a generally includes walls 102, a bottom 104 and a showerhead 106 which define a process volume. A substrate support 118 is disposed within the process volume. The process volume is accessed through a slit valve opening 108 such that the substrate 230 may be transferred in and out of the chamber 200a. The substrate support 118 may be coupled to an actuator 116 to raise and lower the substrate support 118.

Lift pins 122 are moveably disposed through the substrate support 118 to move a substrate to and from the substrate receiving surface. The substrate support 118 may also include heating and/or cooling elements 124 to maintain the substrate support 118 at a desired temperature. The substrate support 118 also includes RF return straps or ground straps 126 to provide an RF return path. In one embodiment, the showerhead 106 may be coupled to the backing plate 112 by one or more fastening mechanisms 140 to help prevent sag and/or control the straightness/curvature of the showerhead 106.

In some embodiments, a gas source 132 may be coupled to the backing plate 112 to provide process gases through gas passages in the showerhead 106 to a processing area between the showerhead 106 and the substrate 230. The gas source 132 may include a silicon-containing gas supply source, an oxygen containing gas supply source, and/or a carbon-containing gas supply source, among others. Typical process gases useable with one or more embodiments include silane (SiH4), disilane, N2O, ammonia (NH3), H2, N2 or combinations thereof. However, the present disclosure is not limited thereto.

In some embodiments, a vacuum pump 110a is coupled to the chamber 200a to control the process volume at a desired pressure. An RF power source 128 can be coupled through a match network 150 to the backing plate 112 and/or to the showerhead 106 to provide an RF current to the showerhead 106. The RF current creates an electric field between the showerhead 106 and the substrate support 118 so that a plasma may be generated from the gases between the showerhead 106 and the substrate support 118.

A remote plasma source 530, such as an inductively coupled remote plasma source 530, may also be coupled between the gas source 132 and the backing plate 112. Between processing substrates, a cleaning gas may be provided to the remote plasma source 530 so that a remote plasma is generated. The radicals from the remote plasma may be provided to the chamber 200a to clean chamber 200 components. The cleaning gas may be further excited by the RF source 128 provided to the showerhead 106.

The showerhead 106 may additionally be coupled to the backing plate 112 by showerhead suspension 134. In one embodiment, the showerhead suspension 134 is a flexible metal skirt. The showerhead suspension 134 may have a lip 136 upon which the showerhead 106 may rest. The backing plate 112 may rest on an upper surface of a ledge 114 coupled with the chamber walls 102 to seal the chamber 200a.

Figure 17A:
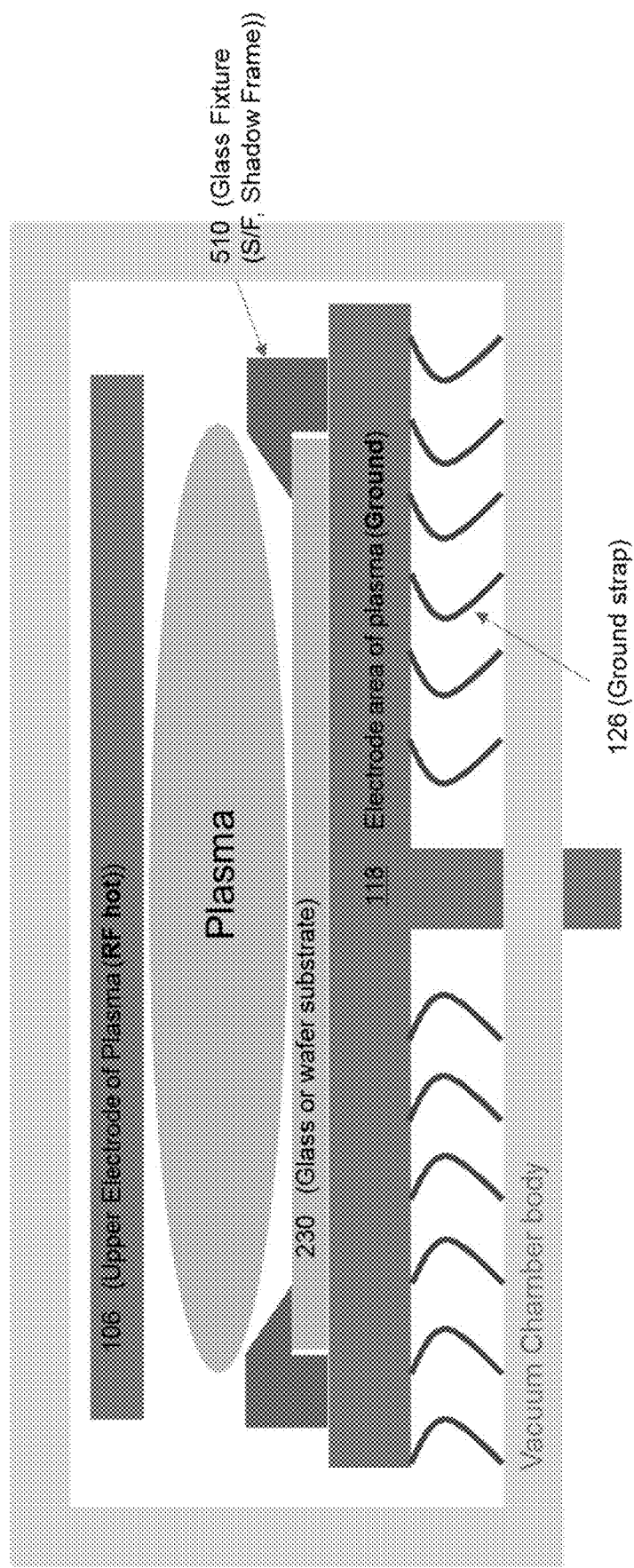
FIGS. 17A and 17B show a sectional view of a deposition chamber including a glass fixture according to another embodiment.
Figure 17B:
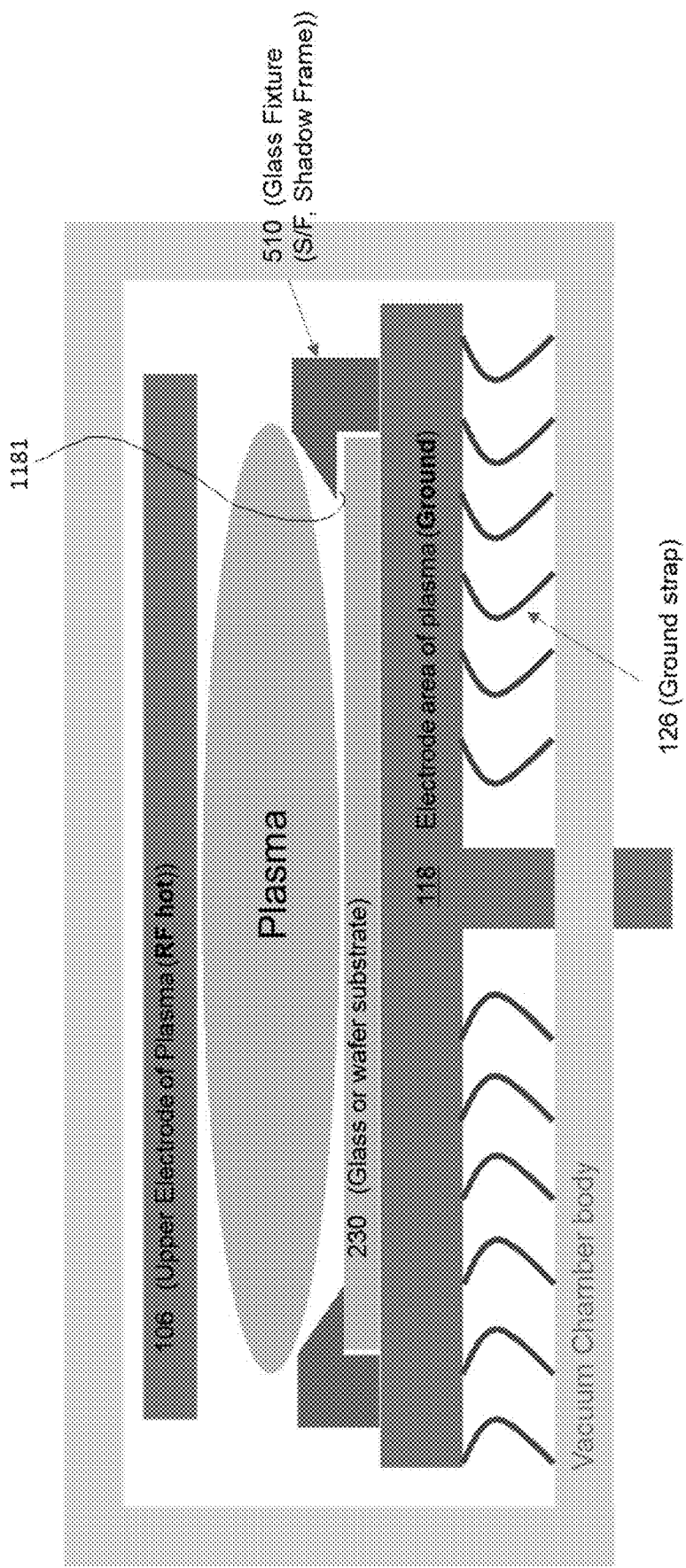
Figure 17C:
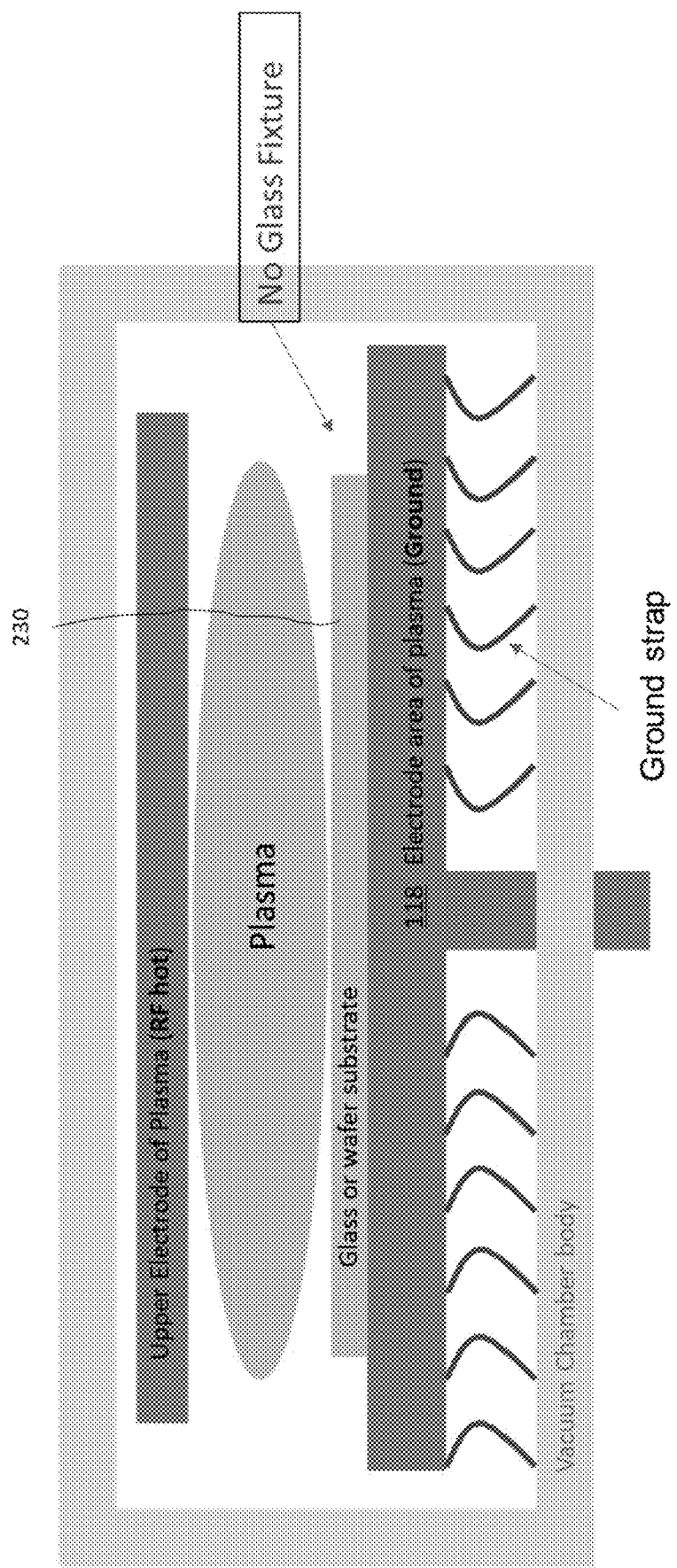
FIGS. 17C and 17D shows a sectional view of a deposition chamber not including a glass fixture according to still another embodiment.
Figure 17D:
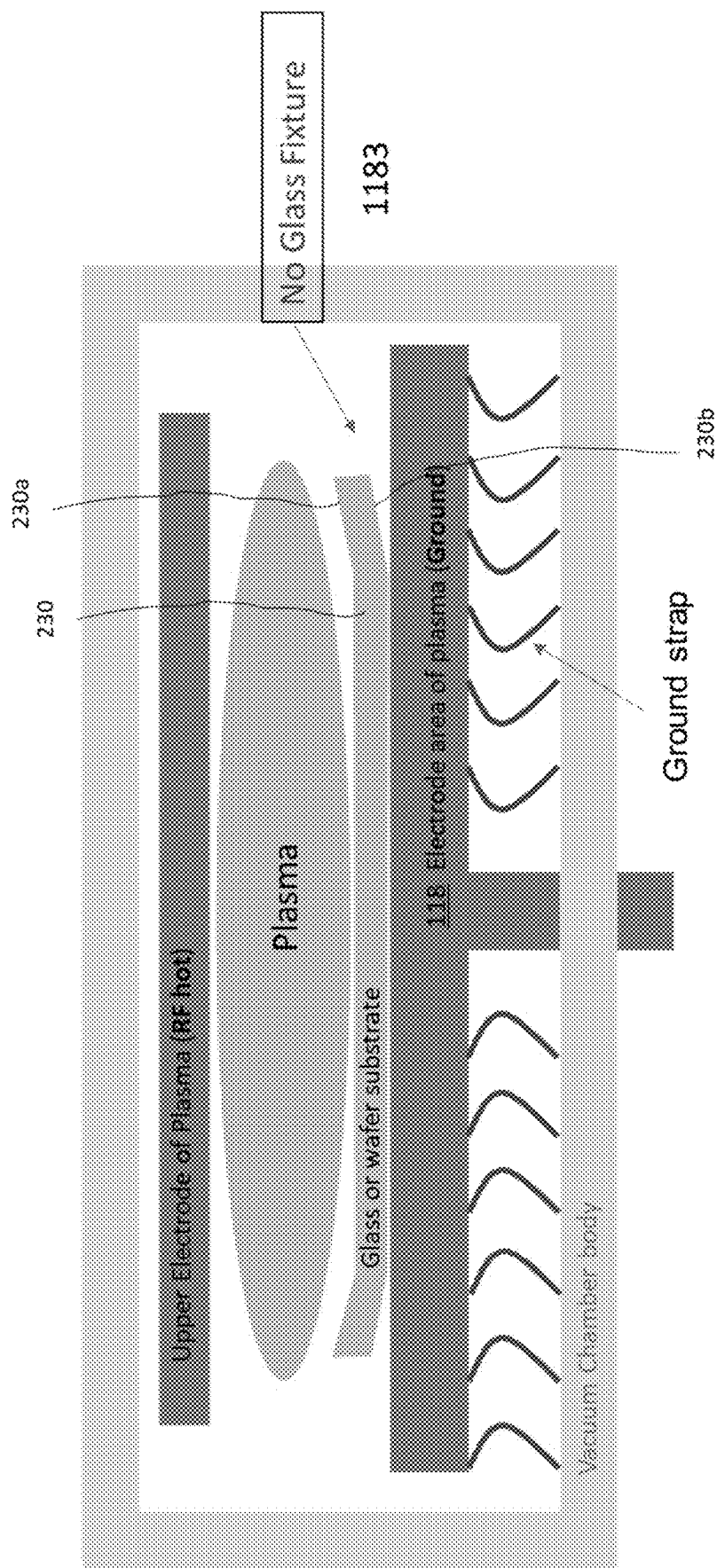
Figure 18:
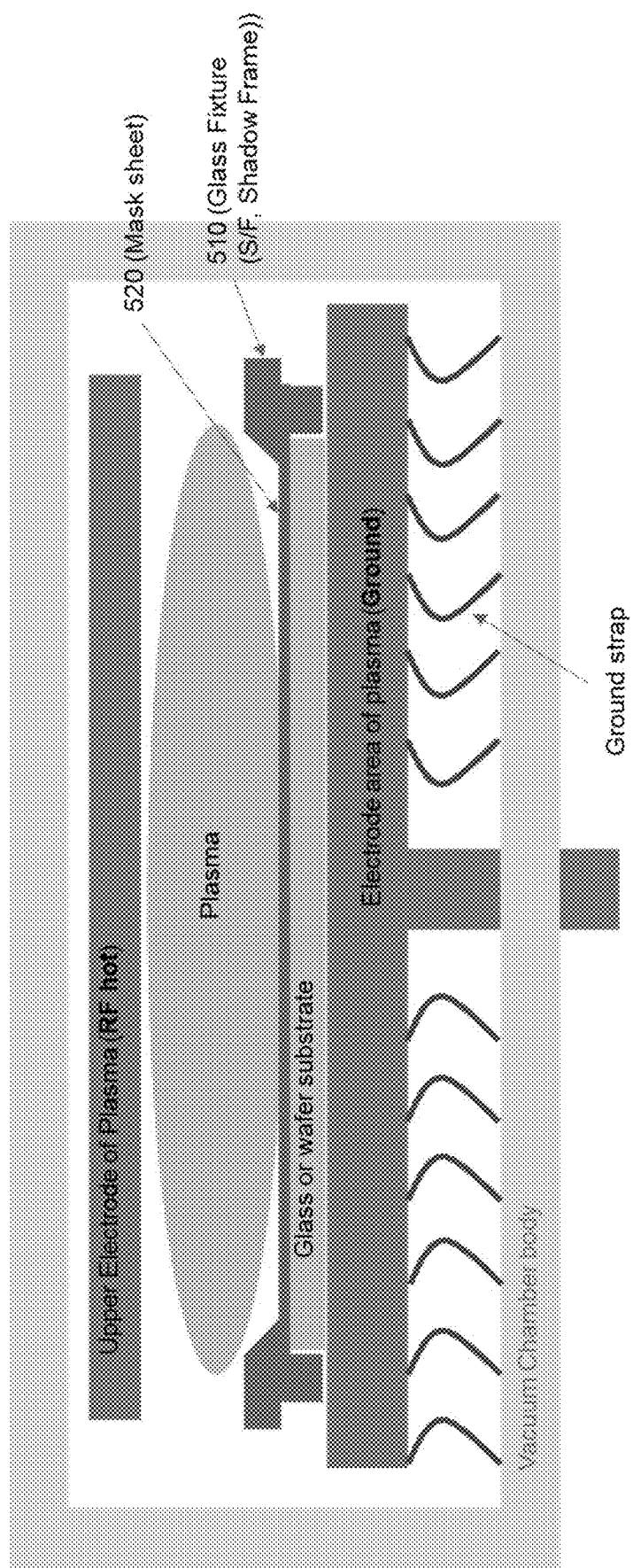
FIG. 18 shows a sectional view of a deposition chamber according to a further embodiment.

Referring to FIGS. 17A and 17B, the deposition chamber 200a may include a glass fixture (which may be referred to as a substrate fixture (S/F) or shadow frame) 510 for retaining the glass substrate 230. The glass support (heater or lower electrode) 118 may function as a ground electrode area of plasma and the shower head 106 may function as an RF electrode area of plasma. In some embodiments, as shown in FIGS. 17C and 17D, no glass fixture may be provided in the deposition chamber. Referring to FIG. 18, in embodiments, the deposition chamber 200 may further include a mask sheet 520 to be disposed under the glass fixture 510 for covering the glass substrate.

Transferring Substrate Back to Load Lock (S1116)

Figure 15A:
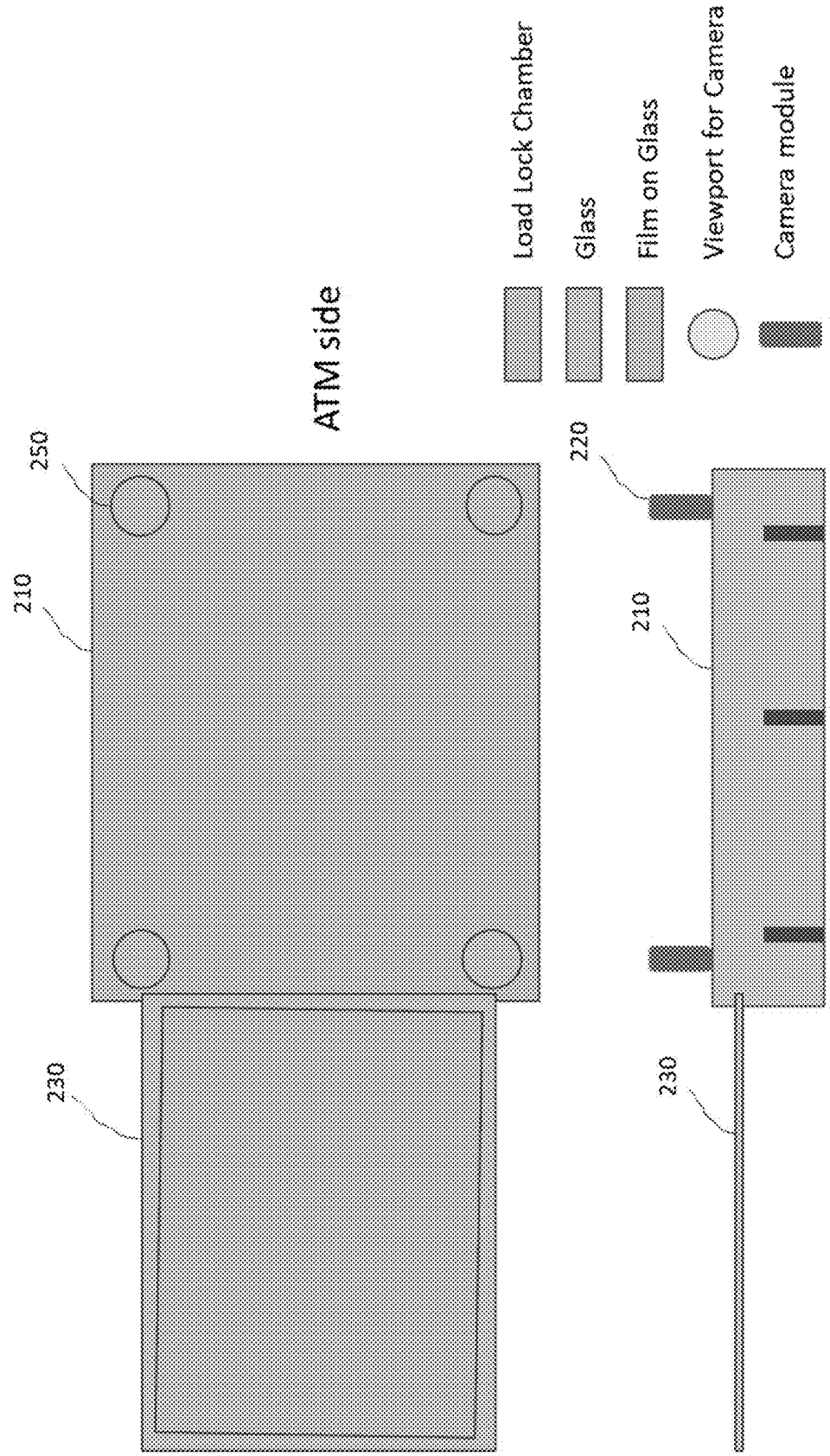
FIGS. 15A-15F show unloading statuses of a film-deposited glass substrate when being loaded in a film deposition system according to an embodiment.
Figure 15B:
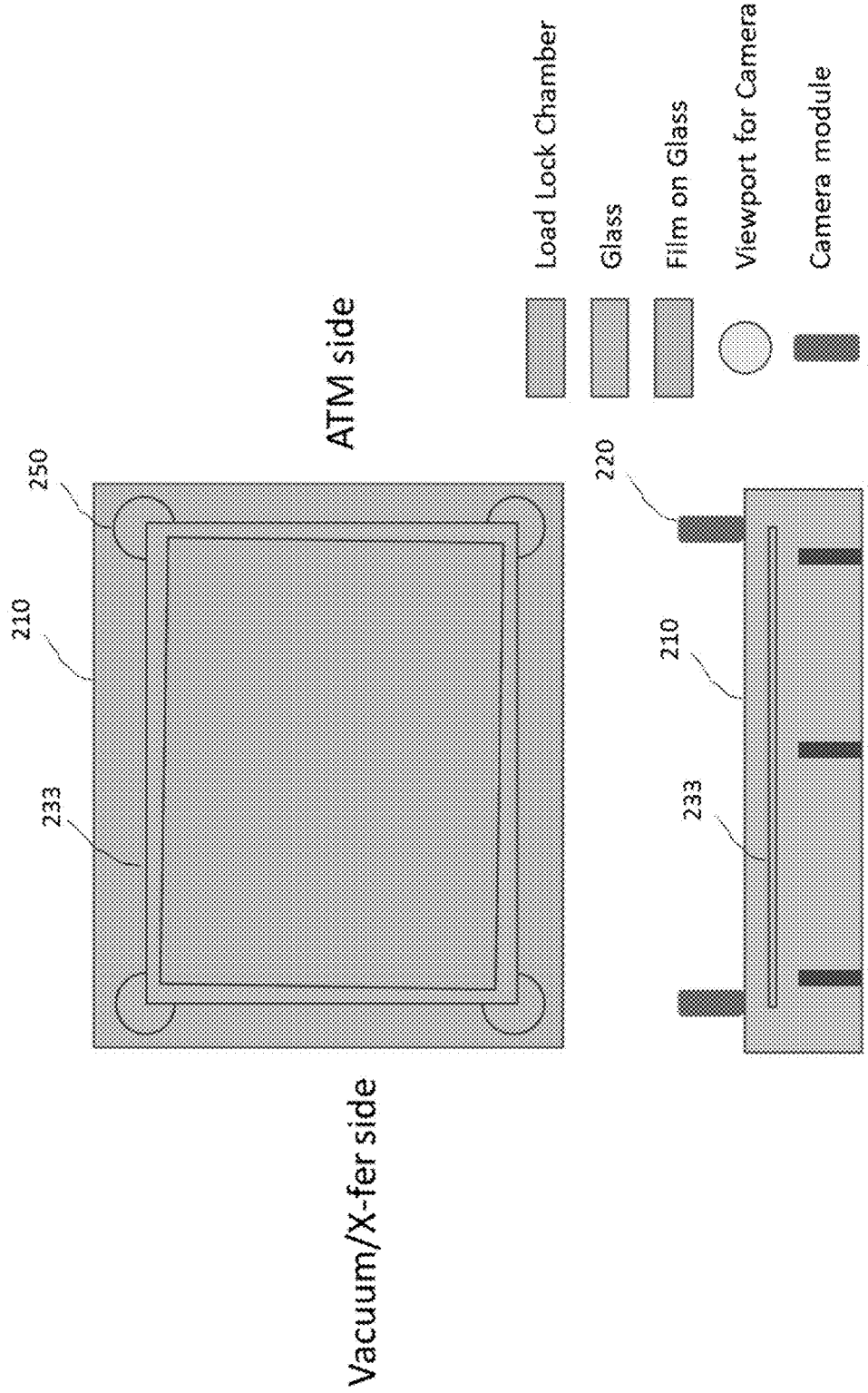
Figure 15C:
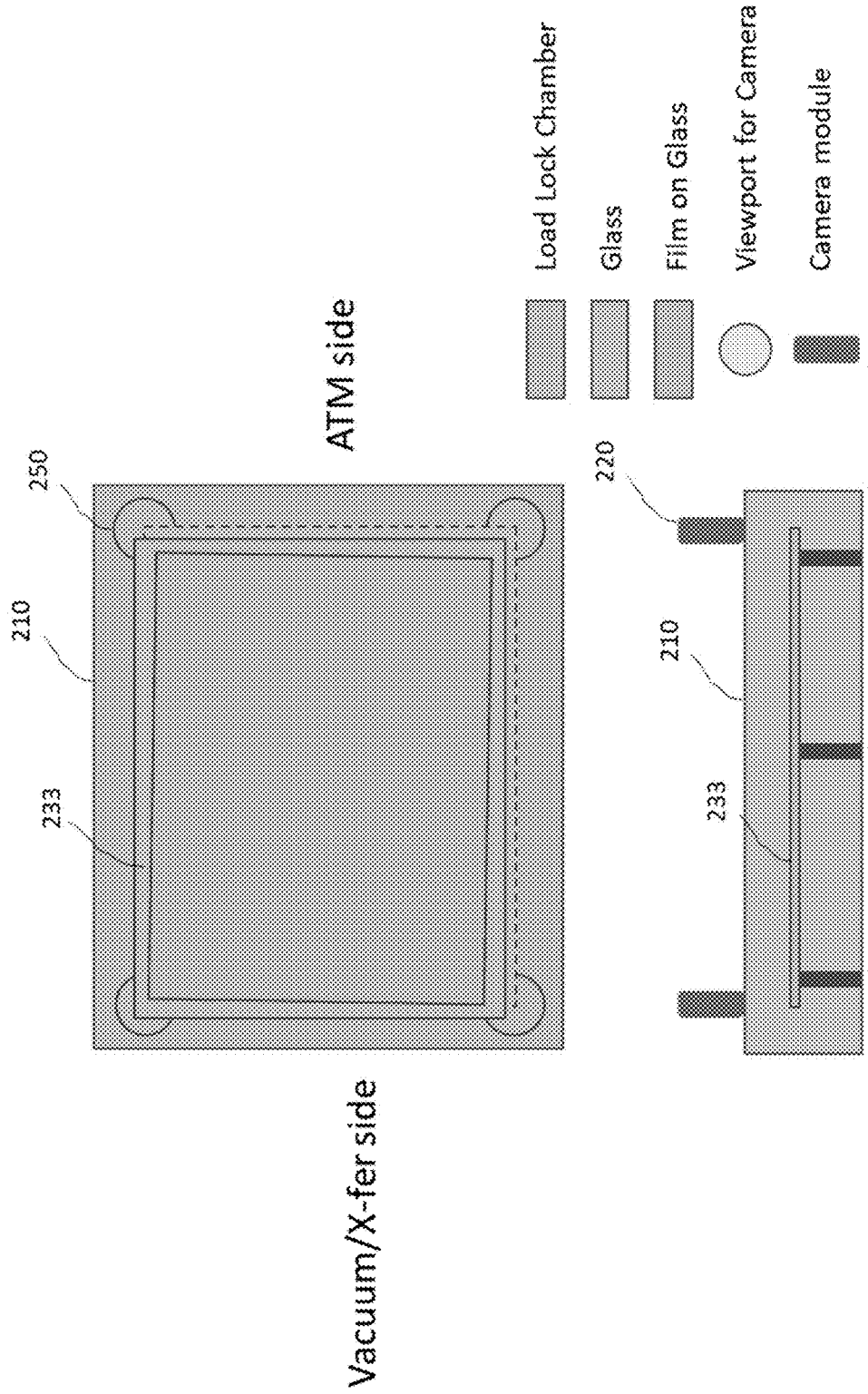

In some embodiments, as shown in FIGS. 11, 12H-12K, and 15A-15C, after a film is deposited on the substrate, the transfer robot retrieves the film-deposited glass substrate 233 from the deposition chamber 215 and transfers the film-deposited glass substrate 233 back to the load lock 210. After the film-deposited glass substrate 233 is transferred back to the load lock 210, the transfer robot can place the film-deposited glass substrate 233 on the supports in the load lock 210. In some embodiments as shown in FIGS. 15A-15C, a film is deposited on the glass substrate.

Taking Third Pictures (S1118)

Once the film-deposited glass substrate 233 is retrieved from the deposition chamber and transferred back to the load lock 210, the controller 110 can control the cameras 220 to take third pictures of one or more of four corners of the film-deposited glass substrate 233. The controller 110 can control the cameras 220 to store the captured images in the memory 115 or to send the captured images to the controller 110.

Analyzing Third Pictures (S1120)

The controller 110 can receive the third pictures from the cameras 220 or retrieve the third pictures from the memory 115 for analysis. The controller 110 can analyze the third pictures for possible location errors and/or possible defects on the deposited film.

Substrate Location Analysis and Errors Determined Using Third Pictures

Similarly to determining whether there is a loading error on the substrate 230 that has been initially introduced into the load lock 210, once the film-deposited glass substrate 233 is transferred back to the load lock 210 after deposition, the controller 110 can determine whether there is a substrate loading error in the film-deposited glass substrate 233. For example, referring to FIG. 15C, the film-deposited glass substrate 233 may be placed at a location shifted from a reference location as shown in dotted lines. If an amount of the shift is greater than a threshold, the film-deposited glass substrate 233 may be damaged when it is being clamped. Thus, to determine loading errors, the controller 110 can analyze the third pictures. In some embodiments, the third pictures of all the four corners are analyzed. In other embodiments, one, two, or three of the third pictures for one, two, or three corners is analyzed to determine the loading error.

The specific method of determining location errors of the film-deposited glass substrate 233 may be the same with that for determining location errors of the glass substrate using the first pictures, but the present disclosure is not limited thereto.

Edge Exclusion Analysis or Film Location Analysis

In a display manufacturing process, an edge exclusion area may be needed for handling a glass substrate. Thus, in general, an edge exclusion analysis for determining whether a film has been formed within an edge exclusion area may be needed.

Figure 22:
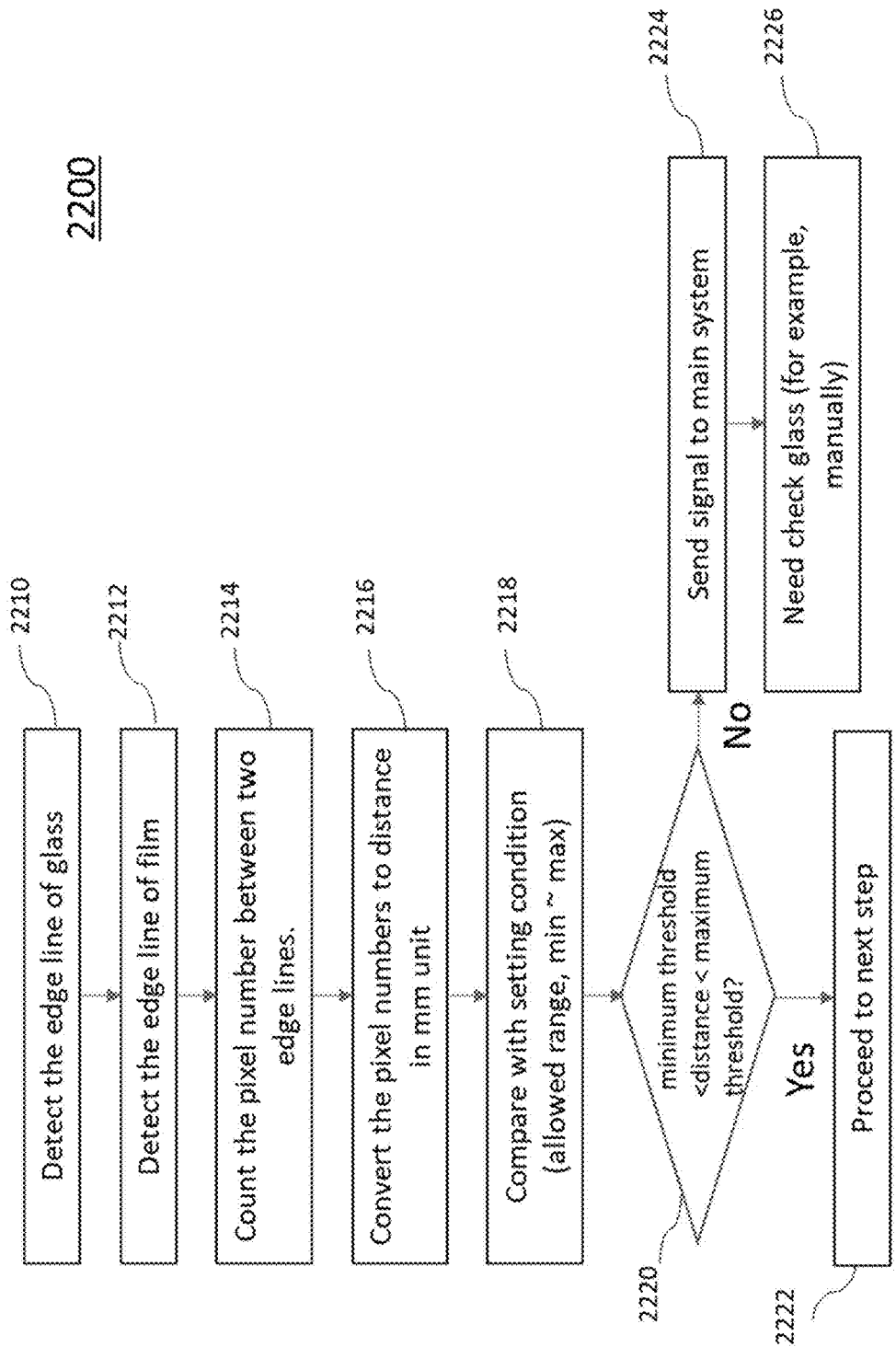
FIG. 22 shows a flowchart of a process of determining location errors of a film deposited on a glass substrate according to an embodiment.

FIG. 22 shows a flowchart of a process 2200 of determining location errors of a film deposited on a glass substrate according to an embodiment. FIG. 22 is merely an example location error determining process, and certain steps may be removed, other steps added, two or more steps combined or one step can be separated into multiple steps depending on the specification and requirements. At least part of steps can be performed or caused by a computing device such as the controller 110 of FIG. 1. For the purpose of the convenience, the description will be made based on the controller 110 performing at least some of the process 2200 of FIG. 22.

In some embodiments, for the edge exclusion analysis, the controller 110 may process and analyze the third pictures that are retrieved from the memory 115 or received from one or more of the cameras 220. The controller 110 can detect an edge line of the film-deposited glass substrate 233 that has been transferred back to the load lock 210 (step 2210). The controller 110 may detect the edge line of the film-deposited glass substrate 233 using a process discussed above with reference to FIG. 20 may be used, however, the present disclosure is not limited thereto.

Figure 23B:
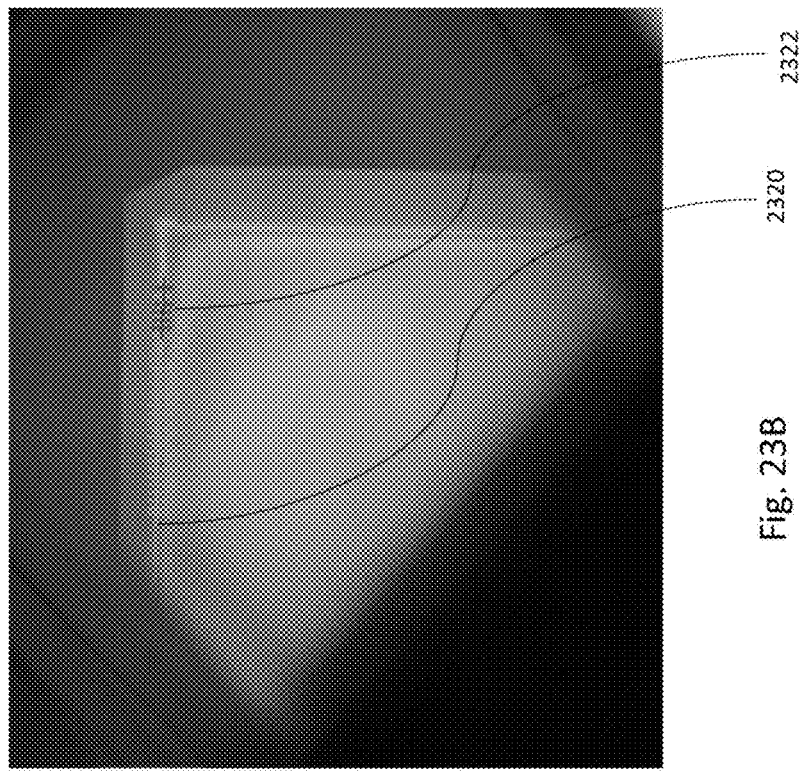
FIGS. 23A and 23B show a method of locating an edge line of a film deposited on a glass substrate according to an embodiment.
Figure 23A:
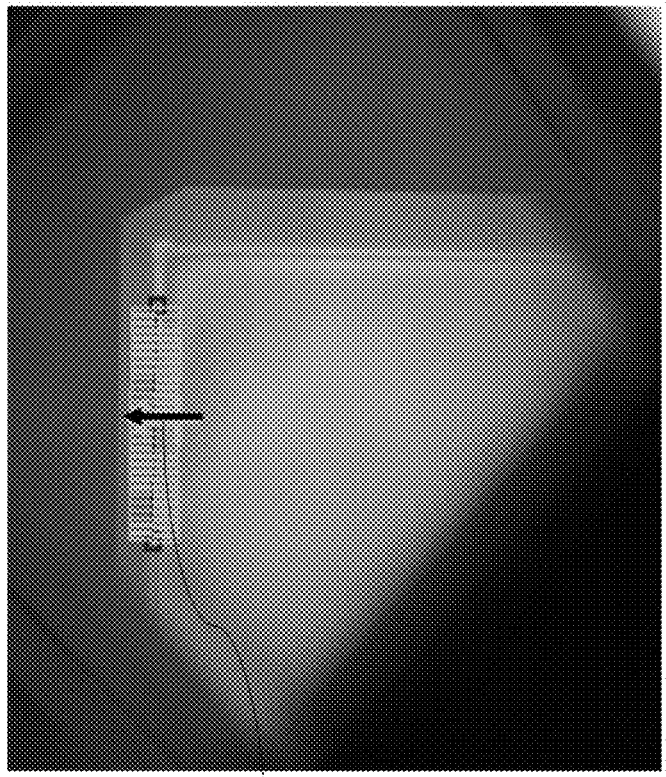

FIGS. 23A and 23B show a method of locating an edge line of a film deposited on a glass substrate according to an embodiment. Referring to FIGS. 23A and 23B, pixels of the third pictures can be scanned to determine a change in contrast values of the pixels. For this, the controller 110 can check the contrast values of the pixels in the direction of an arrow 2310 shown in FIG. 23A to determine the changes in the contrast value. the controller 110 can count the pixels having the contrast value changes greater than a threshold value (for example, about 80%). The counted pixels can be lined up as displayed in green color (or as horizontal and vertical lines) in the display 130 as shown in FIG. 23B. The positions of the counted pixels can be further detected and connected to form an edge line of the deposited film in green color (or as a horizontal line 2320) in the display 130 as shown in FIG. 23B. In one embodiment, when the controller 110 check the contrast values of the pixels in the direction of an arrow 2310 shown in FIG. 23A, it is possible that the controller 110 does not determine contrast value changes greater than the threshold value in some portions of the deposited film. Then, the controller 110 may cause the display to display those portions in red color (or horizontal and vertical lines 2322) as shown in FIG. 23B.

The above edge detection method is merely an example, and the present disclosure is not limited to the embodiment discussed above. Any other edge detection method for identifying an edge line of the film from the third pictures or fourth pictures can be used. For example, the brightness of the pixels, instead of the contrast values of the pixels can be used to detect an edge line of the glass substrate. Further, in one embodiment, edge line detection may be performed using pictures taken by the cameras shown in FIG. 3 while the glass substrate is moving under the cameras. In another embodiment, edge line detection may be performed using pictures taken by the cameras shown in FIGS. 4 and 5 while the glass substrate is moving under the cameras.

Returning back to FIG. 22, for measuring the distance between the substrate edge line and the film edge line, the controller 110 can count the number of pixels between the substrate edge line and the film edge lines (step 2214). The controller 110 can convert the counted number of pixels into the distance between the two edge lines, for example, in mm unit (step 2216). Instead of the mm unit, other units such as inch, μm, etc., can also be used. The controller 110 can compare the distance with a predetermined setting condition (e.g., allowed range, minimum, maximum, etc.) (step 2218). The controller 110 can compare the distance with a predetermined minimum distance and a predetermined maximum distance. For example, the controller 110 can determine whether the distance is between the predetermined minimum distance and the predetermined maximum distance (step 2220). If the distance is between the predetermined minimum distance and the predetermined maximum distance, the controller 110 may determine that the deposited film passes the standard of the edge exclusion analysis, and proceed to the next process of the film-deposited glass substrate 233 (step 2222). When the distance is not between the predetermined minimum distance and the predetermined maximum distance, the controller 110 may send an error signal to the main system or server for additional analysis (step 2224) and the film-deposited glass substrate 233 may be manually checked by an operator (step 2226).

Corner Profile Analysis

Figure 24:
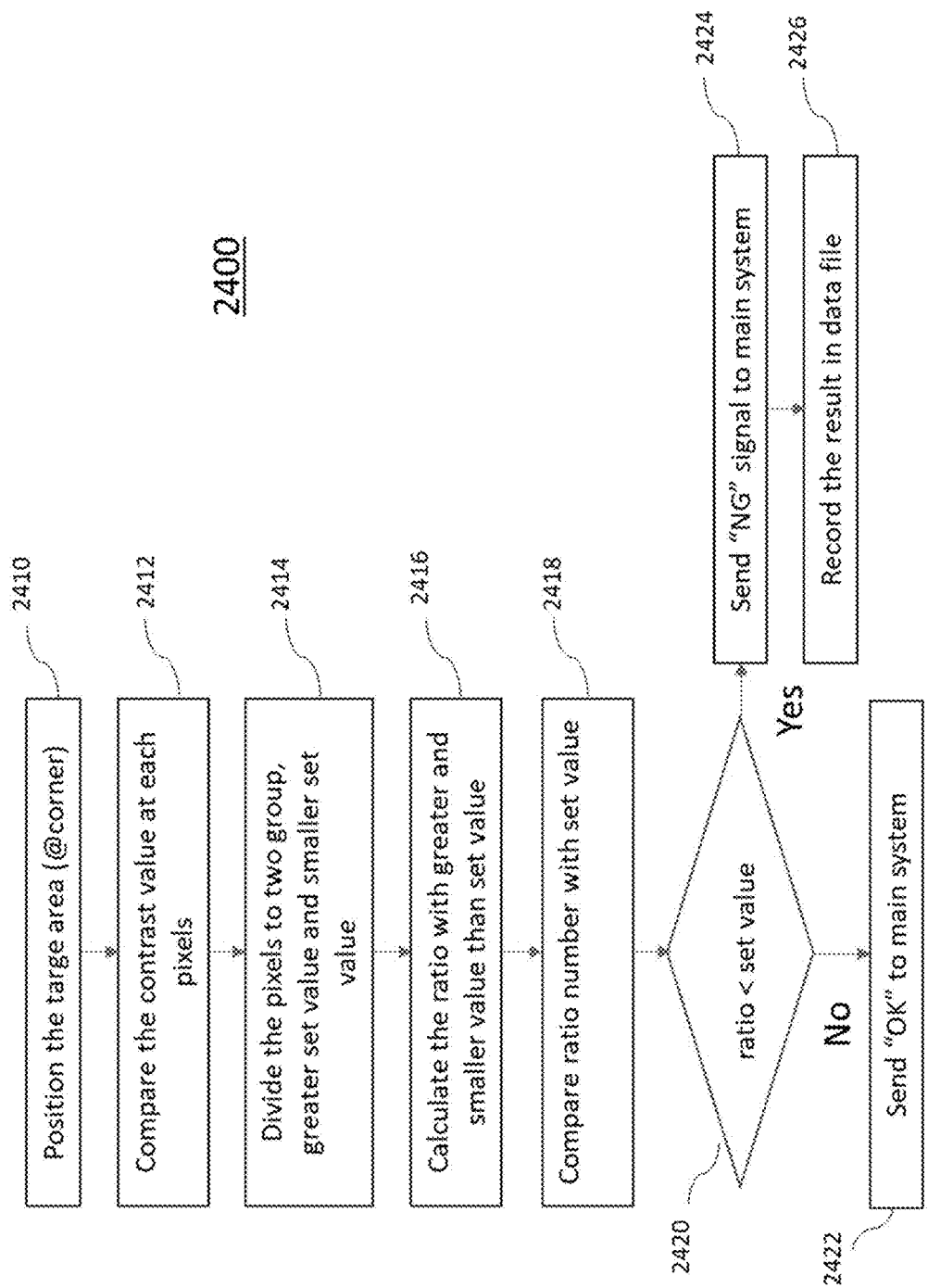
FIG. 24 shows a flowchart of process of analyzing a corner profile of a film deposited on a glass substrate according to an embodiment.

FIG. 24 shows a flowchart of process 2400 of analyzing a corner profile of a film deposited on a glass substrate according to an embodiment. FIG. 24 is merely an example corner profile analyzing process, and certain steps may be removed, other steps added, two or more steps combined or one step can be separated into multiple steps depending on the specification and requirements. At least part of steps can be performed or caused by a computing device such as the controller 110 of FIG. 1. For the purpose of the convenience, the description will be made based on the controller 110 performing at least some of the process 2400 of FIG. 24.

Figure 25:
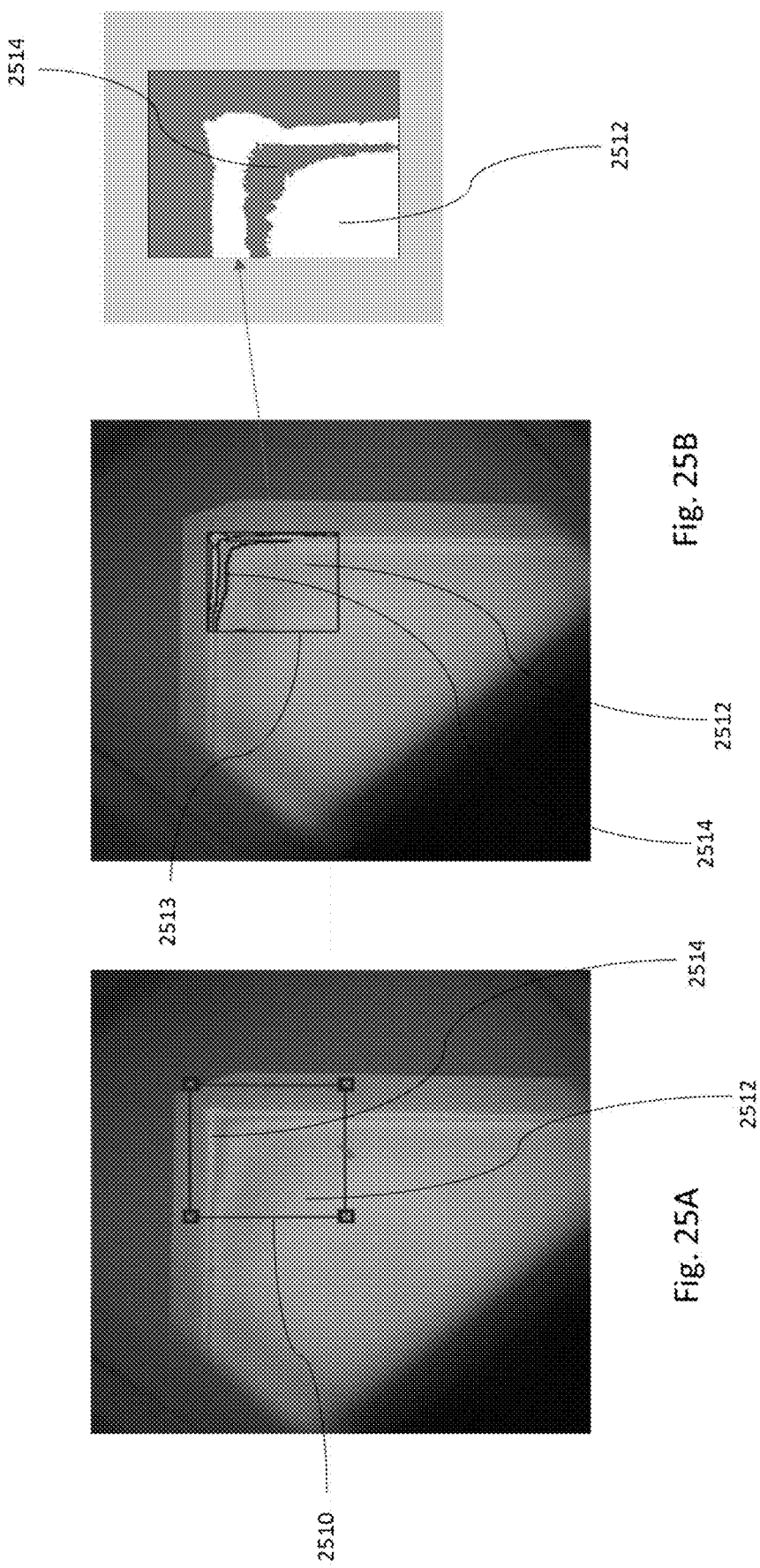
FIGS. 25A and 25B show a method of analyzing the corner profile of the film deposited on the glass substrate according to an embodiment.

FIGS. 25A and 25B show a method of analyzing the corner profile of the film deposited on the glass substrate according to an embodiment. Referring to FIGS. 24 and 25A-25B, the controller 110 may process the third pictures to analyze one or more corner profiles of the deposited film. The controller 110 may select a target area 2510 located at a corner of the glass substrate that includes a corner portion of the deposited film as shown in FIG. 25A (step 2410). FIG. 25A shows that the target area 2510 is marked as a square. However, the present disclosure is not limited thereto. For example, the target area can be marked as other polygonal shapes such as a circle, triangle, rectangle, pentagon, hexagon, etc. Furthermore, the size of the target area 2510 shown in FIG. 25A is also merely an example, and the target area can be selected to be smaller or larger than what is shown in FIG. 25A. The controller 110 may obtain the contrast values of the pixels in the target area 2510 as shown in FIG. 25B. The controller 110 may compare the contrast value of each pixel with a predetermined set contrast value or a reference contrast value (step 2412) to identify a target corner portion 2513 of the deposited film. The predetermined set contrast value or reference contrast value can be stored in the memory 115 or the controller 110. The controller 110 can divide the pixels in the target corner portion into two groups with respect to the set contrast value (step 2414). In the first one of the two groups, the contrast values of the pixels may be greater than the set contrast value while in the second one of the two groups, the contrast values of the pixels may be smaller than the set contrast value. The controller 110 can calculate a ratio of the first group having a greater contrast value to the second group having a smaller contrast value (step 2416). Referring to FIGS. 25A and 25B, the white and bright portions 2512 show the first group of the pixels and the dark portions 2514 show the second group of the pixels having contrast values lower than the set contrast value.

The controller 110 can compare the calculated ratio with a predetermined set ratio (step 2418). The controller 110 can determine whether the calculated ratio is less than the predetermined set ratio (step 2420). If it is determined in step 2420 that the calculated ratio is greater than (or not less than) the predetermined set ratio, the controller 110 can determine that the film-deposited glass substrate passes the corner profile analysis and a successful or OK sign can be sent to the main system, and then the film-deposited glass substrate may be transferred to another station for performing additional processes (step 2422). If it is determined in step 2420 that the calculated ratio is smaller than the predetermined set ratio, the controller 110 can determine that the film-deposited glass substrate does not pass the corner profile analysis and an unsuccessful or NG sign can be sent to the main system (step 2424). The controller 110 can record the result in a data file of the memory 115 (step 2426). After the "NG" sign is sent to the main system, the film-deposited glass substrate can be set aside for a further inspection or discarded.

The above corner profile analysis method is merely an example, and the present disclosure is not limited to the embodiment discussed above. Any other corner profile analysis method using the third pictures or fourth pictures can be used. For example, the brightness of the pixels, instead of the contrast values of the pixels can be used to analyze the corner profile of the deposited film.

Edge Width Analysis

Figure 26:
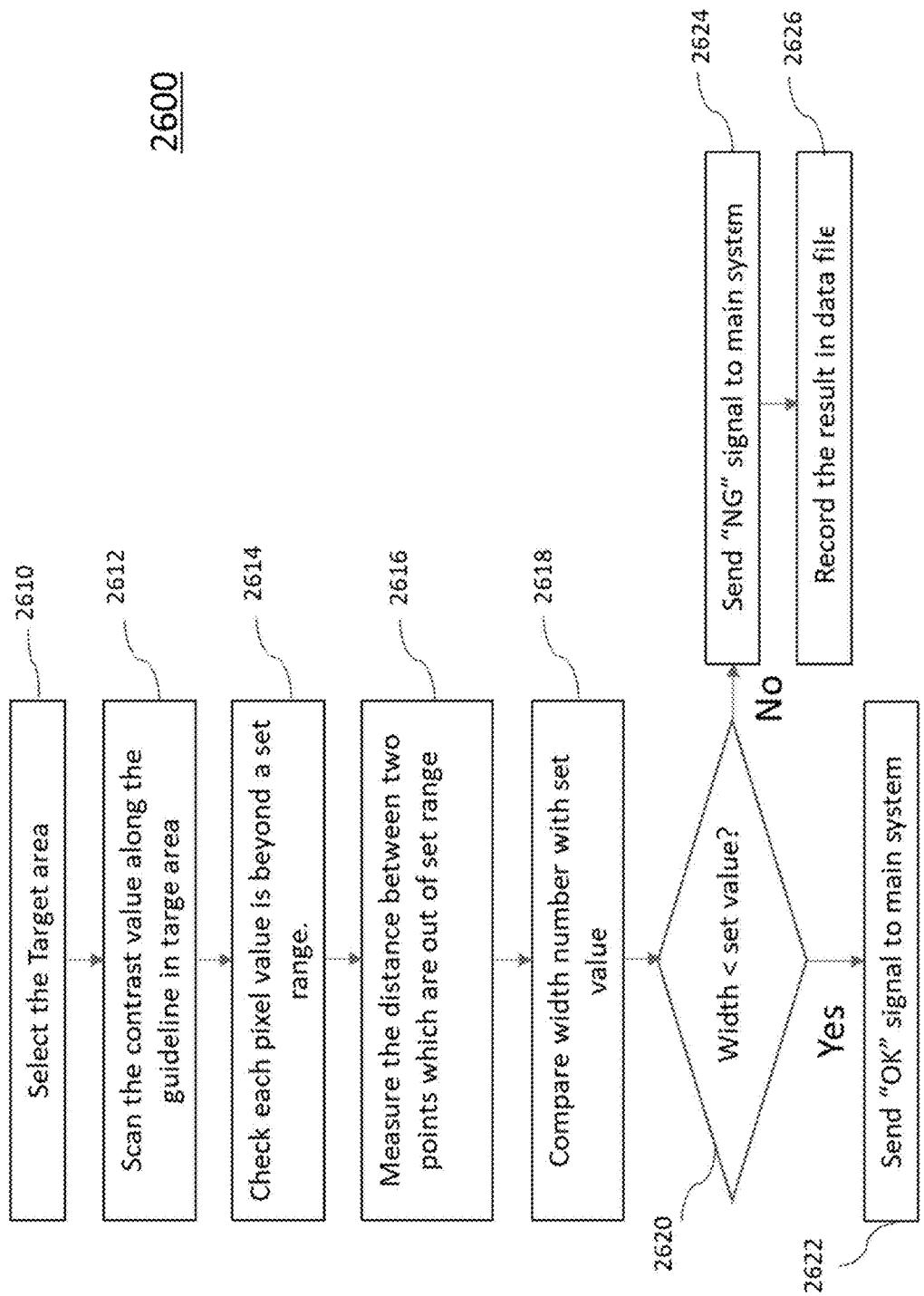
FIG. 26 shows a flowchart of a process of analyzing a width of an edge of a film deposited on a glass substrate according to an embodiment.
Figure 27C:
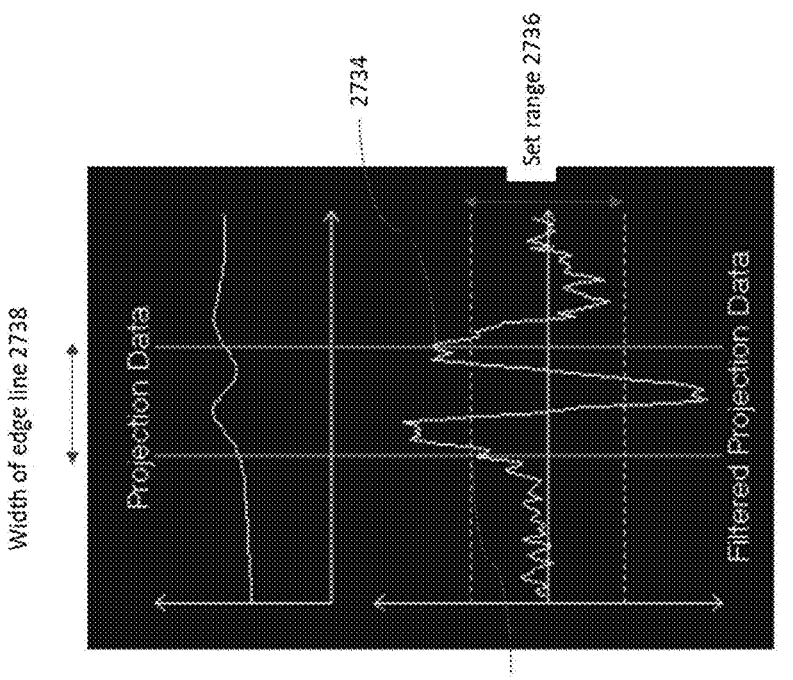
FIGS. 27A-27C show a method of analyzing the width of the edge of the film deposited on the glass substrate according to an embodiment.
Figure 27B:
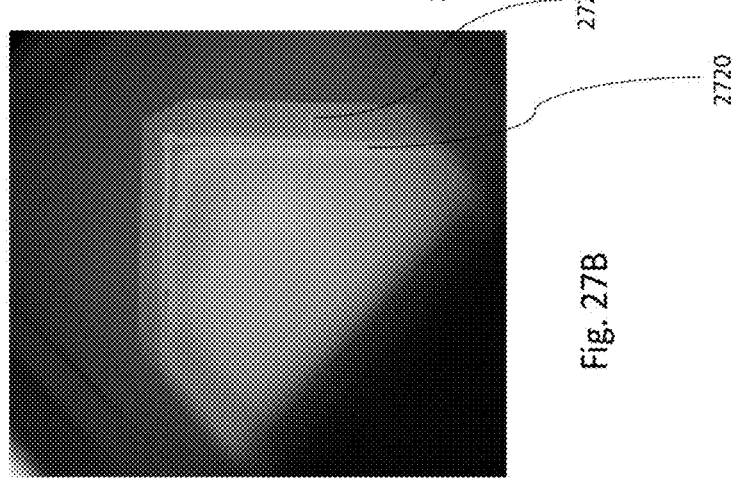
Figure 27A:
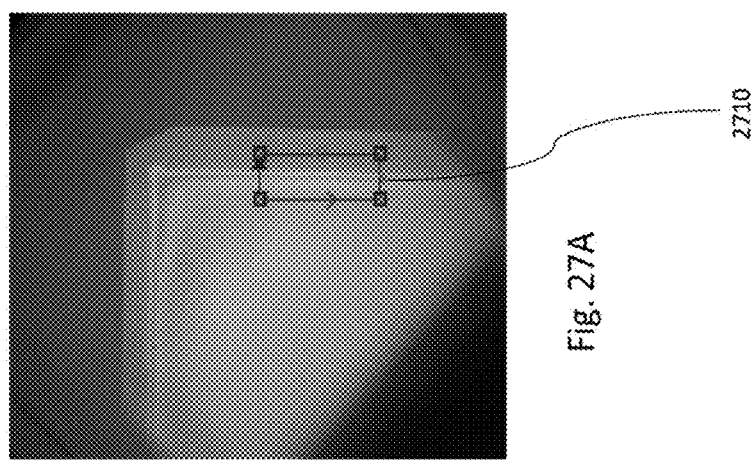

FIG. 26 shows a flowchart of a process 2600 of analyzing a width of an edge of a film deposited on a glass substrate according to an embodiment. FIG. 26 is merely an example edge width analyzing process, and certain steps may be removed, other steps added, two or more steps combined or one step can be separated into multiple steps depending on the specification and requirements. At least part of steps can be performed or caused by a computing device such as the controller 110 of FIG. 1. For the purpose of the convenience, the description will be made based on the controller 110 performing at least some of the process 2600 of FIG. 26. FIGS. 27A-27C show a method of analyzing the width of the edge of the film deposited on the glass substrate according to an embodiment.

The controller 110 may process the third pictures for measuring an edge width of the film. In an edge of the deposited film, typically two or more edge lines can be found. These two or more lines are collectively referred to as an edge and a width of the edge measured as discussed below. Referring to FIGS. 26 and 27A-27C, the controller 110 can select a target area 2710 located at a corner. FIG. 27A shows that the target area 2710 is marked as a rectangle. However, the present disclosure is not limited thereto. For example, the target area can be marked as other polygonal shapes such as a circle, triangle, square, pentagon, hexagon, etc. Furthermore, the size of the target area 2710 shown in FIG. 27A is also merely an example, and the target area can be selected to be smaller or larger than what is shown in FIG. 27A. Moreover, the position of the target area 2710 shown in FIG. 27A is also merely an example, and the target area can be selected in another location. The controller 110 may obtain the contrast values of the pixels in the target area 2710, for example, by scanning the contrast values along the guideline in the target area (see arrows along the rectangle in FIG. 27A) (step 2612). The controller 110 may check whether each pixel value is beyond a predetermined set range (step 2614). The predetermined set range 2736 may be stored in the memory 115 or controller 110. The controller 110 may determine a line 2720 connecting the pixels having the lowest contrast values as shown in a green line (or vertical line 2720) in FIG. 27B. The controller 110 may measure the horizontal distance 2738 (or width edge line) between two points 2732 and 2734 which are beyond the predetermined set range 2736 as shown in FIG. 27C (step 2616). FIG. 27C shows the contrast values of the pixels disposed on a line 2722 perpendicular to the green line 2720 in FIG. 27B. The controller 110 may pick the two points 2732 and 2734 as shown in FIG. 27C. Each of the selected two points 2732 and 2734 may be a peak point in which the contrast value is changed from those within the predetermined set range 2736 and those in the outside of the set range. Further, as shown in FIG. 27C, the lowest contrast value point is located between the two points. After the controller 110 obtains the distance between the selected two points as a width of the edge as shown in FIG. 27C (step 2616), The controller 110 may compare the obtained width with a predetermined set width value (step 2618). The predetermined set width value may be stored in the memory 115 or controller 110.

The controller 110 can determine whether the obtained width is less than the predetermined set width value (step 2620). If it is determined in step 2620 that the obtained width is smaller than the set width value, the controller 110 may determine that the film-deposited glass substrate passes the standard of the edge width analysis and a successful or OK sign can be sent to the main system, and then the film-deposited glass substrate may be transferred to another station for performing additional processes (step 2622). If it is determined in step 2620 that the obtained width is greater than the set width value, the controller 110 may determine that the film-deposited glass substrate does not pass the edge width analysis and an unsuccessful or NG sign can be sent to the main system (step 2624). The controller 110 can record the result in a data file of the memory 115 (step 2626). After the "NG" sign is sent to the main system, the film-deposited glass substrate can be set aside for a further inspection or discarded.

The above edge width analysis method is merely an example, and the present disclosure is not limited to the embodiment discussed above. Any other edge width analysis method using the third pictures or fourth pictures can be used. For example, the brightness of the pixels, instead of the contrast values of the pixels, can be used to analyze the corner profile of the deposited film.

Clamping Film-Deposited Glass Substrate and Taking Fourth Pictures (S1122/S1124)

Figure 15D:
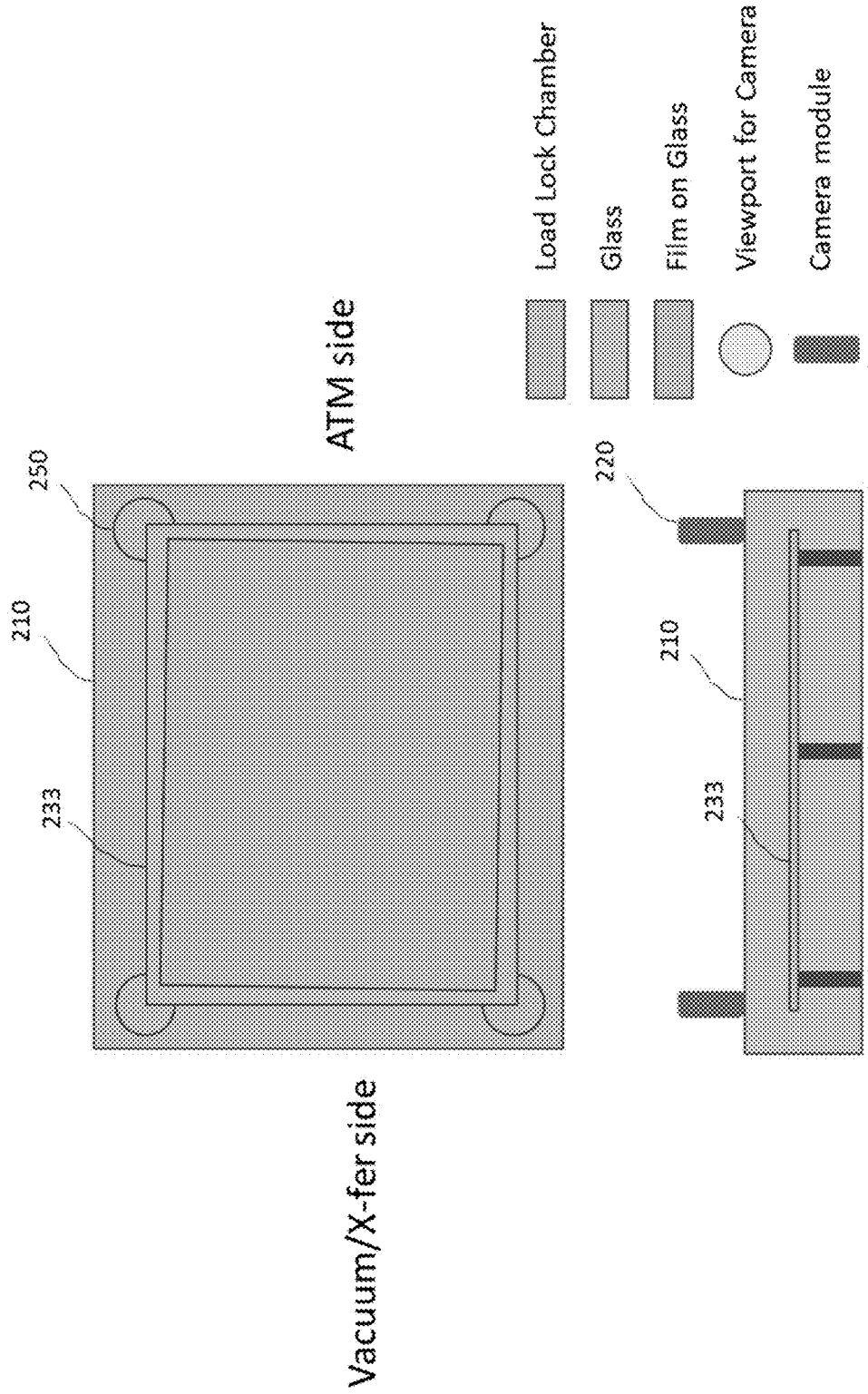
Figure 15E:
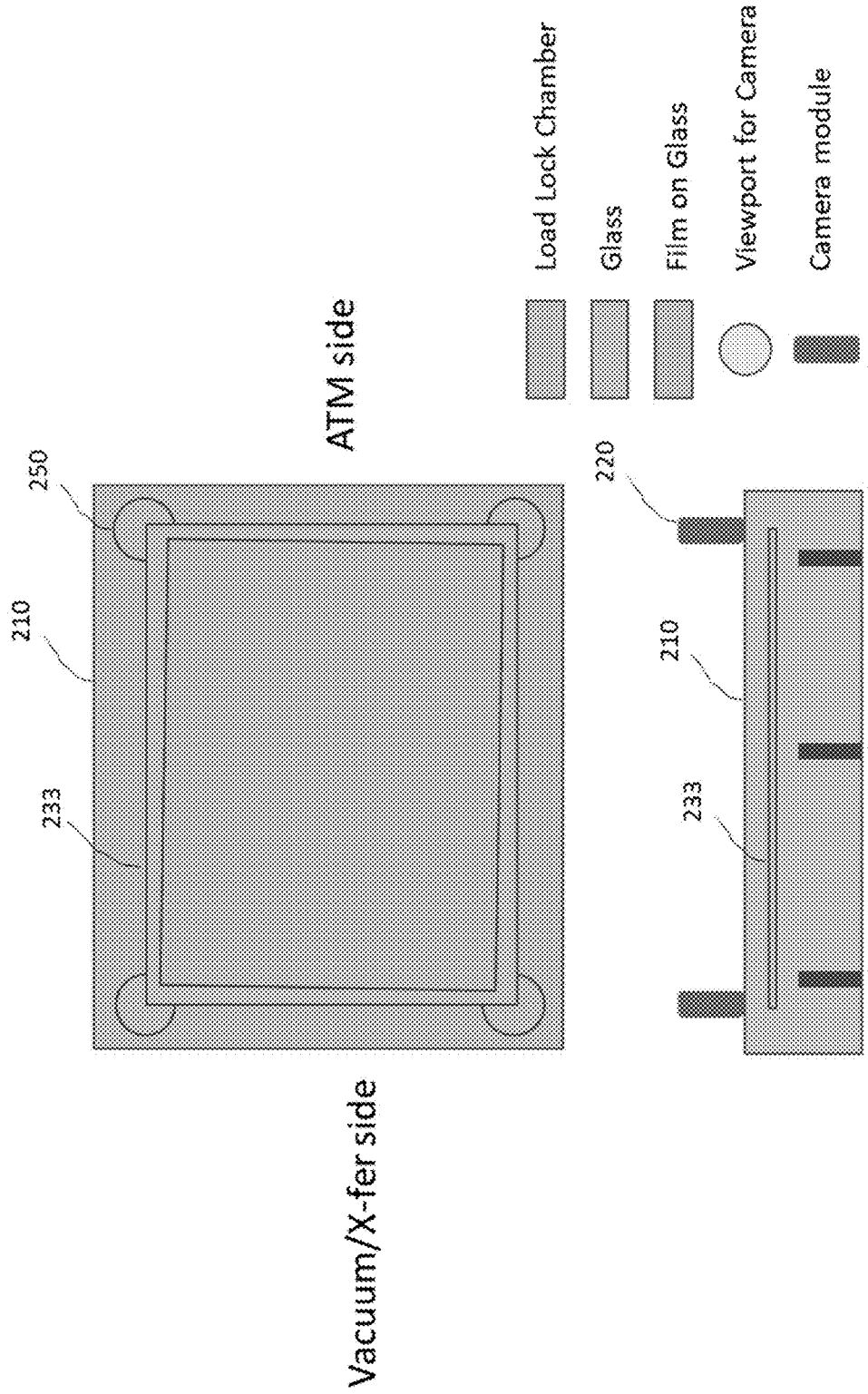
Figure 15F:
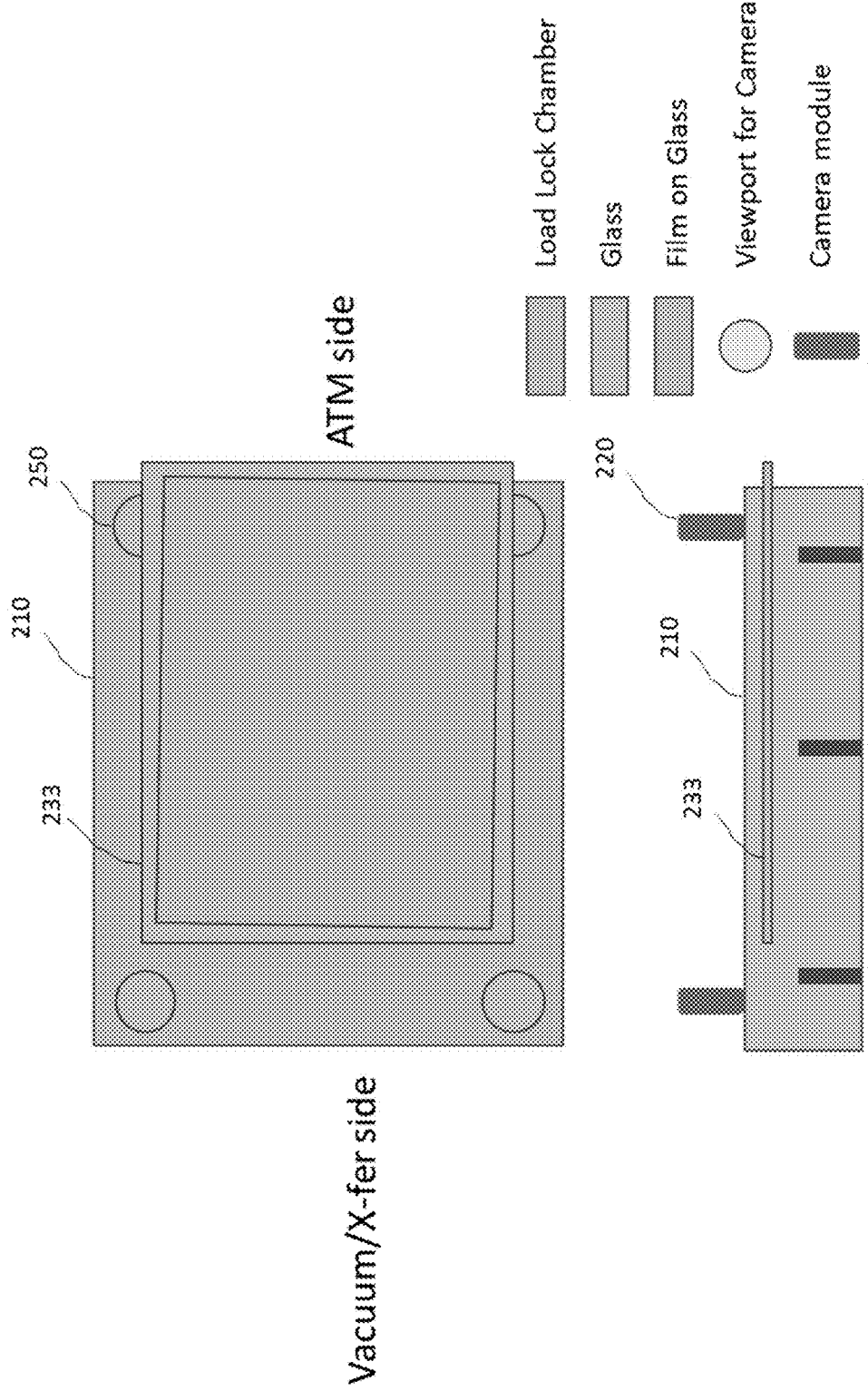

In some embodiments as shown in FIGS. 11, 12K, and 15D, when the positioning errors are not detected, the film-deposited glass substrate 233 may be clamped in the load lock 210 and the controller 110 may control the cameras 220 to take the fourth pictures of one or more of the four corners of the film-deposited glass substrate 233. The controller 110 may control the cameras 220 to store the fourth pictures in the memory 115 or send the captured images to the controller 110.

Analyzing Fourth Pictures (S1126)

The controller 110 may process and analyze the fourth pictures to determine whether the film-deposited glass substrate is clamped in an accurate location such that the ATM robot can unload the film-deposited glass substrate without causing any defects or damages. When the film-deposited glass substrate is located in a location shifted more than a threshold in a clamped state, there are risks for the glass substrate to be damaged by the ATM robot during unloading the substrate from the load lock. The controller 110 may determine a possible clamping error using the process described with respect to the analysis of the second pictures (e.g., FIG. 21), however, the present disclosure is not limited thereto.

The controller may further process and analyze the fourth pictures to perform the edge exclusion analysis, corner profile analysis, and/or edge width analysis described above.

Checking Cracks and Physical Damages

Figure 28:
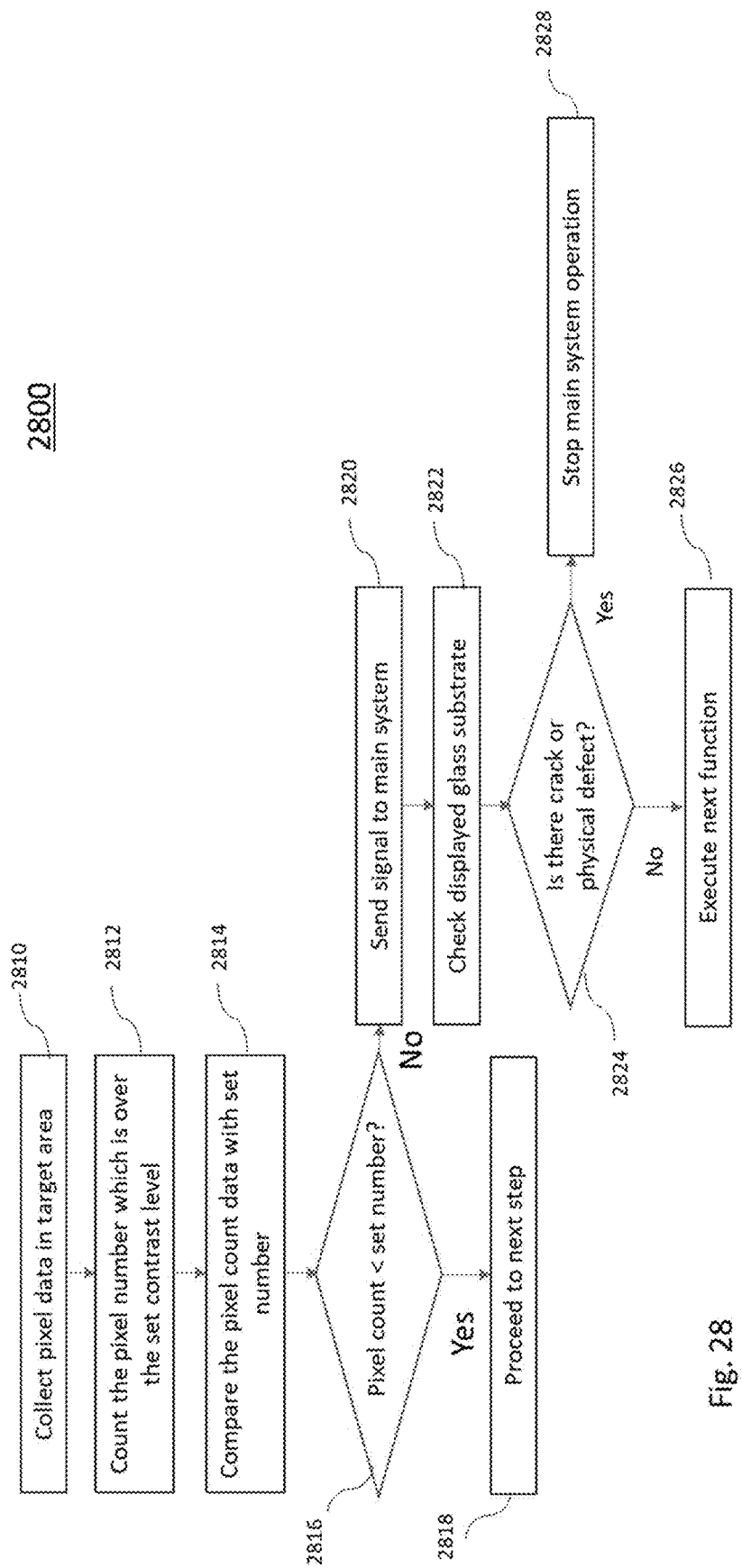
FIG. 28 shows a flowchart of a process of determining cracks or defects of the glass substrate in a glass substrate according to an embodiment.

FIG. 28 shows a flowchart of a process of determining cracks or defects in a glass substrate according to an embodiment. FIG. 28 is merely an example crack determining process, and certain steps may be removed, other steps added, two or more steps combined or one step can be separated into multiple steps depending on the specification and requirements. At least part of steps can be performed or caused by a computing device such as the controller 110 of FIG. 1. For the purpose of the convenience, the description will be made based on the controller 110 performing at least some of the process 2800 of FIG. 28.

Referring to FIG. 28, the controller 110 may process one or more pictures among the first to fourth pictures to determine whether cracks and/or physical damages exist on the substrate 230 and/or film-deposited substrate 233. In some embodiments, the controller 110 may process the first pictures to determine whether there are cracks and/or damages on the substrate 230 and/or film-deposited substrate 233. As shown in FIG. 28, in the first picture, the controller 110 may select a target area having a predetermined size and collect pixel data for the selected target area (step 2810). The controller 110 may count the number of pixels in the target area having a predetermined set contrast level (step 2812). The predetermined set contrast level may be stored in the memory 115 or the controller 110. The controller 110 may compare the counted pixel number with a predetermined set number (step 2814). The predetermined set number may be stored in the memory 115 or the controller 110. The controller 110 can determine whether the counted pixel number is less than the predetermined set number (step 2816). If it is determined in step 2816 that the pixel count number is smaller than the predetermined set number, the controller 110 may determine that the substrate has no defects or cracks (or negligible or acceptable level of defects or cracks), and the glass substrate can proceed to the next step (step 2818).

If it is determined in step 2816 that the counted pixel count number is greater than (or not less than) the set number, the controller 110 may send a signal indicative of potential cracks or physical detects in the glass substrate to the main system (step 2820). Subsequently, the controller 110 may control the display to display portions of the glass substrate so that an operator checks the displayed portions to determine if there is any cracks or physical defects (step 2824).

When the glass substrate is moved by a transfer robot or a loading-unloading robot, the glass substrate may fluctuate. If there is a crack or physical defect, such fluctuation may cause breakage of the glass substrate within chambers of the system. Debris or particles resulting from the breaking of the glass substrate may contaminate the chambers of the system. To avoid such contamination, when determined that there is any crack or physical defect in the glass substrate, the controller 110 may stop the main system operation (step 2828). On the other hand, when determined that the signal in the step 2824 is caused by stains or spots formed on the glass substrate, other than cracks or physical defects of the glass substrate, the controller 110 can execute the next function (step 2826).

Although the controller 110 analyzes the first pictures for potential defects or cracks in FIG. 28, the present disclosure is not limited thereto. For example, the controller 110 may use the third pictures for such a defect/crack analysis. The controller 110 may also use pictures taken by the cameras 420 and 520 shown in FIGS. 4 and 5 to determine whether cracks and defects exist on the substrate 230 and/or the film-deposited substrate 233.

Unloading Film-Deposited Glass Substrate (S1128)

In some embodiments as shown in FIGS. 11, 12L, and 15E-15F, the ATM robot may unload the film-deposited glass substrate 233 from the load lock 210. After the fourth photos are taken and/or analyzed, the glass substrate may be moved upward and then moved out of the load lock by the ATM robot. Thereafter, the film-deposited glass substrate 233 can be transferred to another station or stage for further processing.

Detecting Abnormal Situations in the Process or Deposition Chamber.

Generally, there is no perfect transparent material. Any light (photon) may necessarily lose its intensity while traveling through some material space by reflection, scattering, and absorption. The loss range is different dependent on material characteristics and injection light (wavelength, intensity, etc.).

In the case of a solid material, the light loss level and amount with the theoretical calculation can be assumed. However, with an amorphous phase material, it may be difficult to assume how much light intensity will be lost while the amorphous phase material travels. There should be more scattering, loss, and refraction by an atom's irregularity and structural defect. Almost all films that were deposited on glasses or wafers are amorphous phase material. So, the irregularity and the structural defect will be increased by film deposition conditions. For example, a lower RF power density on the local area, a gas flow amount, a process pressure, and the gap between electrodes may be key parameters to change film characteristics. When there are one or more abnormal situations in the process chamber during film deposition time, such situations may leave defects on the film deposited on the glass substrate.

In case of No Good Status of Glass Fixture

In some embodiments, as shown in FIGS. 17A and 17B, the glass fixture (S/F) presses the corners and edges of the glass substrate during the deposition process for forming a film in the deposition chamber. In the deposition chamber, it is possible that the glass fixture presses the corners and edges of the glass substrate inappropriately for various reasons. For example, a debris or particle may be placed between the glass fixture 510 and the glass substrate 230, or the glass fixture 510 may be dislocated or does not sit in its right position such that a gap 1181 (see FIG. 17B) may be formed between the glass substrate 230 and the glass fixture 510. When there is the small gap between the glass and glass fixture (S/F), the plasma streams may flow through the small gap. That may induce an unclear boundary of the film near the glass fixture or a wide edge line of the film near glass fixture. In some embodiments, the defects caused by dislocation of the glass fixture or the gap between the glass and the fixture can be detected by the corner profile analysis, the edge width analysis for an area near the glass fixture's location, the locations of edge lines (as shown in FIG. 7 as "edge-1" and "edge-2"), and/or the edge line detection as shown in FIG. 23B (for example, the portions 2322).

Glass Substrate Wrapping

In some embodiments, as shown in FIGS. 17C and 17D, a film may be deposited on a top surface 230a of the glass substrate in the deposition chamber 215 without using a glass fixture 510 as shown in FIG. 17A. In the embodiment illustrated in FIG. 17C, the glass substrate may be deformed or wrapped at edges and/or corners as shown in FIG. 31B and there may be a gap 1183 (see FIG. 17D) between the heater 118 and a bottom surface 230b of the glass substrate 230.

At the wrapped portions on edges or corners of the glass substrate 230, plasma may flow into the gap 1183 and a film may be formed on the bottom surface 230b of the glass substrate 230 while a film is be deposited on the top surface 230a of the glass substrate 230. The film formation on the bottom surface 230b itself may be a defect that can cause defects in the following process steps and also may cause the film on the top surface 230a to be thinner than a threshold thickness of the film.

According to embodiments using detection of changes in reflection and refraction of incident light, analysis of the third and/or fourth pictures can detect the defective formation of the film on the bottom surface at corners. For example, the corner profile analysis, the edge width analysis, and/or the edge line detection as shown in FIG. 23B (for example, the portions 2322) discussed above may be used for detection of this defect.

Arcing

In embodiments, when arcing has occurred during film deposition, there may be one or some arcing marks near the glass fixture area, or corner area of the glass fixture region. There are various causes of arcing, for example, dielectric breakage of chamber walls, abnormal operation of plasma forming apparatus, etc. When the arcing occurs, the abnormal marks on the edge line may be detected as abnormal cases on the film edge area. For example, when detecting edge line as shown in FIGS. 22 and 23, the edge line is not detected. In embodiments, the defects caused by arcing can be detected by the edge width analysis, the corner profile analysis and the edge line detection.

Golf-T (Lift Pin) Head Breakage

When the lift pin has stress or is electrically charged, the pinhead may be broken and fall on the floor of the electrode by moving up and down while the glass substrate is on the loading and unloading in the process chamber. The fallen down pinhead will be located underneath the glass substrate. That situation also makes abnormal plasma distribution near the pinhead location. The unclear edge line and/or wide edge line with circle shape center position can be caused by breakage of the lift pin head. In some embodiments, the defects caused by the lift pin breakage can be detected by the edge width analysis and/or the edge line detection.

Ground Strap Breakage

In the high-temperature environment in the process chamber, the lower electrode (susceptor) may move up and down whenever a glass is loaded and unloaded. The ground strap may be connected from the edge of the lower electrode (susceptor) to the bottom floor. Those ground straps can be flexible and fragile. When one ground strap is broken, the distribution of plasma density may be unchanged. However, several ground straps are broken, the distribution of plasma density may be changed to an asymmetrical shape. Especially, the corner area may be more sensitive to detect changes in the distribution of plasma density. The broken ground straps can induce lower plasma density. Lower plasma density may cause poor film properties and further cause more defects and irregularities of atoms. Those disorders of combination may change the light transverse characteristics (refraction, absorption, and scattering). In some embodiment, the defects caused by breakage of the ground strap can be detected by the algorithm of the corner profile analysis.

Assembling Status of Glass Fixture

The ceramic glass fixture may be formed by portions connected each other around the corner area of the ceramic glass fixture. If the connection of the ceramic glass fixture is loose, there may be a gap between pieces. The plasma may flow through the gap. This may cause the edge line of the deposited film not to be clear near the corner area, and the film will be deposited under the glass fixture location. In some embodiments, the defects caused by the abnormal assembly status of the glass fixture can be detected by the algorithm of the corner profile analysis, the edge width analysis, analysis of the locations of edge lines (as shown in FIG. 7 as "edge-1" and "edge-2"), and/or the edge line detection as shown in FIG. 23B (for example, the portions 2322).

Lower Electrode Flatness

In the high-temperature environment within the process chamber, the heater (lower electrode) may sag around the corner area. When the edge corner of the heater sags, there is a gap between the glass fixture and the heater, because the glass fixture is stiff and flat even in a high-temperature environment. The glass fixture may be made of a ceramic material for the high-temperature process. So, the glass fixture may maintain flat without being bent after a long time of use in a high-temperature environment. The gap between the sagged heater and the glass fixture (S/F) may induce thin film thickness around the corner area to compare with a normal case, and the edge line of the corner area may not be clear, and the wide edge line shape is formed when compared with a normal case. In some embodiments, the defects caused by the lower electrode sagging can be detected by the algorithm of the corner profile analysis, the edge line detection, and/or the edge width analysis.

Displaying Analysis Results

The controller may send the analysis results discussed above to the main system of the film deposition apparatus and further send the analysis results to the display such that the display displays the analysis results as well as the first, second, third and fourth pictures regardless of whether or not defects are detected. Further, when the defects are detected by the various analysis discussed above, the controller may further send information regarding causes or information indicative of the causes to the main system and display such that the display displays such causes for an operator to look into various devices in the system.

For example, when detecting errors and/or defects in the analysis of the first pictures, the controller may cause the display to show the ATM robot such that an operator can inspect and adjust the ATM robot. When detecting errors of defects in the analysis of substrate locations in the second pictures and/or fourth pictures, the controller may cause the display to show, for example, the clamping device in the load lock robot such that an operator inspect and adjust the clamping device.

When detecting errors or defects in the edge exclusion analysis or film location analysis, the controller may cause the display to show, for example, the transfer robot in the transfer chamber such that an operator inspects and adjusts the transfer robot. Further, when detecting errors or defects in the substrate location analysis using the third pictures, the controller may cause the display to show, for example, the transfer robot in the transfer chamber such that an operator inspects and adjusts the transfer robot.

When detecting errors or defects in the corner profile analysis and edge width analysis in the third and/or fourth pictures, the controller may cause the display to show, for example, the deposition chamber and/or elements or devices in the deposition chamber, for example, the glass fixture, dielectric breakdown of chamber wall, plasma generation apparatus, lift pin breakage, ground strap breakage, lower electrode sagging, etc.

In some embodiments, to identify components and devices in the deposit chamber, the controller may store a lookup table that shows relationship between the defects and the components (or devices) in the deposit chamber.

Other Embodiments

In some embodiments, analysis of the pictures may be taken by the cameras arranged at the corners of the load lock as described above. However, other cameras 420 and 520 shown in FIGS. 3 and 4 can take pictures of one or more of the corners of the glass substrate with or without a deposited film while the glass substrate is moving. The pictures of the corners taken by the cameras 420 and 520 can be processed to perform analysis methods discussed above, for example, edge exclusion analysis, corner profile analysis, edge width analysis, and/or crack analysis. Cameras located over the load lock at locations that are not corners or edges of the load lock may take pictures to analyze edge lines of the deposited film as described above.

Logical Blocks and Modules

Logical blocks, modules or units described in connection with embodiments disclosed herein can be implemented or performed by a computing device having at least one processor, at least one memory and at least one communication interface. The elements of a method, process, or algorithm described in connection with embodiments disclosed herein can be embodied directly in hardware, in a software module executed by at least one processor, or in a combination of the two. Computer-executable instructions for implementing a method, process, or algorithm described in connection with embodiments disclosed herein can be stored in a non-transitory computer readable storage medium.

The foregoing description details certain embodiments of the systems, devices, and methods disclosed herein. It will be appreciated, however, that no matter how detailed the foregoing appears in text, the systems, devices, and methods can be practiced in many ways. The use of particular terminology when describing certain features or aspects of the disclosure should not be taken to imply that the terminology is being redefined herein to be restricted to including any specific characteristics of the features or aspects of the technology with which that terminology is associated.

It will be appreciated by those skilled in the art that various modifications and changes can be made without departing from the scope of the described technology. Such modifications and changes are intended to fall within the scope of the embodiments. It will also be appreciated by those of skill in the art that parts included in one embodiment are interchangeable with other embodiments; one or more parts from a depicted embodiment can be included with other depicted embodiments in any combination. For example, any of the various components described herein and/or depicted in the figures can be combined, interchanged, or excluded from other embodiments.

With respect to the use of substantially any plural and/or singular terms herein, those having skill in the art can translate from the plural to the singular and/or from the singular to the plural as is appropriate to the context and/or application. The various singular/plural permutations can be expressly set forth herein for sake of clarity.

Directional terms used herein (for example, top, bottom, side, up, down, inward, outward, etc.) are generally used with reference to the orientation or perspective shown in the figures and are not intended to be limiting. For example, positioning "above" described herein can refer to positioning below or on one of sides. Thus, features described as being "above" may be included below, on one of sides, or the like.

It will be understood by those within the art that, in general, terms used herein are generally intended as "open" terms (for example, the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims can contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (for example, "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (for example, the bare recitation of "two recitations," without other modifiers, typically means at least two recitations, or two or more recitations).

The term "comprising" as used herein is synonymous with "including," "containing," or "characterized by," and is inclusive or open-ended and does not exclude additional, unrecited elements or method steps.

Conditional language, such as "can," "could," "might," or "may," unless specifically stated otherwise, or otherwise understood within the context as used, is generally intended to convey that certain embodiments include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

Language of degree used herein, such as the terms "approximately," "about," "generally," and "substantially" as used herein represent a value, amount, or characteristic close to the stated value, amount, or characteristic that still performs a desired function and/or achieves a desired result. For example, the terms "approximately", "about", "generally," and "substantially" may refer to an amount that is within less than 10% of, within less than 5% of, within less than 1% of, within less than 0.1% of, and/or within less than 0.01% of the stated amount.

It will be further understood by those within the art that any disjunctive word and/or phrase presenting two or more alternative terms, whether in the description, claims, or drawings, can be understood to contemplate the possibilities of including one of the terms, either of the terms, or both terms. For example, the phrase "A or B" will be understood to include the possibilities of "A" or "B" or "A and B." Further, the term "each," as used herein, in addition to having its ordinary meaning, can mean any subset of a set of elements to which the term "each" is applied.

Conjunctive language such as the phrase "at least one of X, Y, and Z," unless specifically stated otherwise, is otherwise understood with the context as used in general to convey that an item, term, etc. may be either X, Y, or Z. Thus, such conjunctive language is not generally intended to imply that certain embodiments require the presence of at least one of X, at least one of Y, and at least one of Z.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. The described functionality may be implemented in varying ways for each particular application, but such implementation decisions should not be interpreted as causing a departure from the scope of the embodiments of the present disclosure.

The various illustrative blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm and functions described in connection with the embodiments disclosed herein may be embodied directly in hardware, in a software module executed by a processor, or in a combination of the two. If implemented in software, the functions may be stored on or transmitted over as one or more instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art. A storage medium is coupled to the processor such that the processor can read information from, and write information to, the storage medium. In the alternative, the storage medium may be integral to the processor. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer readable media. The processor and the storage medium may reside in an ASIC. The ASIC may reside in a user terminal. In the alternative, the processor and the storage medium may reside as discrete components in a user terminal.

The above description discloses embodiments of systems, apparatuses, devices, methods, and materials of the present disclosure. This disclosure is susceptible to modifications in the components, parts, elements, steps, and materials, as well as alterations in the fabrication methods and equipment. Such modifications will become apparent to those skilled in the art from a consideration of this disclosure or practice of the disclosure. Consequently, it is not intended that the disclosure be limited to the specific embodiments disclosed herein, but that it cover all modifications and alternatives coming within the scope and spirit of the subject matter embodied in the following claims.

What is claimed is:

1. A method of depositing a film on a substrate, the method comprising:
providing a film deposition apparatus comprising:
a load lock chamber configured to receive and clamp a substrate, the load lock chamber comprising one or more viewport windows disposed to pass through a wall of the load lock chamber,
a deposition chamber configured to deposit a film over the substrate to output a film-deposited substrate,
a transfer robot configured to move the substrate and the film-deposited substrate between the load lock chamber and the deposition chamber, and
one or more cameras coupled to an exterior portion of the one or more viewport windows of the load lock chamber and configured to capture at least one image of the substrate and/or the film-deposited substrate, disposed inside the load lock chamber, through the one or more viewport windows;
loading the substrate, using a loading-unloading robot, from an outside of the load lock chamber to an inside of the load lock chamber to place the substrate in the load lock chamber;
moving the substrate, by the transfer robot, from the load lock chamber to the deposition chamber;
depositing a film over the substrate in the deposition chamber to output the film-deposited substrate;
moving the film-deposited substrate, by the transfer robot, from the deposition chamber to the load lock chamber to place the film-deposited substrate in the load lock chamber;
after the film-deposited substrate is placed in the load lock chamber, capturing, by the one or more cameras, at least one image of one or more portions of the film-deposited substrate such that the film is included in the at least one image;
unloading, by the loading-unloading robot, the film-deposited substrate from the load lock chamber;
analyzing, by at least one controller, the at least one image to determine whether a film deposited over the film-deposited substrate has a defect; and
displaying the at least one image and analysis results on a display,
wherein analyzing the at least one image comprises:
obtaining contrast values of pixels in the at least one image; and
processing the contrast values to determine whether the film has a defect or an error,
wherein analyzing the at least one image further comprises determining at least one of components in the deposition chamber related to the defect of the film, and
wherein the analysis results being displayed on the display comprise information on the at least one component related to the defect.

2. The method of claim 1, wherein the one or portions of the film-deposited substrate comprise one or more of corners, sides, or portions other than the corners or sides.

3. The method of claim 1, wherein analyzing the at least one image further comprises:
processing the contrast values to detect at least one of a substrate edge line of the substrate or a film edge line of the film-deposited substrate; and
determining a distance between the substrate edge line and the film edge line is greater than a predetermined value to determine whether the film has a defect.

4. The method of claim 1, wherein analyzing the at least one image further comprises:
defining a target area in the pixels of the at least one image;
processing the contrast values of the pixels in the target area to count the number of pixels having the contrast values; and determining the counted number of the pixels is greater than a predetermined value to determine whether the film has a defect.

5. The method of claim 1, wherein analyzing the at least one image further comprises:
defining a target area in the pixels of the at least one image;
processing the contrast values of the pixels in the target area to divide the pixels into a first group of pixels having the contrast values greater than a predetermined value and a second group of pixels having the contrast values smaller than the predetermined value; and
determining whether a ratio of the first group of pixels to the second group of pixels is smaller than a threshold to determine whether the film has a defect.

6. The method of claim 1, wherein analyzing the at least one image further comprises:
defining a target area in the pixels of the at least one image;
processing the contrast values of the pixels in the target area to define a width of an edge of the film; and
determining whether the width of the edge of the film is greater than a threshold to determine whether the film has a defect.

7. The method of claim 1, wherein analyzing the at least one image further comprises:
processing the contrast values to detect a substrate edge line of the substrate;
determining a shift of the substrate edge line from a predetermined location is greater than a predetermined value; and
determining that the substrate is erroneously placed.

8. The method of claim 1, wherein at least one of the one or more cameras is located at an edge of the load lock chamber, and wherein the at least one image is captured by the one or more cameras after the film-deposited substrate is placed in the load lock chamber and before the film-deposited substrate moves from the load lock chamber to the outside of the load lock chamber.

9. The method of claim 1, further comprising:
before transferring the substrate to the deposit chamber, capturing at least one additional image of the substrate,
analyzing the at least one additional image of the substrate; and
displaying the at least one additional image and analysis results on the display,
wherein analyzing the at least one image comprises:
obtaining contrast values of pixels in the at least one additional image;
processing the contrast values to detect a substrate edge line of the substrate; and
determining a shift of the substrate edge line from a predetermined location is greater than a predetermined value to determine whether the substrate is erroneously placed in the load lock chamber.

10. The method of claim 1, wherein the one or more cameras are located at one or more corners of the load lock chamber.

11. A method of depositing a film on a substrate, the method comprising:
providing a film deposition apparatus comprising:
a load lock chamber configured to receive and clamp a substrate, a deposition chamber configured to deposit a film over the substrate to output a film-deposited substrate, a transfer robot configured to move the substrate and the film-deposited substrate between the load lock chamber and the deposition chamber, and
one or more cameras attached to an exterior of the load lock chamber and configured to capture at least one image of the substrate and/or the film-deposited substrate disposed inside the load lock chamber;
loading the substrate, using a loading-unloading robot, from an outside of the load lock chamber to an inside of the load lock chamber to place the substrate in the load lock chamber;
moving the substrate, by the transfer robot, from the load lock chamber to the deposition chamber;
depositing a film over the substrate in the deposition chamber to output the film-deposited substrate;
moving the film-deposited substrate, by the transfer robot, from the deposition chamber to the load lock chamber to place the film-deposited substrate in the load lock chamber;
capturing, by the one or more cameras, at least one image of one or more portions of the film-deposited substrate such that the film is included in the at least one image;
unloading, by the loading-unloading robot, the film-deposited substrate from the load lock chamber;
analyzing, by at least one controller, the at least one image to determine whether a film over the film-deposited substrate has a defect, wherein analyzing the at least one image comprises:
obtaining contrast values of pixels in the at least one image, and
processing the contrast values to determine whether the film has a defect or an error;
wherein analyzing the at least one image further comprises:
processing the contrast values to detect at least one of a substrate edge line of the substrate or a film edge line of the film-deposited substrate; and
determining a distance between the substrate edge line and the film edge line is greater than a predetermined value to determine whether the film has a defect.

12. The method of claim 11, wherein the one or portions of the film-deposited substrate comprise one or more of corners, sides, or portions other than the corners or sides.

13. The method of claim 11, wherein the load lock chamber comprises one or more viewport windows disposed to pass through a wall of the load lock chamber, and wherein the one or more cameras are disposed on an exterior portion of the one or more viewport windows of the load lock chamber to capture the at least one image of the substrate and/or the film-deposited substrate, disposed inside the load lock chamber, through the one or more viewport windows.

14. The method of claim 11, wherein the one or more cameras are located at locations other than corners of the load lock chamber.

15. The method of claim 11, wherein the at least one image is captured while the film-deposited substrate is moving through the load lock chamber.

16. A method of depositing a film on a substrate, the method comprising:
providing a film deposition apparatus comprising:
a load lock chamber configured to receive and clamp a substrate,
a deposition chamber configured to deposit a film over the substrate to output a film-deposited substrate,
a transfer robot configured to move the substrate and the film-deposited substrate between the load lock chamber and the deposition chamber, and
one or more cameras attached to an exterior of the load lock chamber and configured to capture at least one image of the substrate and the film-deposited substrate disposed inside the load lock chamber;

loading the substrate, using a loading-unloading robot, from an outside of the load lock chamber to an inside of the load lock chamber to place the substrate in the load lock chamber;

capturing, by the one or more cameras, at least one first image of one or more portions of the substrate;

analyzing the at least one first image;

clamping the substrate in the load lock chamber;

capturing, by the one or more cameras, at least one second image of the one or more portions of the substrate;

analyzing the at least one second image;

moving the substrate, by the transfer robot, from the load lock chamber to the deposition chamber;

depositing a film over the substrate in the deposition chamber to output the film-deposited substrate;

moving the film-deposited substrate, by the transfer robot, from the deposition chamber to the load lock chamber to place the film-deposited substrate in the load lock chamber;

capturing, by the one or more cameras, at least one third image of the one or more portions of the film-deposited substrate placed in the load lock chamber such that the film is included in the at least one third image;

analyzing the at least one third image;

unloading, by the loading-unloading robot, the film-deposited substrate from the load lock chamber;

analyzing, by at least one controller, the at least one third image to determine whether a film over the film-deposited substrate has a defect; and displaying the at least one third image and analysis results on a display, wherein analyzing the at least one third image comprises:
obtaining contrast values of pixels in the at least one third image; and
processing the contrast values to determine whether the film has a defect or an error, wherein analyzing the at least one third image further comprises determining at least one of components in the deposition chamber related to the defect of the film, and wherein the analysis results being displayed on the display comprise information on the at least one component related to the defect.

17. The method of claim 16, wherein analyzing the at least one third image further comprises:
processing the contrast values to detect at least one of a substrate edge line of the substrate and a film edge line of the film-deposited substrate; and
determining a distance between the substrate edge line and the film edge line is greater than a predetermined value to determine whether the film has a defect.

18. The method of claim 16, wherein analyzing the at least one third image further comprises:
defining a target area in the pixels of the at least one image;
processing the contrast values of the pixels in the target area to count pixels having the contrast values; and
determining the counted number of the pixel-pixels is greater than a predetermined value to determine whether the film has a defect.

19. The method of claim 16, wherein analyzing the at least one third image further comprises:
defining a target area in the pixels of the at least one image;
processing the contrast values of the pixels in the target area to divide the pixels into a first group of pixels having the contrast values greater than a predetermined value and a second group of pixels having the contrast values smaller than the predetermined value; and
determining whether a ratio of the first group of pixels to the second group of pixels is smaller than a threshold to determine whether the film has a defect.

20. The method of claim 16, wherein analyzing the at least one third image further comprises:
defining a target area in the pixels of the at least one image;
processing the contrast values of the pixels in the target area to define a width of an edge of the film; and
determining whether the width of the edge of the film is greater than a threshold to determine whether the film has a defect.

21. The method of claim 16, further comprising clamping the film-deposited substrate, wherein the at least one third image is captured after the film-deposited substrate is unloaded from the deposition chamber and before the film-deposited substrate is clamped in the load lock chamber.

* * * * *